(12) United States Patent
Hatakeyama et al.

(10) Patent No.: US 9,201,304 B2
(45) Date of Patent: *Dec. 1, 2015

(54) PATTERN FORMING PROCESS

(71) Applicant: SHIN-ETSU CHEMICAL CO., LTD., Tokyo (JP)

(72) Inventors: Jun Hatakeyama, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 23 days.

This patent is subject to a terminal disclaimer.

(21) Appl. No.: 14/161,761

(22) Filed: Jan. 23, 2014

(65) Prior Publication Data

US 2014/0234781 A1 Aug. 21, 2014

(30) Foreign Application Priority Data

Feb. 18, 2013 (JP) ................................. 2013-028627

(51) Int. Cl.
 *G03F 7/40* (2006.01)
 *G03F 7/039* (2006.01)
 *G03F 7/32* (2006.01)
 *G03F 7/075* (2006.01)

(52) U.S. Cl.
 CPC ............ *G03F 7/0392* (2013.01); *G03F 7/0397* (2013.01); *G03F 7/0752* (2013.01); *G03F 7/325* (2013.01); *G03F 7/40* (2013.01); *G03F 7/405* (2013.01)

(58) Field of Classification Search
 CPC .................................. G03F 7/40; G03F 7/0035
 See application file for complete search history.

(56) References Cited

U.S. PATENT DOCUMENTS

| | | | |
|---|---|---|---|
| 6,136,500 A | 10/2000 | Kobayashi et al. | |
| 6,448,420 B1 | 9/2002 | Kinsho et al. | |
| 6,994,945 B2 | 2/2006 | Takeda et al. | |
| 6,994,946 B2 | 2/2006 | Hatakeyama et al. | |
| 7,514,202 B2 | 4/2009 | Ohsawa et al. | |
| 7,537,880 B2 | 5/2009 | Harada et al. | |
| 7,598,016 B2 | 10/2009 | Kobayashi et al. | |
| 7,771,913 B2 | 8/2010 | Kaneko et al. | |
| 7,855,043 B2 | 12/2010 | Ogihara et al. | |
| 7,871,761 B2 | 1/2011 | Hatakeyama et al. | |
| 8,530,148 B2 | 9/2013 | Tsubaki et al. | |
| 2004/0265745 A1 | 12/2004 | Sho et al. | |
| 2007/0122741 A1 | 5/2007 | Hatakeyama et al. | |
| 2007/0134916 A1 | 6/2007 | Iwabuchi et al. | |
| 2008/0090172 A1 | 4/2008 | Hatakeyama et al. | |
| 2008/0153030 A1 | 6/2008 | Kobayashi et al. | |
| 2010/0178620 A1 | 7/2010 | Dei et al. | |
| 2010/0203457 A1 | 8/2010 | Hatakeyama | |
| 2012/0315449 A1 | 12/2012 | Tsubaki et al. | |

FOREIGN PATENT DOCUMENTS

| | | |
|---|---|---|
| JP | 07135140 A | 5/1995 |
| JP | 11-258813 A | 9/1999 |
| JP | 2002-348332 A | 12/2002 |
| JP | 2004-352743 A | 12/2004 |
| JP | 2005-043420 A | 2/2005 |
| JP | 2005-221714 A | 8/2005 |
| JP | 2006-508377 A | 3/2006 |
| JP | 3790649 B2 | 6/2006 |
| JP | 2007-065161 A | 3/2007 |
| JP | 2007-163846 A | 6/2007 |
| JP | 2007-199653 A | 8/2007 |
| JP | 3991462 B2 | 10/2007 |
| JP | 2007-297590 A | 11/2007 |
| JP | 2007-304490 A | 11/2007 |
| JP | 2007-316581 A | 12/2007 |
| JP | 2008-19423 A | 1/2008 |
| JP | 2008-39811 A | 2/2008 |
| JP | 2008-39815 A | 2/2008 |
| JP | 2008-111103 A | 5/2008 |
| JP | 2008-122932 A | 5/2008 |
| JP | 2008-158339 A | 7/2008 |
| JP | 2008-239918 A | 10/2008 |
| JP | 2008-281980 A | 11/2008 |
| JP | 2008-287176 A | 11/2008 |
| JP | 2010-151923 A | 7/2010 |
| JP | 2010-152299 A | 7/2010 |
| JP | 2010-186060 A | 8/2010 |
| JP | 4554665 B2 | 9/2010 |
| JP | 2012-132949 A | 7/2012 |
| WO | 20041001806 A2 | 12/2003 |

OTHER PUBLICATIONS

US Notice of Allowance dated Feb. 13, 2015, issued in corresponding U.S. Appl. No. 14/170,094 (8 pages).
US Office Action dated Nov. 3, 2014, issued in corresponding U.S. Appl. No. 14/170,094 (15 pages).

*Primary Examiner* — Kathleen Duda
(74) *Attorney, Agent, or Firm* — Westerman, Hattori, Daniels & Adrian, LLP

(57) ABSTRACT

A pattern is formed by coating a resist composition comprising a resin comprising recurring units having an acid labile group, a photoacid generator, and a first organic solvent onto a processable substrate, prebaking, exposing, PEB, and developing in an organic solvent developer to form a negative pattern; heating the negative pattern to render it resistant to a second organic solvent; coating a solution containing Si, Ti, Zr, Hf, and/or Al and the second organic solvent thereon, prebaking, and dry etching to effect image reversal for converting the negative pattern into a positive pattern.

9 Claims, 3 Drawing Sheets

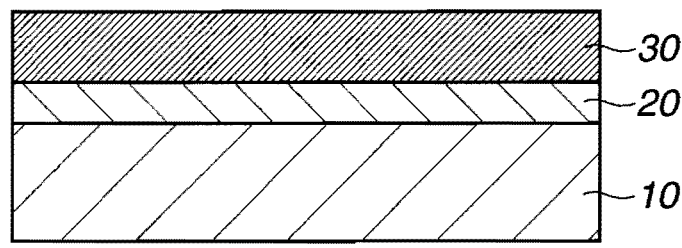
FIG.1A  COATING OF RESIST COMPOSITION
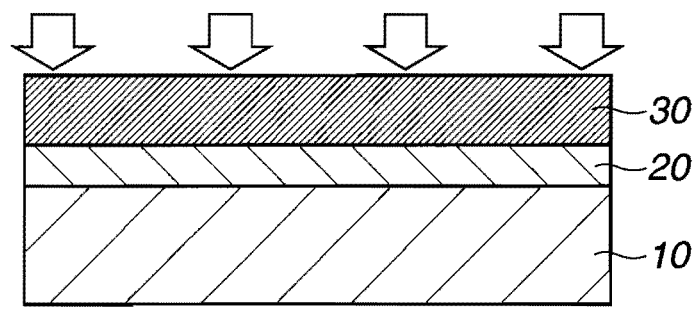
FIG.1B  EXPOSURE OF RESIST FILM
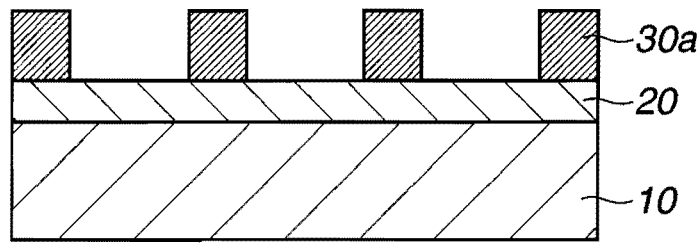
FIG.1C  PEB AND ORGANIC SOLVENT DEVELOPMENT OF RESIST FILM TO FORM NEGATIVE PATTERN
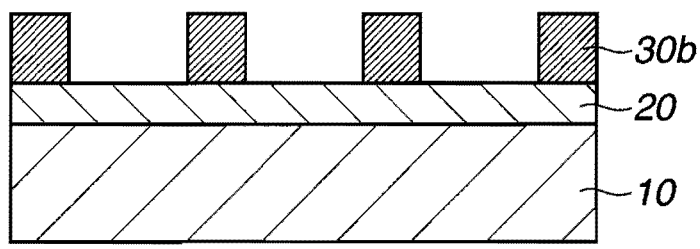
FIG.1D  BAKING OF RESIST PATTERN FOR CROSSLINKING

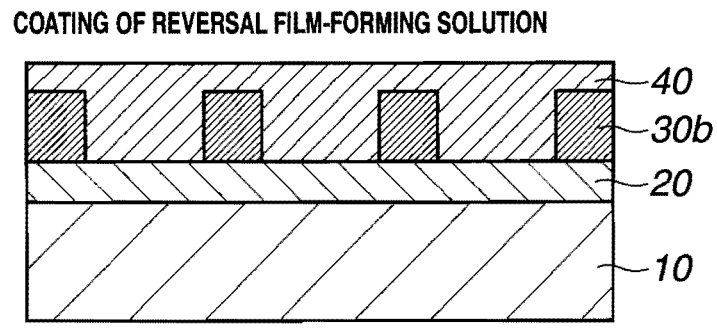
FIG.2E COATING OF REVERSAL FILM-FORMING SOLUTION
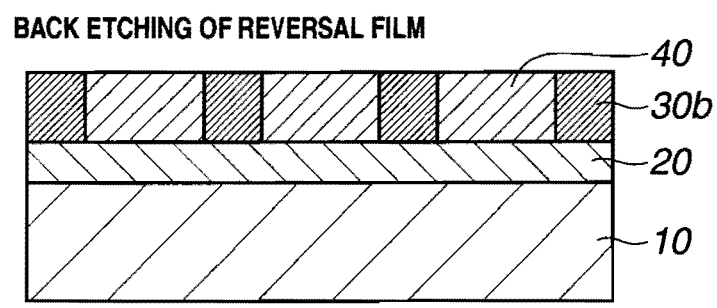
FIG.2F BACK ETCHING OF REVERSAL FILM
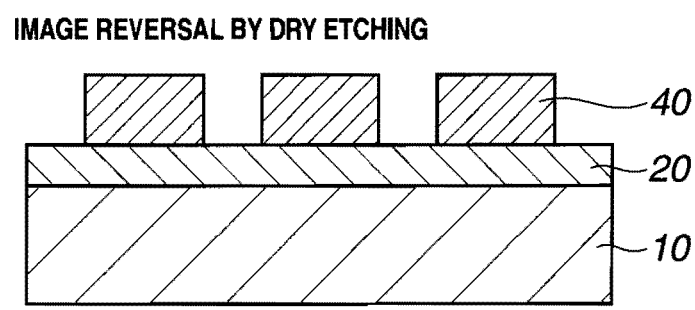
FIG.2G IMAGE REVERSAL BY DRY ETCHING
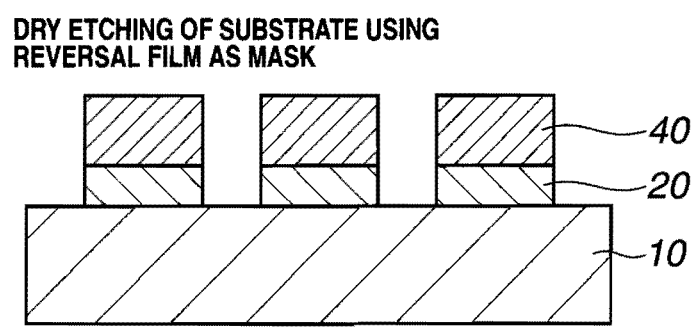
FIG.2H DRY ETCHING OF SUBSTRATE USING REVERSAL FILM AS MASK

PATTERN FORMING PROCESS

CROSS-REFERENCE TO RELATED APPLICATION

This non-provisional application claims priority under 35 U.S.C. §119(a) on Patent Application No. 2013-028627 filed in Japan on Feb. 18, 2013, the entire contents of which are hereby incorporated by reference.

TECHNICAL FIELD

This invention relates to a pattern forming process involving the steps of forming a negative pattern through exposure and organic solvent development of a resist composition, heating the negative pattern to render it insoluble in an organic solvent, coating a solution comprising silicon, titanium, zirconium, hafnium or aluminum and the organic solvent thereon, and dry etching for image reversal.

BACKGROUND ART

Currently, strong interest is directed to a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

When dot patterns or thin line patterns having a high aspect ratio are formed using a positive resist film, conventional alkaline development has a likelihood of pattern collapse. A study is then made on the process of forming a resist film as a thin film, forming a hard mask below the resist film, and processing the thin film resist pattern. Typical of the hard mask process is a trilayer process based on a combination of carbon film and SOG film. As the feature size is reduced, even the resist film in thin film form suffers from a more likelihood of pattern collapse.

Formation of a dot pattern by reversal of a hole pattern is under consideration. The dot pattern is produced by forming a hole pattern via development of a resist film, transferring the hole pattern to an underlying film via dry etching, coating SOG thereon, and dry etching so that the portions of SOG buried in holes define a dot pattern. This process requires two dry etching steps, once for transfer of the resist pattern to the underlying film and twice for image reversal of the SOG film buried in holes. If the SOG can be directly buried in the resist pattern, image reversal is achievable by single dry etching. Then the process becomes simple and advantageous in cost.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. Such pattern forming process is described in Patent Document 1.

Patent Document 2 proposes an image reversal technology involving forming a positive resist pattern of positive resist material via alkaline development, heating the positive resist pattern for insolubilizing it in organic solvent while maintaining alkaline development capability, coating a film of low alkaline solubility, and effecting development to dissolve only the surface layer of the low alkaline solubility film while leaving the majority of film, and to dissolve the positive resist pattern in alkaline developer. The means of insolubilizing the film in organic solvent relies on a base polymer derived from a methacrylate monomer having 7-oxanorbornane.

CITATION LIST

Patent Document 1: JP 4554665 (U.S. Pat. No. 8,530,148)
Patent Document 2: JP-A 2010-152299

DISCLOSURE OF INVENTION

When fine dot or line patterns are formed by alkaline development of a positive resist material, there is a likelihood of pattern collapse. The problem of pattern collapse is solved if a hole or trench pattern free of a risk of pattern collapse can be formed by development of a resist film and then converted into a dot pattern by dry etching for image reversal. While a dot pattern can be produced by transferring a positive resist pattern to an underlying film via dry etching, coating SOG thereon to fill the holes with the SOG, and dry etching so as to form a dot pattern, this image reversal process is complex because two dry etching steps are necessary. There is a need for a pattern forming process capable of converting a fine hole pattern resulting from development of a resist film into a dot pattern via single dry etching, and materials used therein.

An object of the invention is to provide a pattern forming process capable of converting a fine hole pattern resulting from development of a resist film into a dot pattern via single dry etching, whereby a positive pattern, typically dot pattern having a high aspect ratio can be formed.

The inventors have discovered a pattern forming process involving the steps of forming a negative pattern of a chemically amplified resist composition via organic solvent development, heating (or baking) the negative pattern for causing partial crosslinking of the resin in the resist composition, for thereby rendering the negative pattern insoluble in an organic solvent while minimizing the deformation of the negative pattern by heat treatment, coating a solution containing silicon, titanium, zirconium, hafnium or aluminum and the organic solvent thereon, and dry etching for effecting image reversal.

In one aspect, the invention provides a pattern forming process comprising the steps of:

coating a chemically amplified resist composition onto a processable substrate, said resist composition comprising a resin comprising recurring units having an acid labile group which is eliminatable with acid so that it may turn insoluble in organic solvent as a result of the acid labile group being eliminated, a photoacid generator capable of generating an acid upon exposure to high-energy radiation, and a first organic solvent, prebaking the coating to remove the unnecessary solvent and to form a resist film, exposing patternwise the resist film to high-energy radiation, post-exposure baking, and developing in an organic solvent developer to form a negative pattern, heating the negative pattern to render it resistant to a second organic solvent, coating a solution comprising at least one element selected from the group consisting of silicon, titanium, zirconium, hafnium, and aluminum and the second organic solvent onto the negative pattern-bearing substrate, prebaking, and dry etching to effect image reversal for converting the negative pattern into a positive pattern.

In a preferred embodiment, the second organic solvent is selected from the group consisting of propylene glycol monomethyl ether acetate, cyclohexanone, cyclopentanone, ethyl lactate, propylene glycol monomethyl ether, propylene glycol monoethyl ether, propylene glycol monopropyl ether, heptanone, γ-butyrolactone and mixtures thereof. The negative pattern after heating experiences a film thickness loss of up to 10 nm when it is kept in contact with the second organic solvent for 30 seconds.

In a preferred embodiment, the resin in the resist composition comprises recurring units having 7-oxanorbornane ring and recurring units having an acid labile group which is eliminatable with acid. The heating step after development causes crosslinking of the resin in the negative pattern.

In a preferred embodiment, the recurring units having 7-oxanorbornane ring are recurring units (a) having the general formula (1).

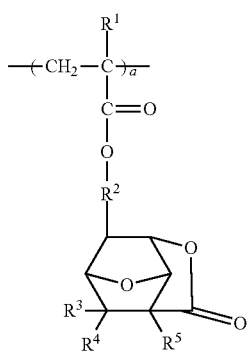

(1)

Herein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, $R^3$, $R^4$, and $R^5$ are each independently hydrogen, a straight, branched or cyclic $C_1$-$C_6$ alkyl group or cyano group, and a is a number in the range: $0<a<1.0$.

In a preferred embodiment, the recurring units having an acid labile group are recurring units (b) having a carboxyl group substituted with an acid labile group and/or recurring units (c) having a hydroxyl group substituted with an acid labile group, represented by the general formula (2).

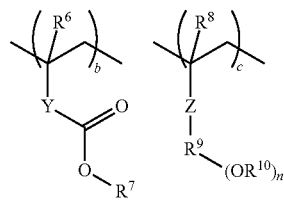

(2)

Herein $R^6$ and $R^8$ each are hydrogen or methyl, $R^7$ and $R^{10}$ each are an acid labile group, Y is a single bond or —C(=O)—O—$R^{11}$—, $R^{11}$ is a straight, branched or cyclic $C_1$-$C_{10}$ alkylene group which may have an ether or ester moiety, or a naphthylene group, Z is a single bond or —C(=O)—O—, $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group, n is 1 or 2, b and c are numbers in the range: $0 \le b < 1.0$, $0 \le c < 1.0$, and $0 < b+c < 1.0$.

In a preferred embodiment, the organic solvent developer used in the developing step to form the negative pattern is selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

In a preferred embodiment, the negative pattern is a hole pattern, and a dot pattern is formed by reversal of the hole pattern. In another preferred embodiment, the negative pattern is a trench pattern, and a line pattern is formed by reversal of the trench pattern.

Advantageous Effects of Invention

Through the steps of forming a negative pattern via organic solvent development, post-development heating (or baking) the negative pattern for thereby rendering the negative pattern insoluble in a second organic solvent, coating a solution containing silicon, titanium, zirconium, hafnium or aluminum and the second organic solvent thereon, and dry etching the structure for effecting image reversal, the pattern forming process of the invention is successful in forming a positive pattern. A positive pattern such as a dot pattern having a high aspect ratio can be formed without the risk of pattern collapse.

BRIEF DESCRIPTION OF DRAWINGS

FIG. 1 schematically illustrates former steps of the pattern forming process of the invention; FIG. 1A showing a resist film deposited on a processable substrate on a substrate; FIG. 1B showing exposure of the resist film; FIG. 1C showing the resist film during organic solvent development; FIG. 1D showing the resist pattern being crosslinked via deprotection with the aid of acid and heat.

FIG. 2 schematically illustrates latter steps of the pattern forming process of the invention; FIG. 2E showing coating of a reversal film; FIG. 2F showing etching back until the resist pattern is exposed on the surface; FIG. 2G showing image reversal by dry etching; FIG. 2H showing the processable substrate being dry etched with the reversal film serving as mask.

DESCRIPTION OF PREFERRED EMBODIMENTS

Figure 3:
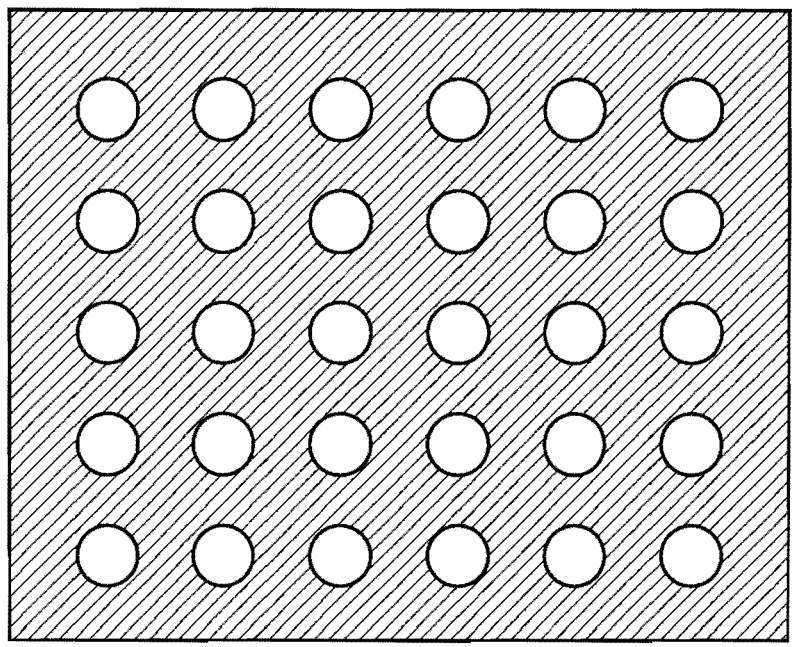
FIG. 3 is a plan view showing one exemplary hole pattern formed via negative development.

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

PAG: photoacid generator
Mw: weight average molecular weight
Mn: number average molecular weight
Mw/Mn: molecular weight distribution or dispersity
GPC: gel permeation chromatography
PEB: post-exposure baking The invention is directed to a pattern forming process comprising the steps of coating a chemically amplified resist composition comprising a resin comprising recurring units having an acid labile group so that it may turn insoluble in organic solvent as a result of the acid labile group being eliminated, a photoacid generator, and a first organic solvent onto a processable substrate, prebaking the coating to remove the unnecessary solvent and to form a resist film, exposing patternwise the resist film to high-energy radiation, PEB, and developing in an organic solvent developer to form a negative pattern; heating (or baking) the negative pattern to render it resistant to a second organic solvent; coating a reversal film-forming solution containing at least one element selected from silicon, titanium, zirconium, hafnium and aluminum, and the second organic solvent onto the negative pattern-bearing substrate, prebaking, and dry etching to effect image reversal for converting the negative pattern into a positive pattern.

In order that the resist film be turned insoluble in the second organic solvent by post-development baking, crosslinking reaction must take place in the resist film during the bake. The crosslink formation relies on electrophilic partial structures such as ester groups, cyclic ether and the like in the resin of the resist composition. With the aid of acid and heat, crosslinking reaction takes place via ester exchange, ring opening, esterification and etherification of lactone ring, ring opening, etherification and esterification of cyclic ether, or the like.

The polymer advantageously used as the base resin in the resist composition is a polymer comprising recurring units having a lactone ring, especially recurring units having 7-oxanorbornane ring, and specifically recurring units (a) of the general formula (1). Since this polymer has both an ester group and cyclic ether in a common recurring unit, it is highly reactive for crosslinking reaction. Since this unit is used as an adhesive unit, the inventive process is effectively applicable without adding any extra construction to the base resin.

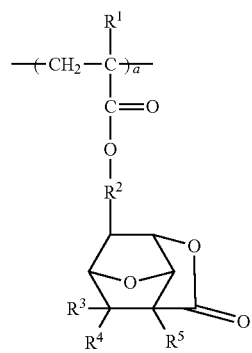

Herein $R^1$ is hydrogen or methyl. $R^2$ is a single bond, or a straight, branched or cyclic $C_1$-$C_6$ alkylene group which may contain an ether or ester moiety and which has a primary or secondary carbon atom through which it is linked to the ester moiety in the formula. $R^3$, $R^4$, and $R^5$ are each independently hydrogen or a straight, branched or cyclic $C_1$-$C_6$ alkyl group, and a is a number in the range: $0<a<1.0$.

Examples of the $C_1$-$C_6$ alkylene group include methylene, ethylene, n-propylene, isopropylene, n-butylene, isobutylene, sec-butylene, n-pentylene, isopentylene, cyclopentylene, n-hexylene, and cyclohexylene. Examples of the $C_1$-$C_6$ alkyl group include methyl, ethyl, n-propyl, isopropyl, n-butyl, isobutyl, sec-butyl, n-pentyl, isopentyl, cyclopentyl, n-hexyl, and cyclohexyl.

The monomer Ma from which recurring units (a) of formula (1) are derived has the following formula.

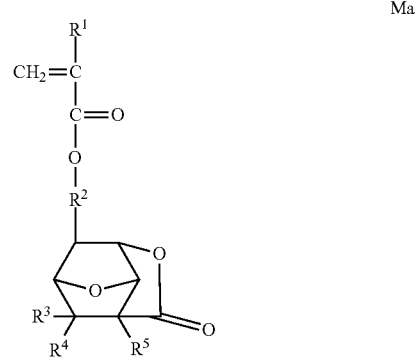

Herein $R^1$ to $R^5$ are as defined above.

Examples of the monomer Ma are shown below.

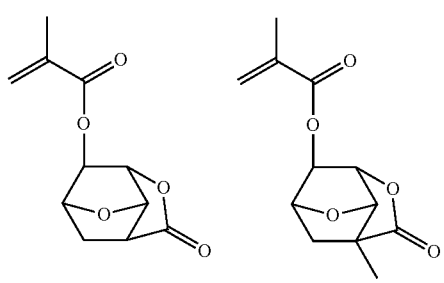

-continued

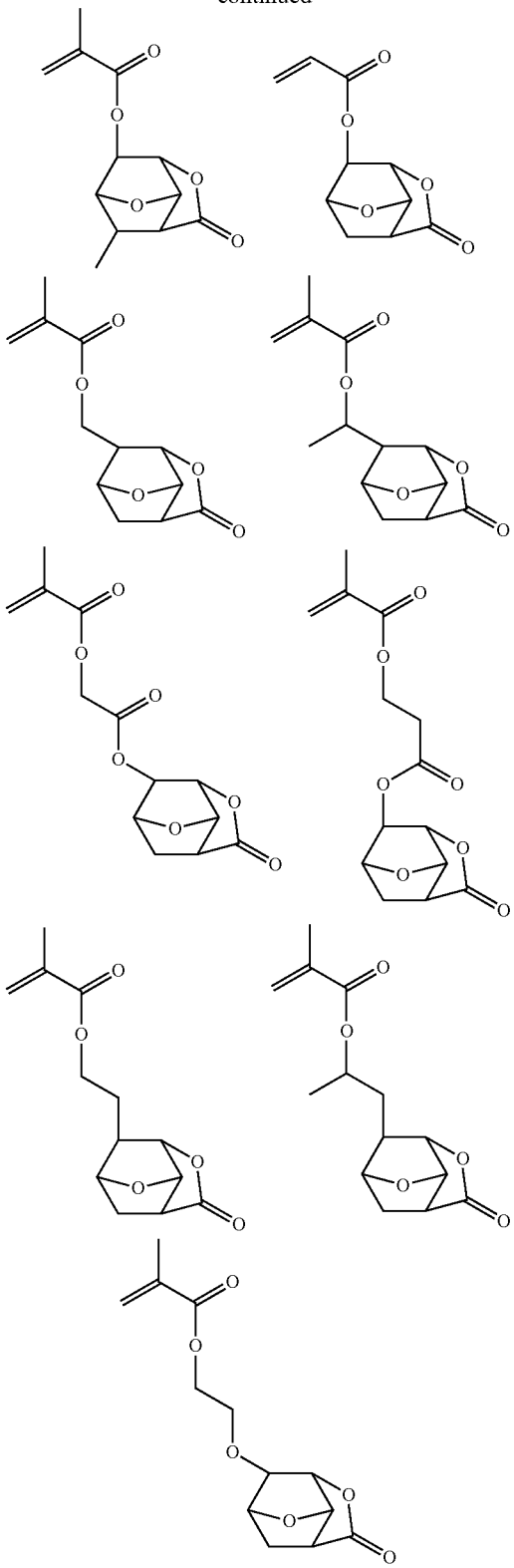

The process proceeds through the steps of forming a negative pattern by exposure and organic solvent development, deprotection of the acid labile group and crosslinking reaction with the aid of acid and heat, and coating a reversal film-forming solution in a second organic solvent thereon.

The negative pattern is formed of a film which is turned insoluble in organic solvent developer as a result of deprotection of the acid labile group on the acid labile group-containing recurring unit, and which is turned insoluble in the second organic solvent as a result of crosslinking of 7-oxanorbornane ring during post-development bake.

If a polymer comprising recurring units having oxirane or oxetane is used as the base resin in the resist composition, crosslinking with carboxyl groups can take place at the temperature of the resist process, for example, the PEB temperature of about 90 to 130° C., because the oxirane or oxetane ring has a very high rate of acid-catalyzed cleavage reaction. Although carboxyl groups are generated as a result of deprotection, they are substituted again, failing to form a negative pattern by organic solvent development. On the other hand, the 1,4-epoxy bond of 7-oxanorbornane ring has a low rate of acid-catalyzed cleavage reaction as compared with the oxirane or oxetane ring. Thus, no crosslinking takes place in the heating temperature range of PEB. The recurring unit having 7-oxanorbornane ring is stable against acid in the process until development, and behaves as a hydrophilic group to exert the function of improving adhesion and alkaline solubility. However, post-development bake causes cleavage (i.e., ring-opening) to the 1,4-epoxy bond of 7-oxanorbornane ring, allowing crosslinking reaction to take place.

The base resin used in the resist composition in the pattern forming process of the invention is preferably a polymer comprising crosslinkable recurring units (a) of formula (1) and acid labile group-containing recurring units (b) and/or (c) of the general formula (2).

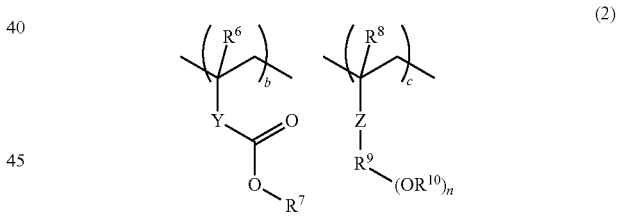

(2)

Herein $R^6$ and $R^9$ each are hydrogen or methyl. $R^7$ and $R^{10}$ each are an acid labile group. Y is a single bond or —C(=O)—O—$R^{11}$—, wherein $R^{11}$ is a straight, branched or cyclic $C_1$-$C_{10}$ alkylene group which may have an ether or ester moiety, or a naphthylene group. Z is a single bond or —C(=O)—O—. $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group. The subscript n is 1 or 2, b and c are numbers in the range: $0 \leq b < 1.0$, $0 \leq c < 1.0$, and $0 < b+c < 1.0$.

The monomers Mb and Mc from which recurring units (b) and (c) of formula (2) are derived have the following formulae.

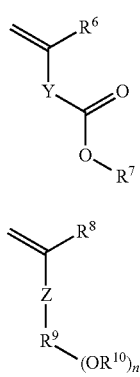
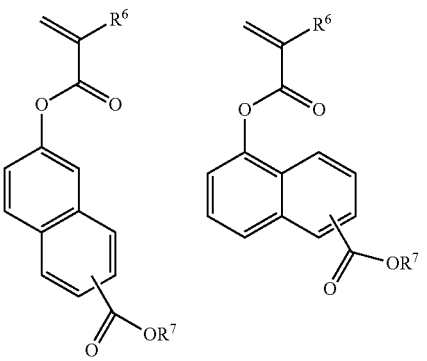
Herein $R^6$ to $R^{10}$, Y, Z and n are as defined above.
Examples of the monomer Mb wherein Y is a variant are shown below. Herein $R^6$ and $R^7$ are as defined above.
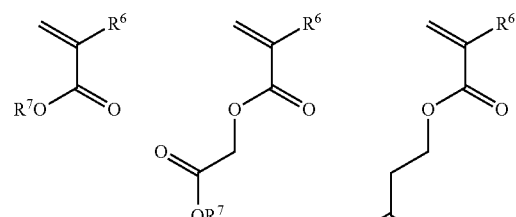
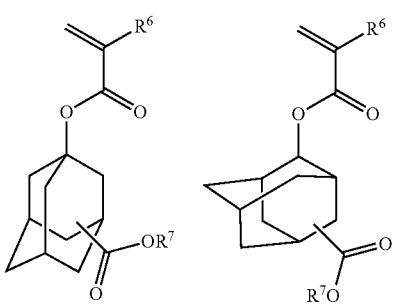
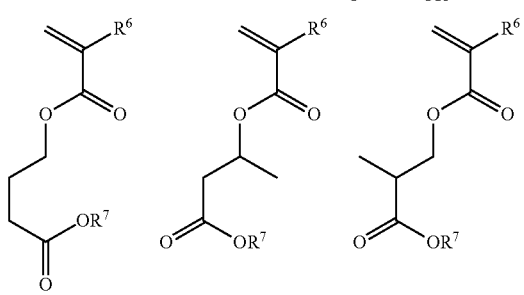
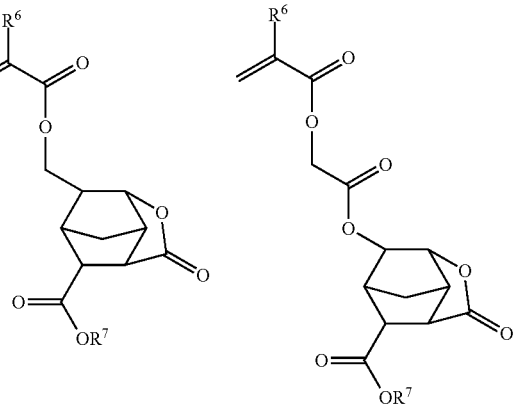
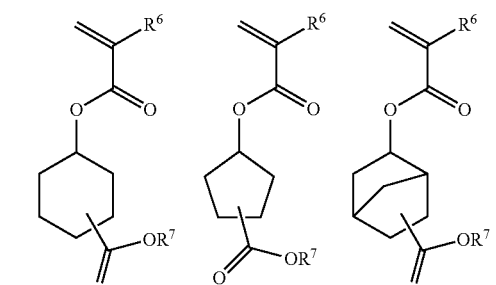
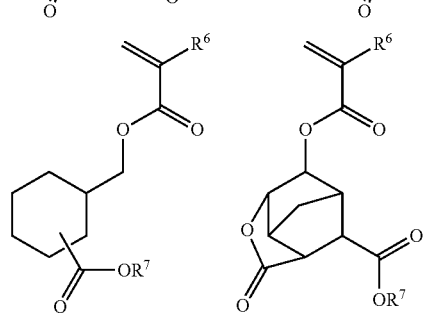
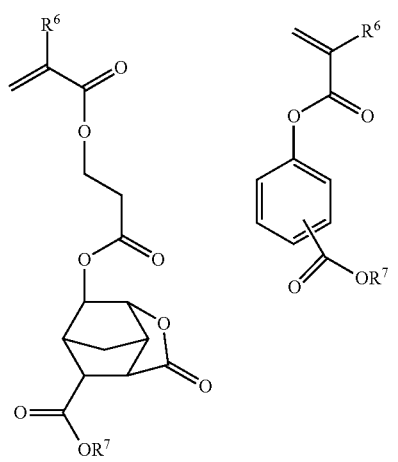

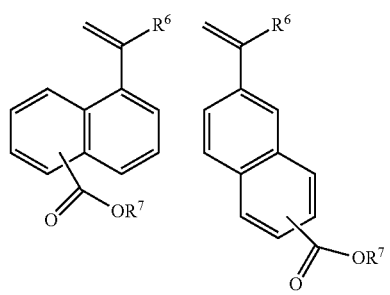
Examples of the monomer Mc are shown below. Herein $R^8$ and $R^{10}$ are as defined above.
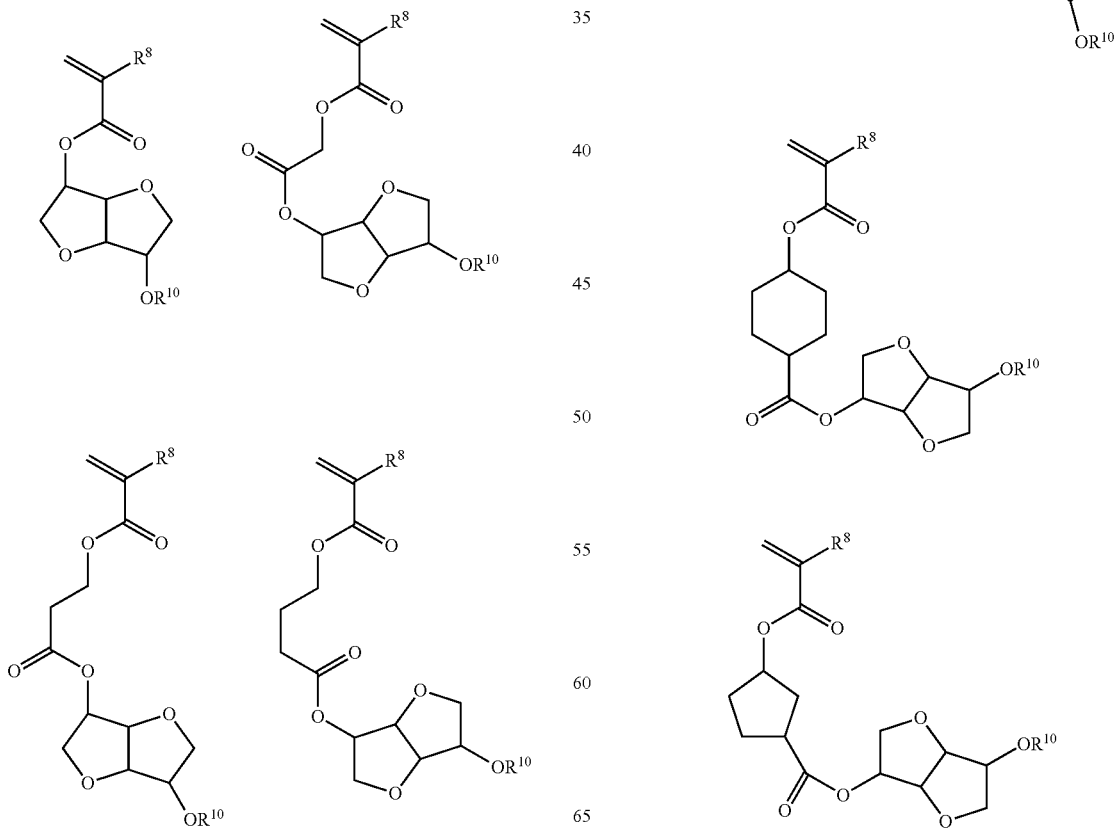
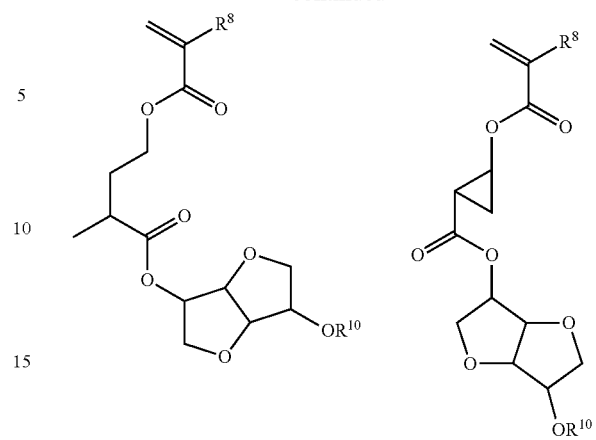

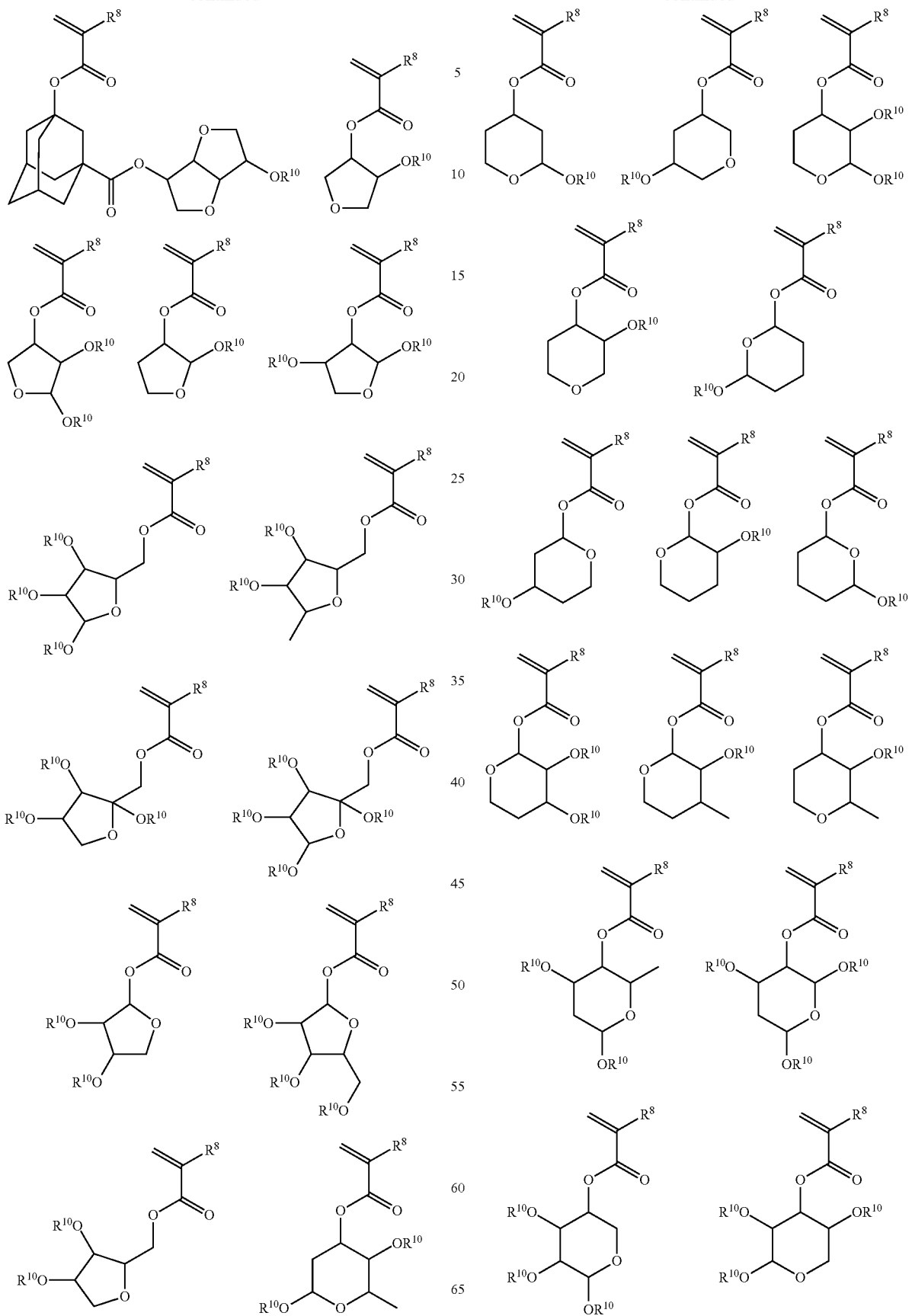

-continued
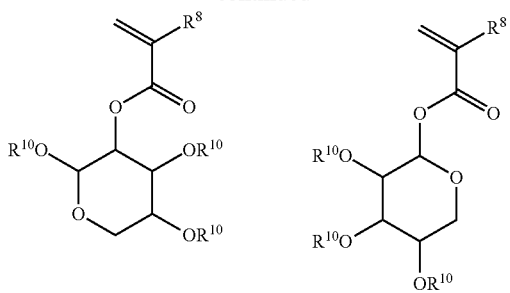
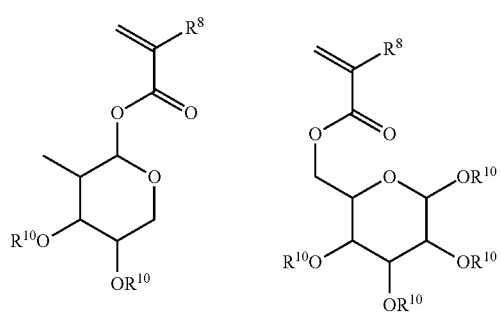
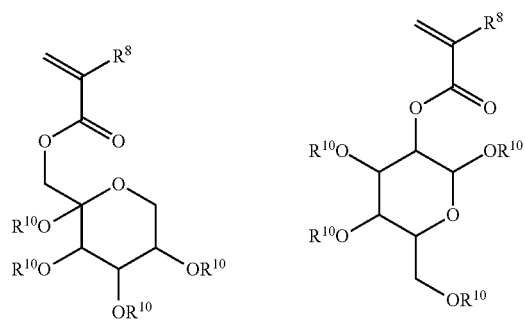
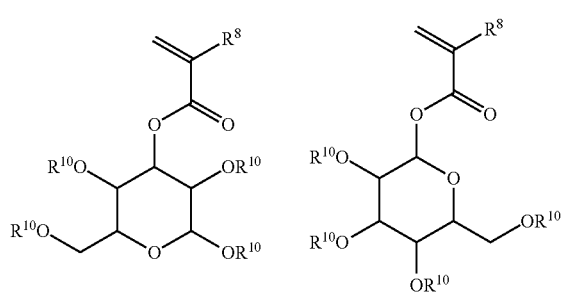
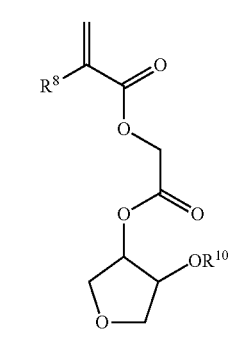
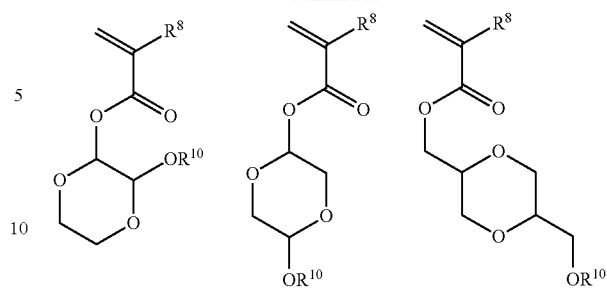
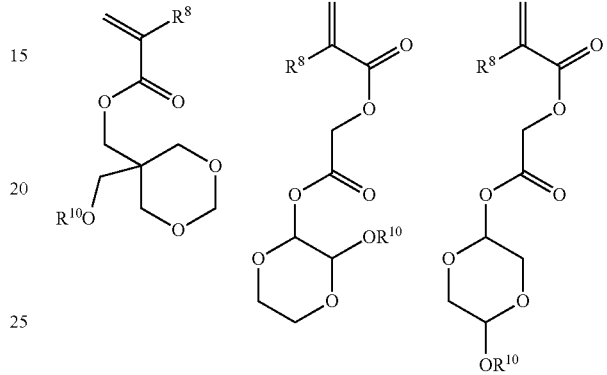
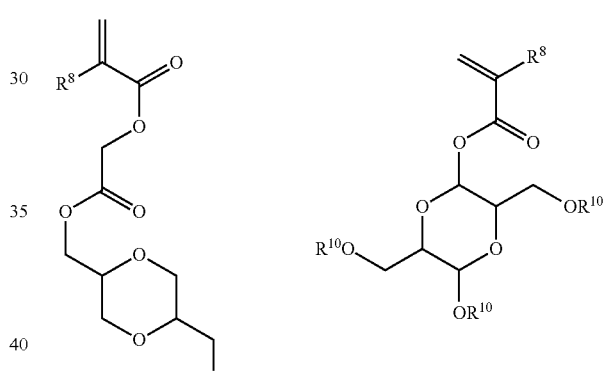
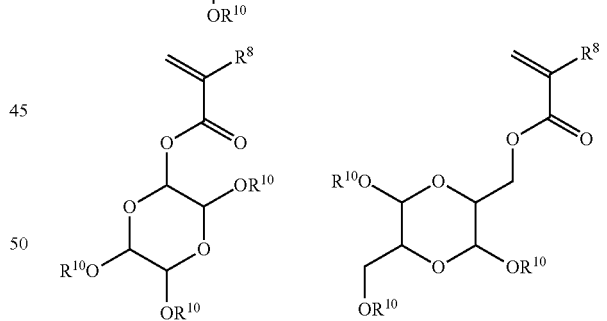
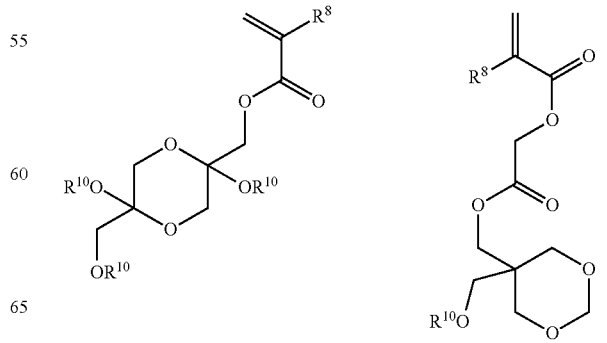

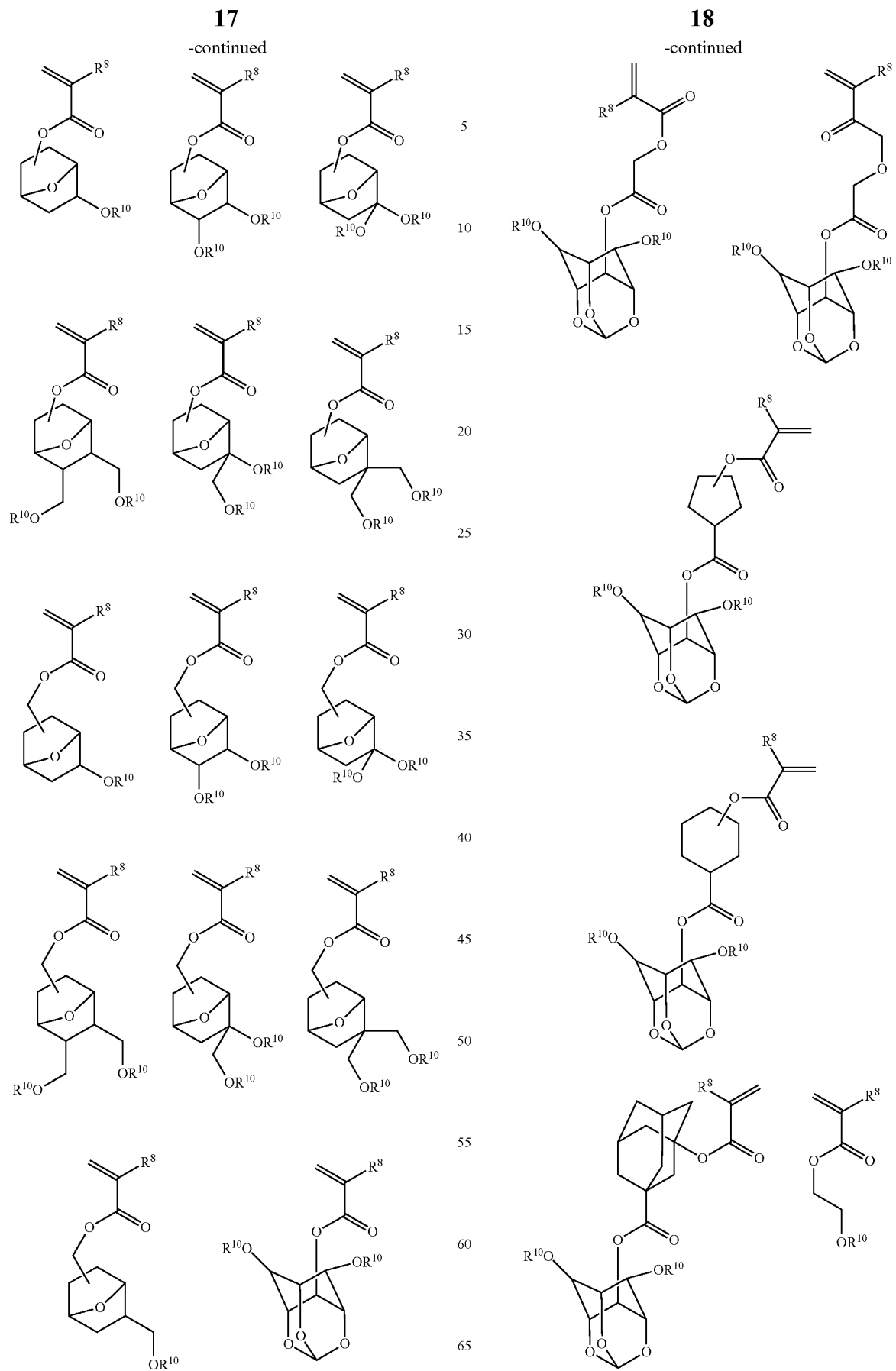

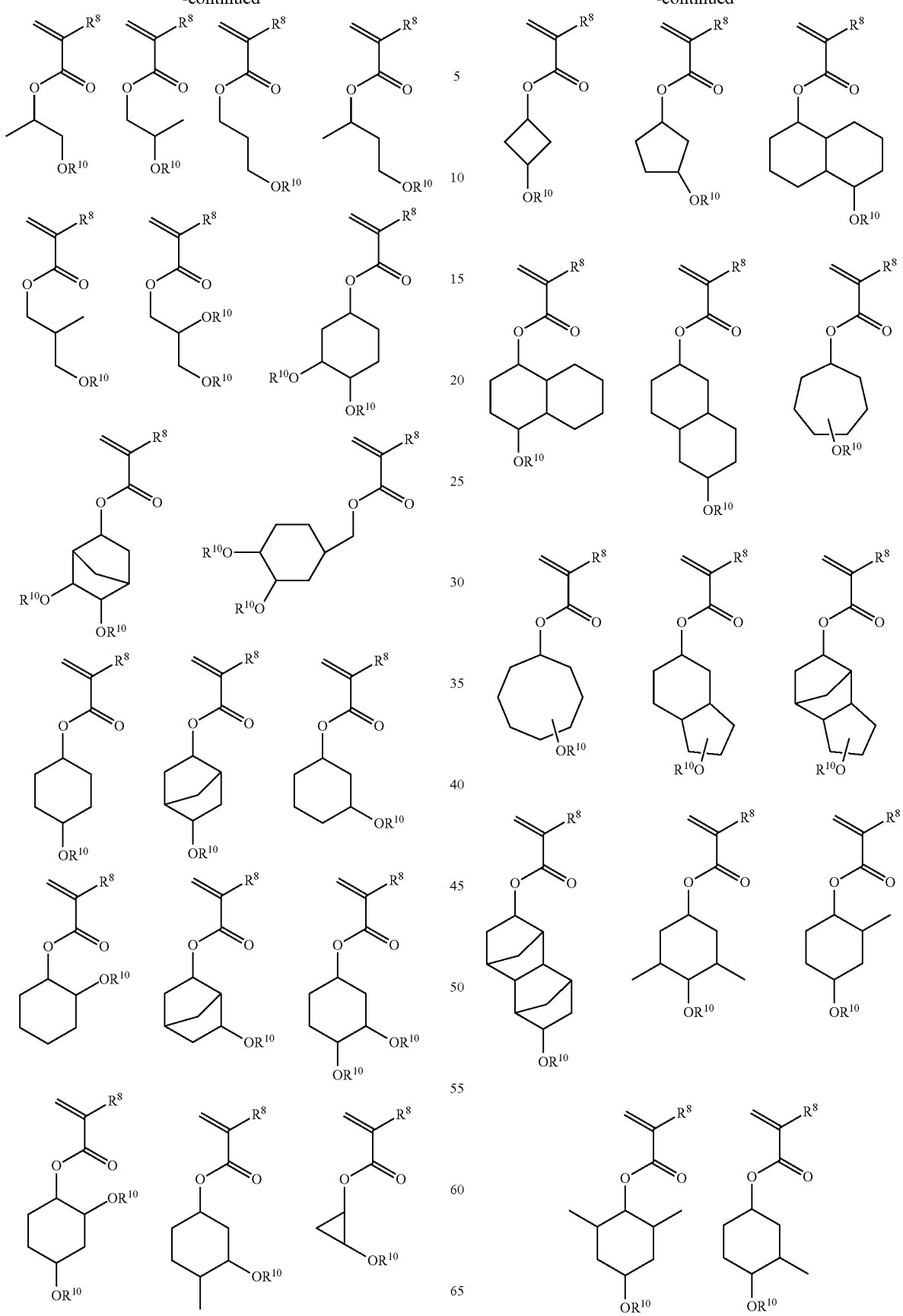

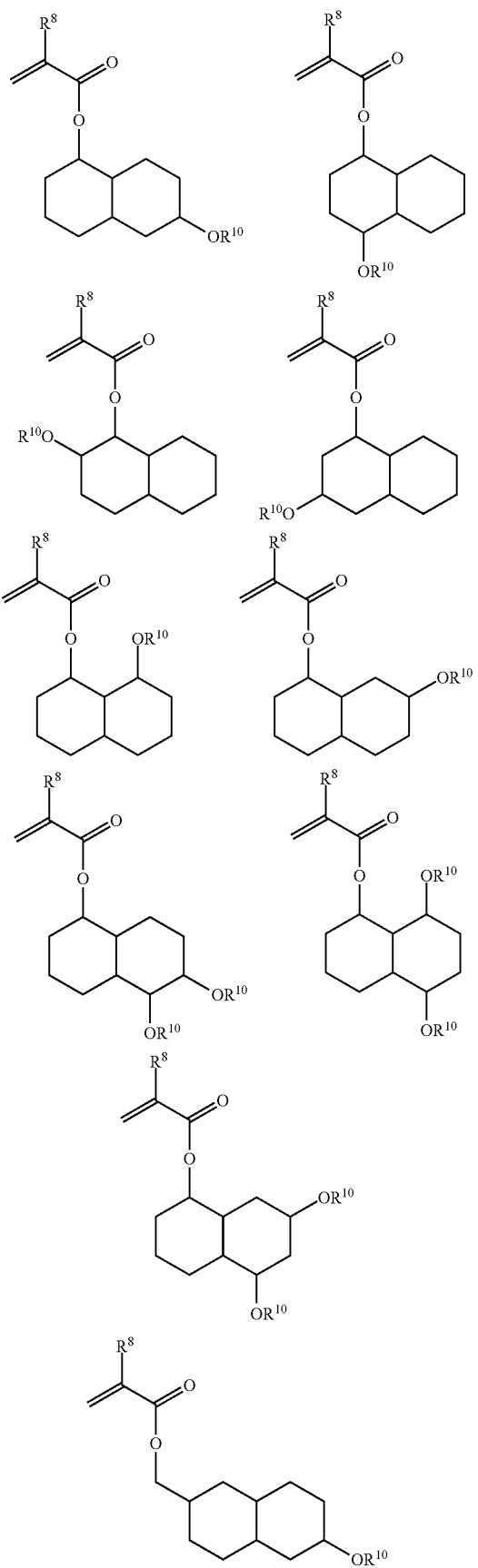
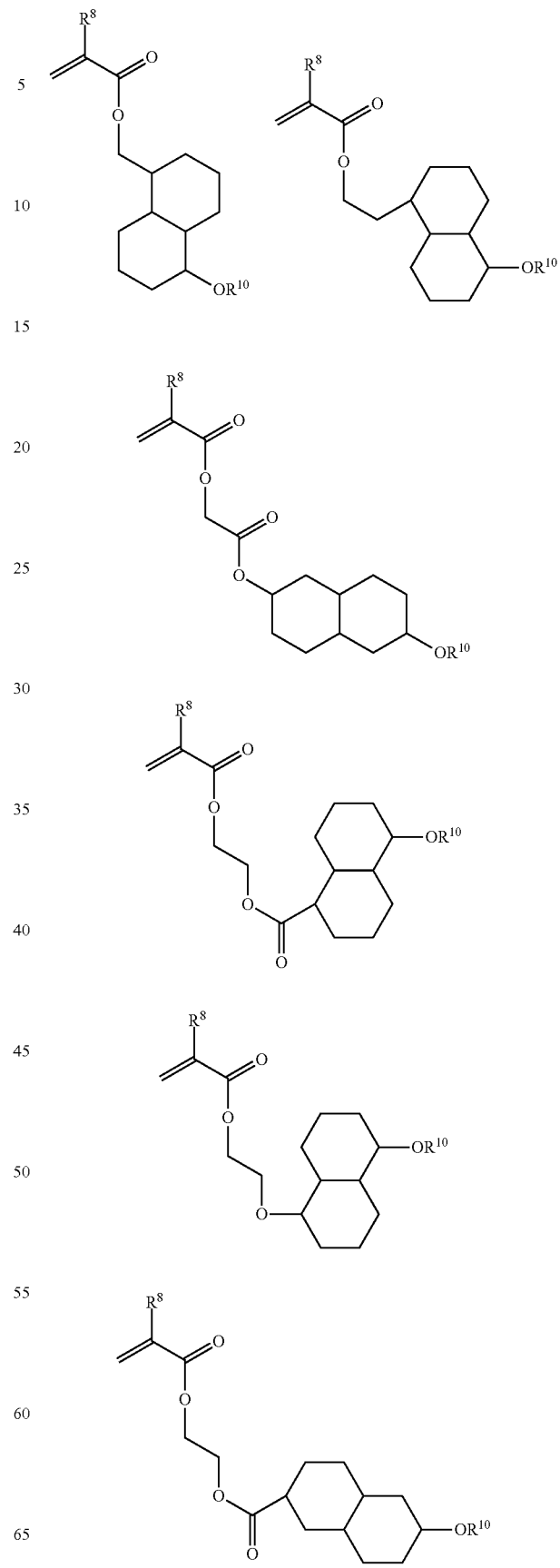

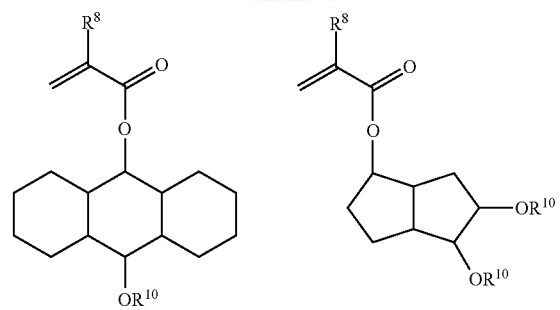
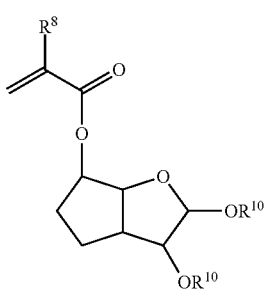
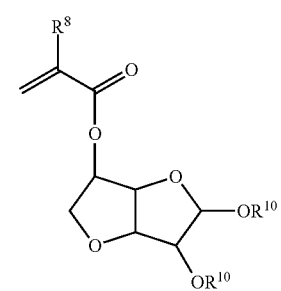
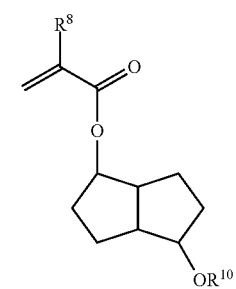
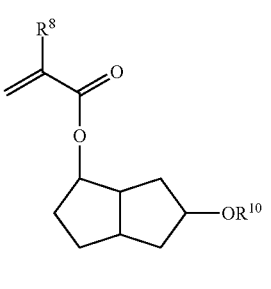
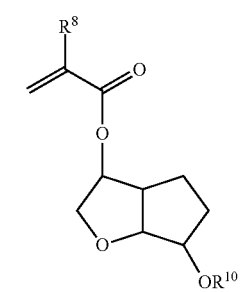
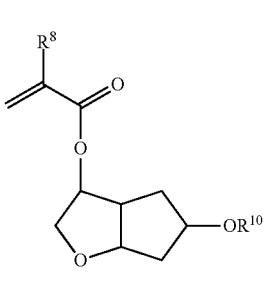
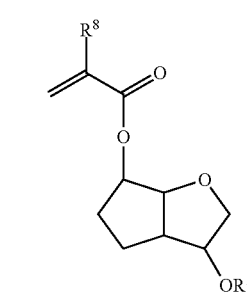
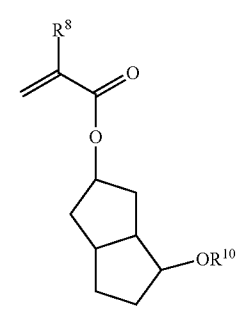
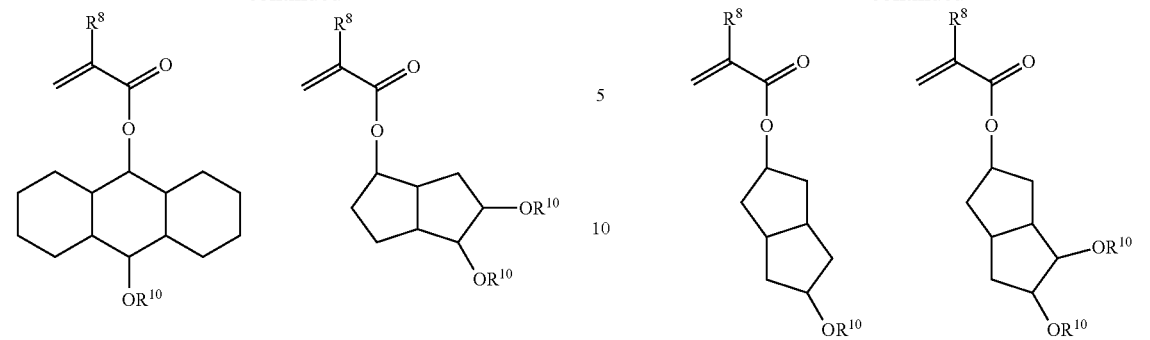
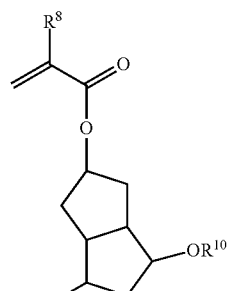
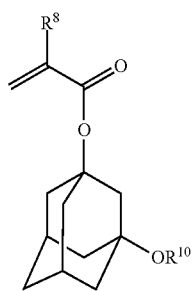
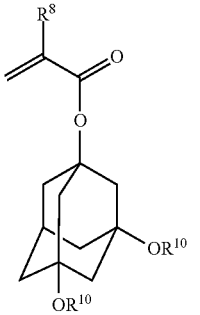
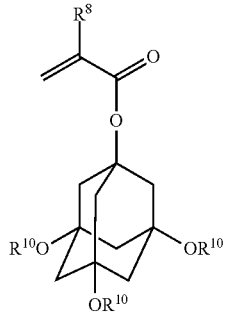
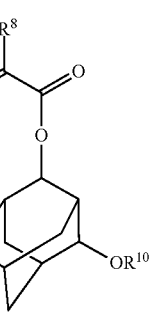
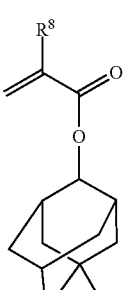
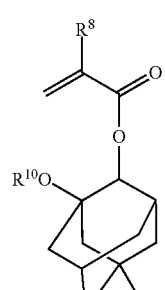

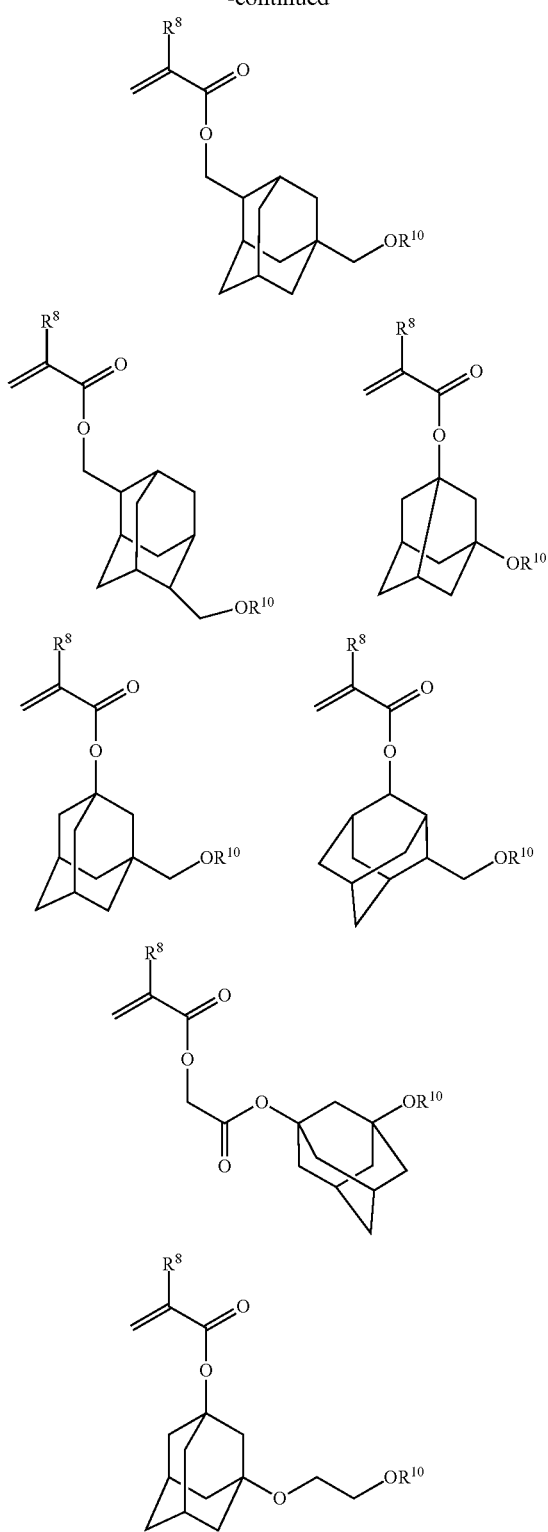

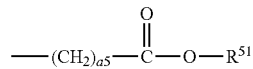  (AL-10)

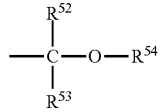  (AL-11)

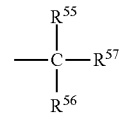  (AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, preferably 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

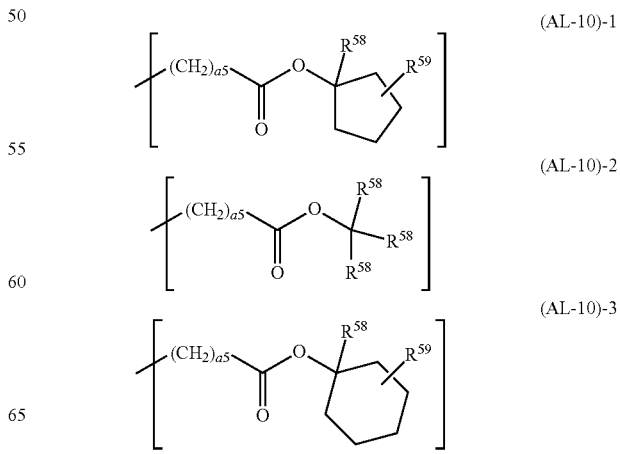

The acid labile groups represented by $R^7$ and $R^{10}$ in formula (2) may be selected from a variety of such groups. Preferred acid labile groups are groups of formulae (AL-10) and (AL-11), tertiary alkyl groups of formula (AL-12), and oxoalkyl groups of 4 to 20 carbon atoms, but not limited thereto.

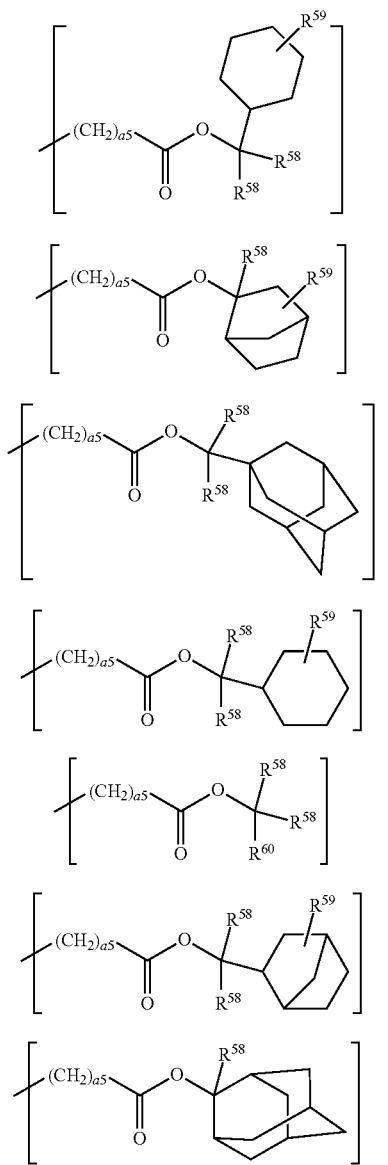

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-112.

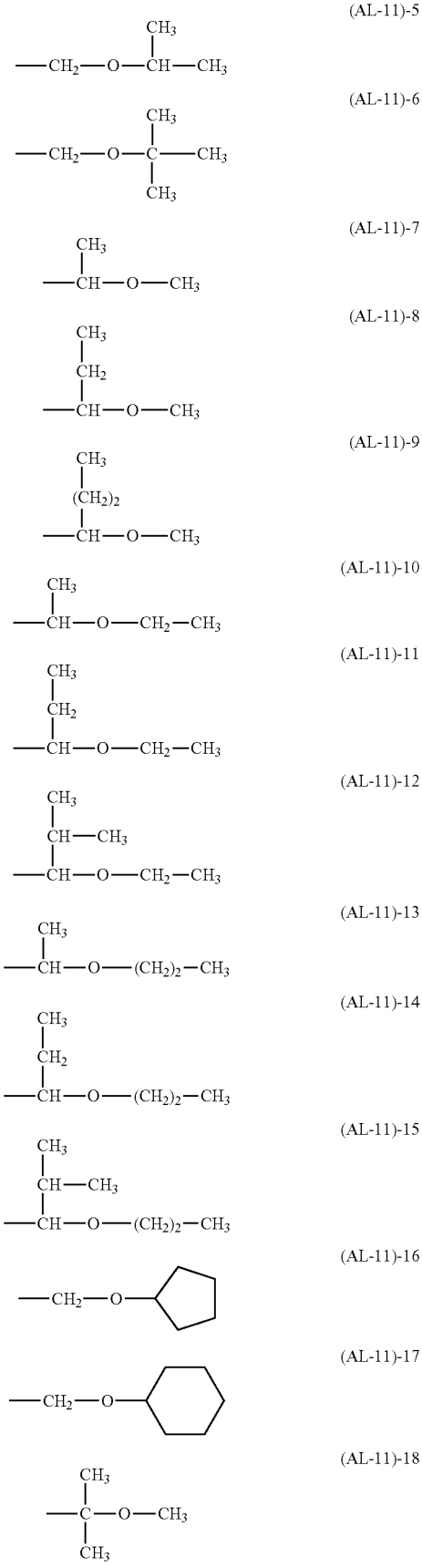

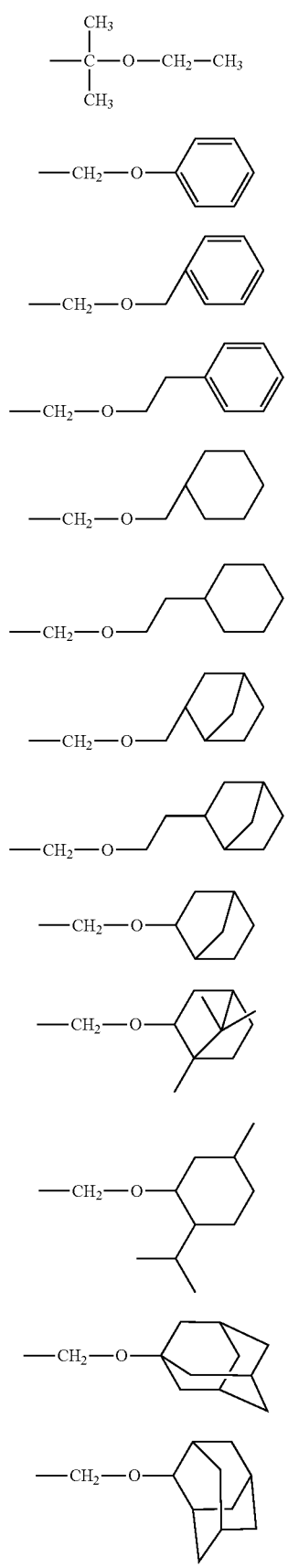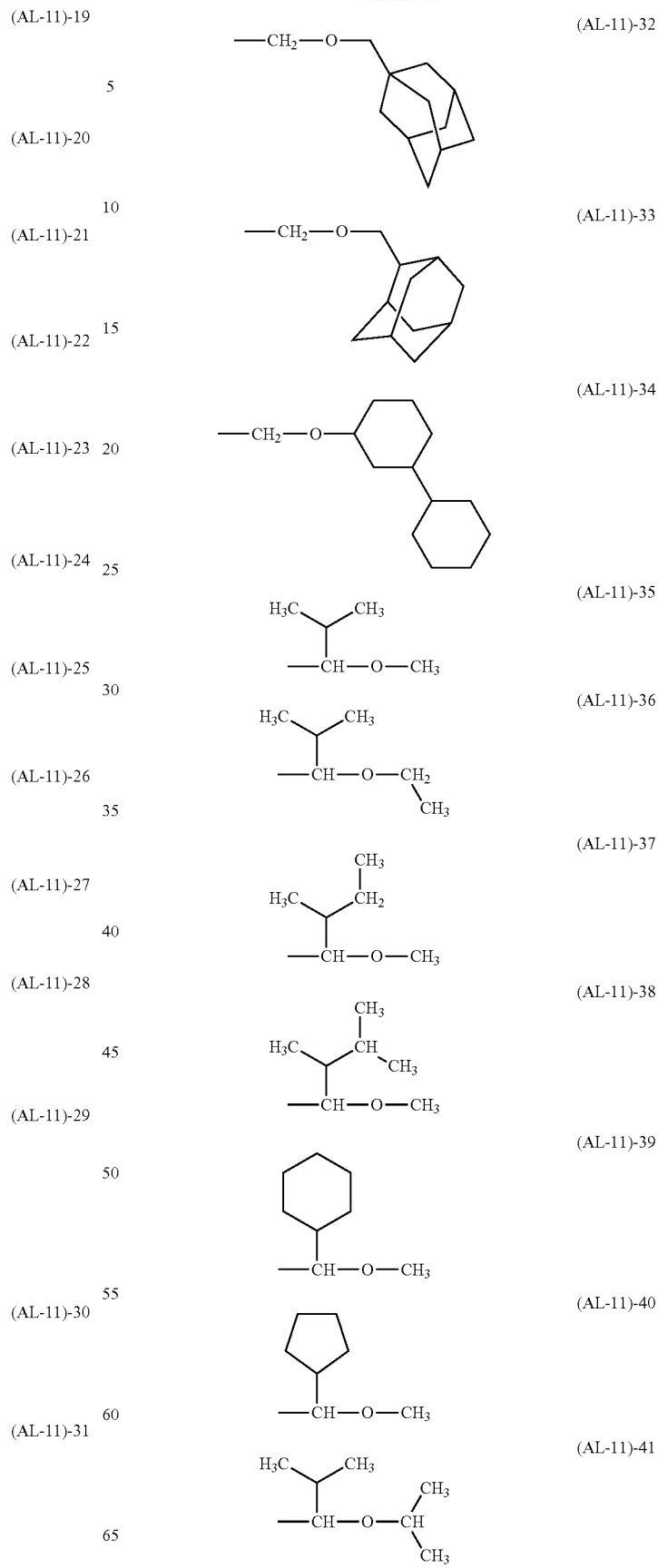

Chemical structure listings (AL-11)-42 through (AL-11)-61.

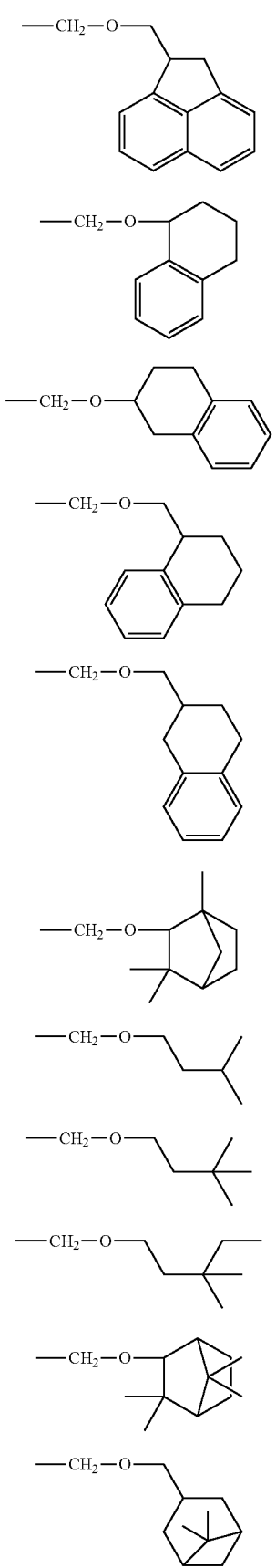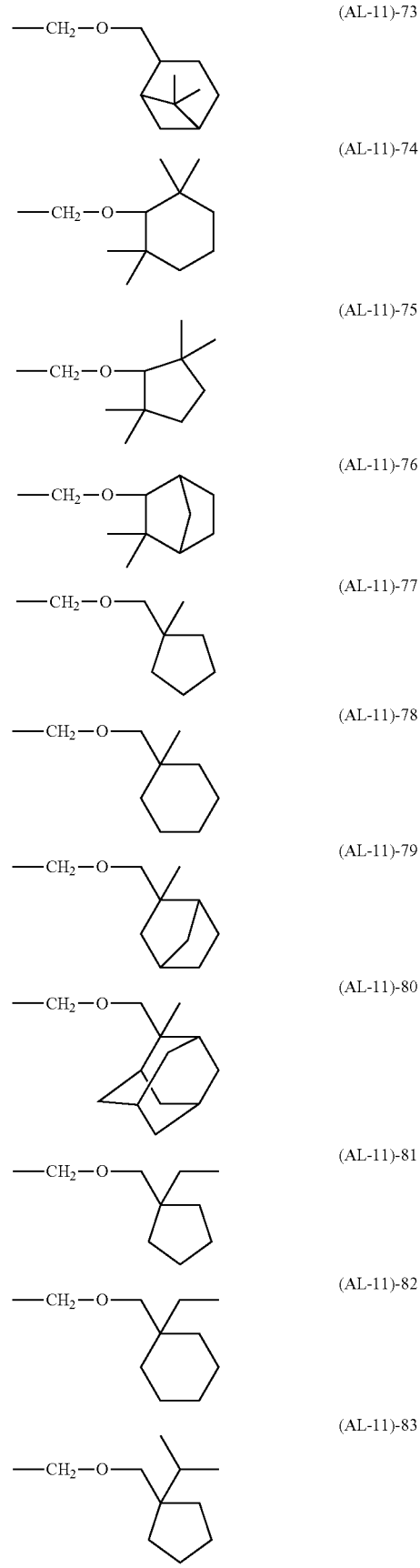

(AL-11)-84
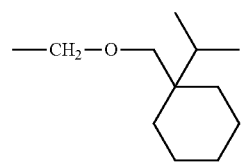
(AL-11)-85
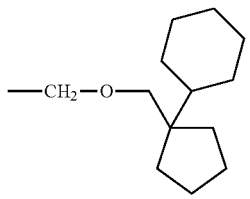
(AL-11)-86
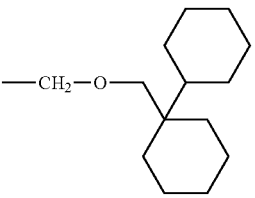
(AL-11)-87
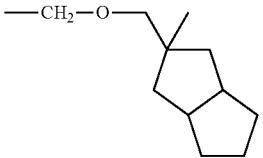
(AL-11)-88
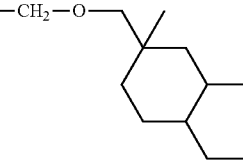
(AL-11)-89
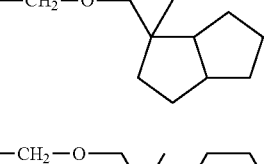
(AL-11)-90
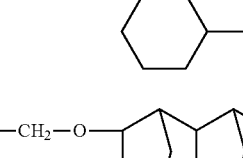
(AL-11)-91
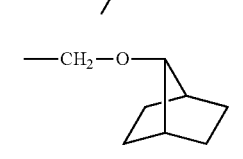
(AL-11)-92
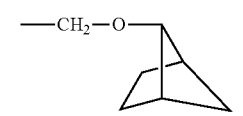
(AL-11)-93
(AL-11)-94
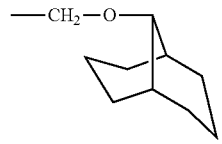
(AL-11)-95
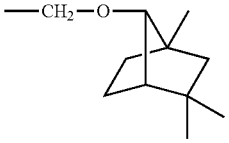
(AL-11)-96
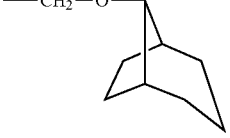
(AL-11)-97
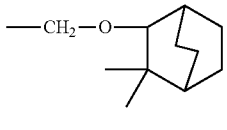
(AL-11)-98
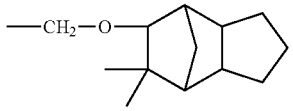
(AL-11)-99
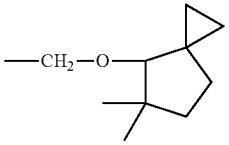
(AL-11)-100
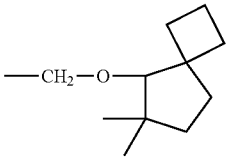
(AL-11)-101
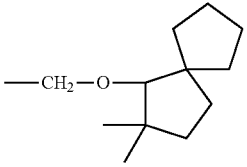
(AL-11)-102
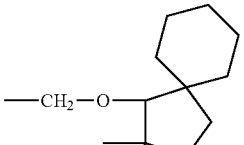
(AL-11)-103
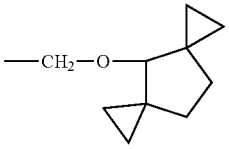

(AL-11)-104 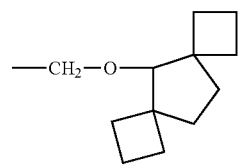

(AL-11)-105 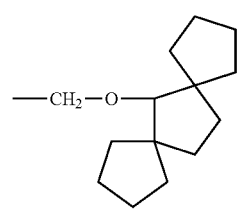

(AL-11)-106 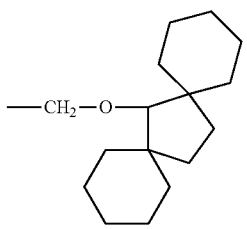

(AL-11)-107 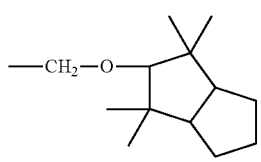

(AL-11)-108 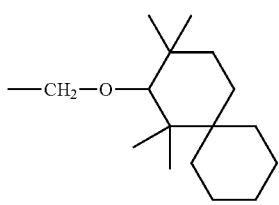

(AL-11)-109 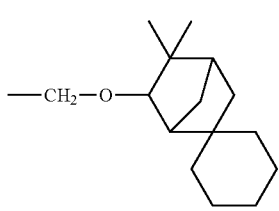

(AL-11)-110 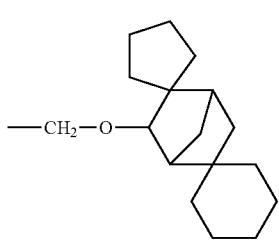

(AL-11)-111 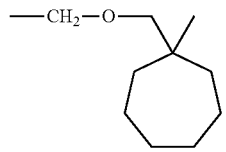

(AL-11)-112 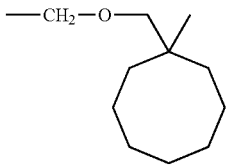

The polymer may be crosslinked within the molecule or between molecules with acid labile groups of formula (AL-11a) or (AL-11b).

(AL-11a)
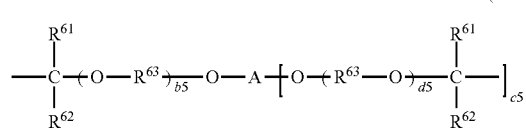

(AL-11b)
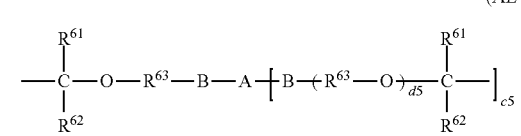

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ represent a straight or branched $C_1$-$C_8$ alkylene group when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

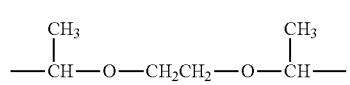 (AL-11)-13
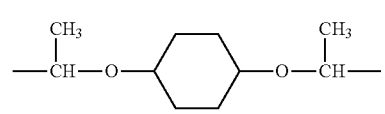 (AL-11)-14
 (AL-11)-15
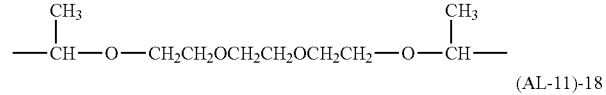 (AL-11)-16
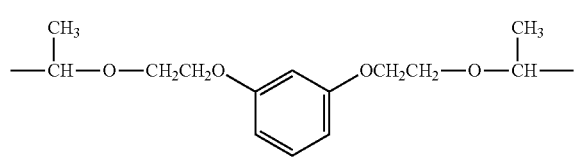 (AL-11)-17
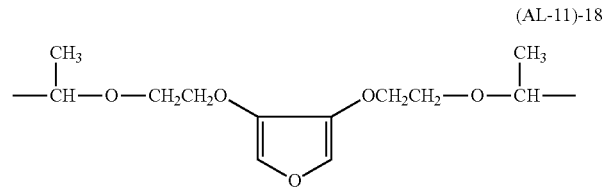 (AL-11)-18
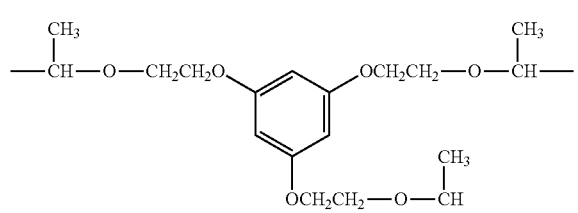 (AL-11)-19
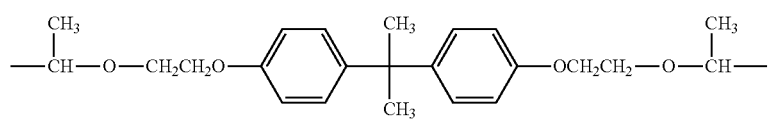 (AL-11)-20
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
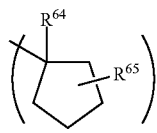 (AL-12)-1
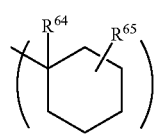 (AL-12)-2
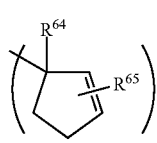 (AL-12)-3
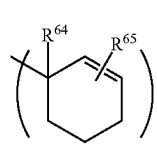 (AL-12)-4
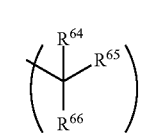 (AL-12)-5
-continued
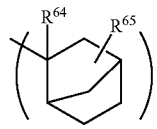 (AL-12)-6
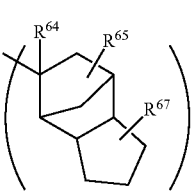 (AL-12)-7
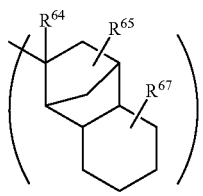 (AL-12)-8
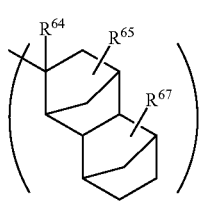 (AL-12)-9

(AL-12)-10 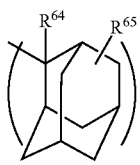

(AL-12)-11 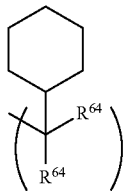

(AL-12)-12 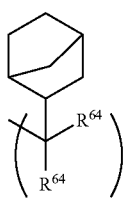

(AL-12)-13 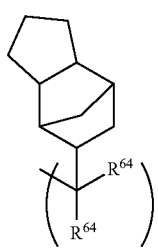

(AL-12)-14 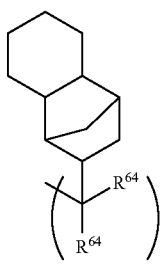

(AL-12)-15 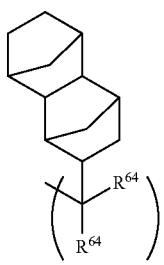

(AL-12)-16 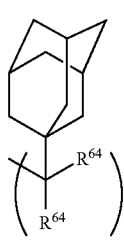

Herein $R^{64}$ is independently a straight, branched or cyclic $C_1$-$C_8$ alkyl group, $C_6$-$C_{20}$ aryl group or $C_7$-$C_{20}$ aralkyl group. Two $R^{63}$ may bond together to form a ring. $R^{65}$ and $R^{67}$ each are hydrogen, methyl or ethyl. $R^{66}$ is a $C_6$-$C_{20}$ aryl group or $C_7$-$C_{20}$ aralkyl group.

Also included are acid labile groups of formula (AL-12)-17. With acid labile groups comprising $R^{68}$ representative of a di- or multivalent alkylene or arylene group, the polymer may be crosslinked within the molecule or between molecules.

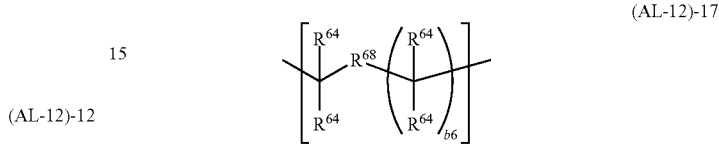
(AL-12)-17

In formula (AL-12)-17, $R^{64}$ is as defined above; $R^{68}$ is a single bond or a straight, branched or cyclic $C_1$-$C_{20}$ alkylene group or arylene group which may contain a heteroatom such as oxygen, sulfur or nitrogen; and b6 is an integer of 1 to 3.

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

—(CH$_2$)$_4$OH  (AL-13)-1

—(CH$_2$)$_2$O(CH$_2$)$_3$CH$_3$  (AL-13)-2

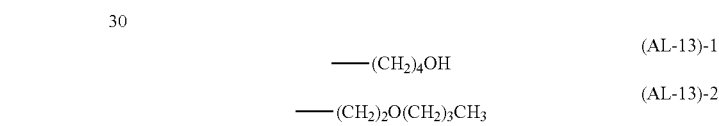
(AL-13)-3

—(CH$_2$)$_2$O(CH$_2$)$_2$OH  (AL-13)-4

—(CH$_2$)$_6$OH  (AL-13)-5

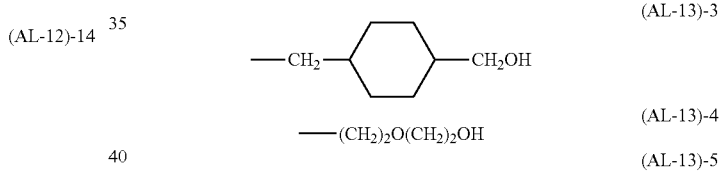
(AL-13)-6

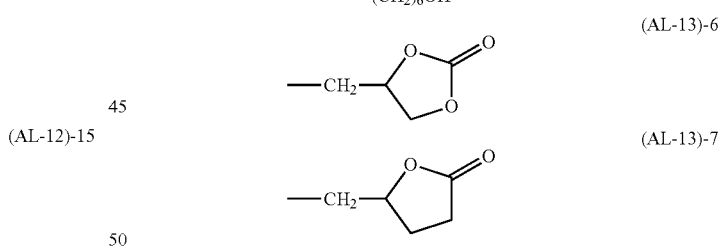
(AL-13)-7

Of the acid labile groups of formula (AL-12), groups having an exo-form structure represented by the formula (AL-12)-19 are preferred.

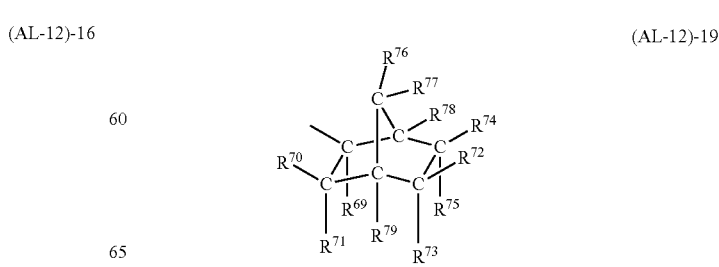
(AL-12)-19

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{75}$ and $R^{79}$ are each independently hydrogen or a monovalent hydrocarbon group, typically $C_1$-$C_{15}$ alkyl group, which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, typically alicyclic, with the carbon atom to which they are attached, and in this case, each group participating in ring formation is a divalent hydrocarbon group, typically $C_1$-$C_{15}$ alkylene group, which may contain a heteroatom. Also, a pair of $R^{70}$ and $R^{79}$, $R^{75}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 shown below are derived are described in U.S. Pat. No. 6,448,420 (JP-A 2000-327633).

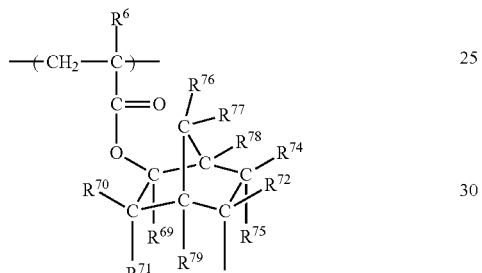

Herein $R^6$ and $R^{69}$ to $R^{79}$ are as defined above.

Illustrative non-limiting examples of suitable monomers are given below.

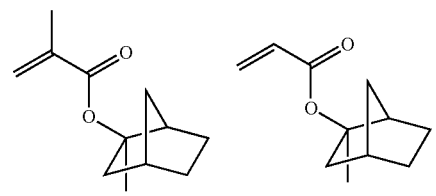

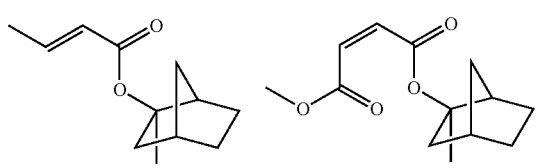

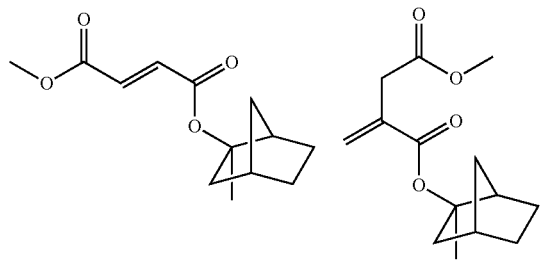

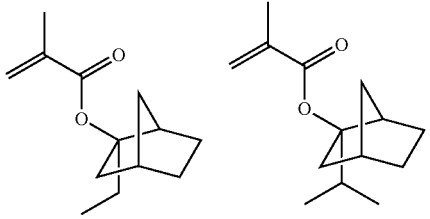
-continued

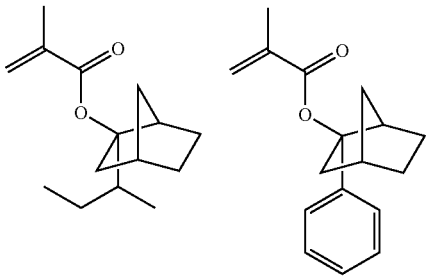

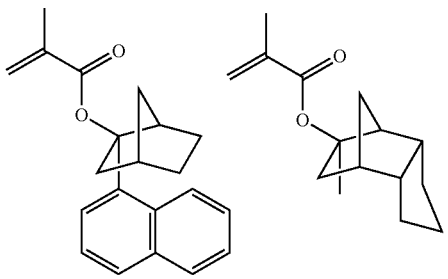

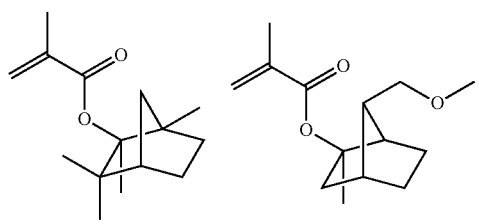

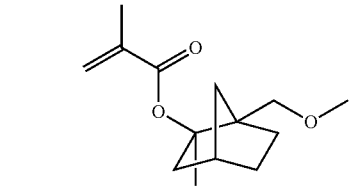

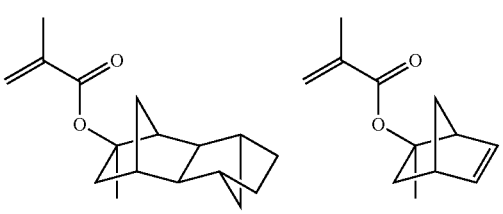

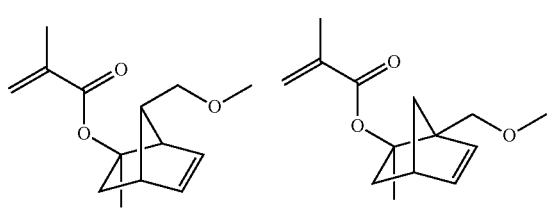

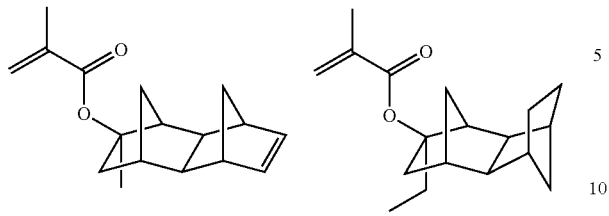

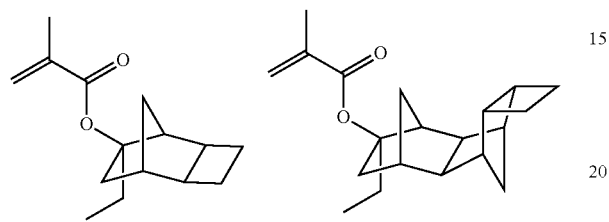

Also included in the acid labile groups of formula (AL-12) are acid labile groups having furandiyl, tetrahydrofurandiyl or oxanorbornanediyl as represented by the following formula (AL-12)-20.

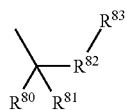
(AL-12)-20

Herein, $R^{80}$ and $R^{81}$ are each independently a monovalent hydrocarbon group, typically a straight, branched or cyclic $C_1$-$C_{10}$ alkyl group. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl group, which may contain a heteroatom.

Recurring units substituted with an acid labile group having furandiyl, tetrahydrofurandiyl or oxanorbornanediyl as represented by the formula:

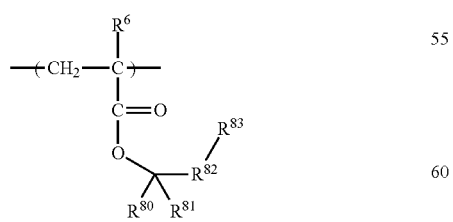

(wherein $R^{80}$ to $R^{83}$ and $R^6$ are as defined above) are derived from monomers, examples of which are shown below. Note that Me is methyl and Ac is acetyl.

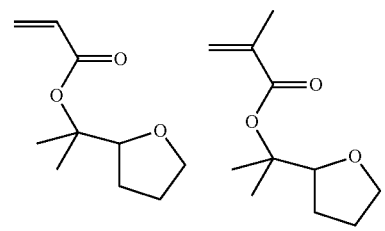

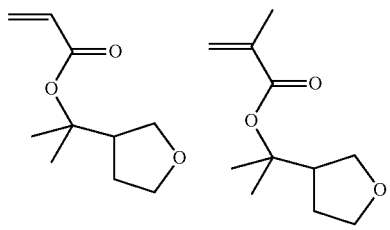

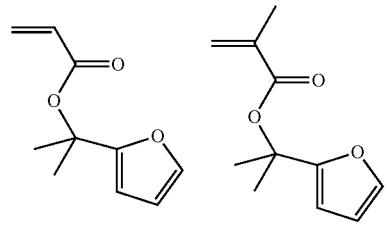

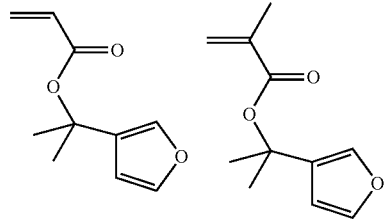

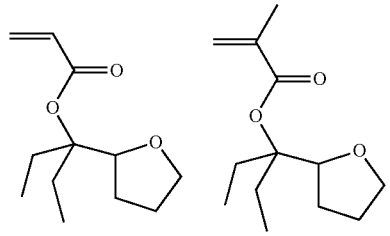

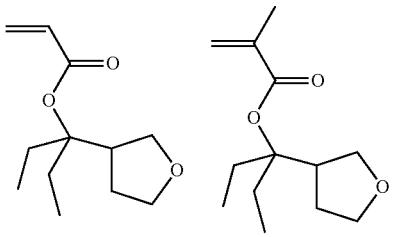

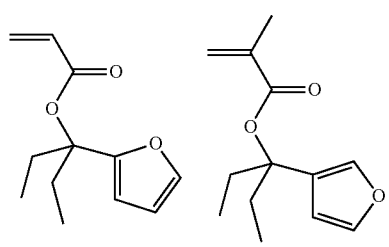

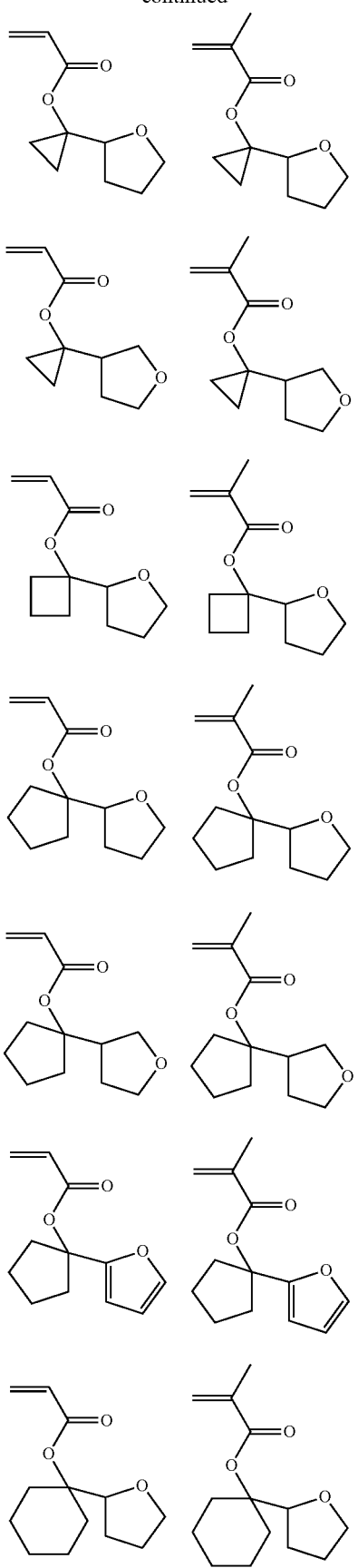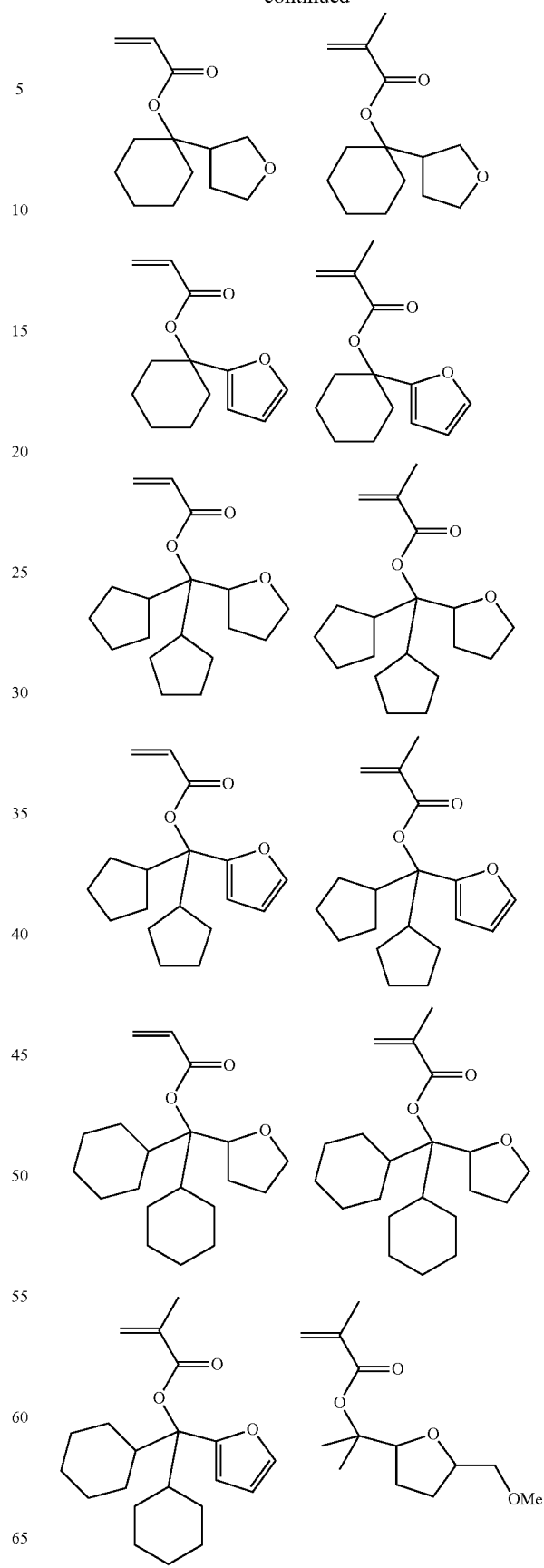

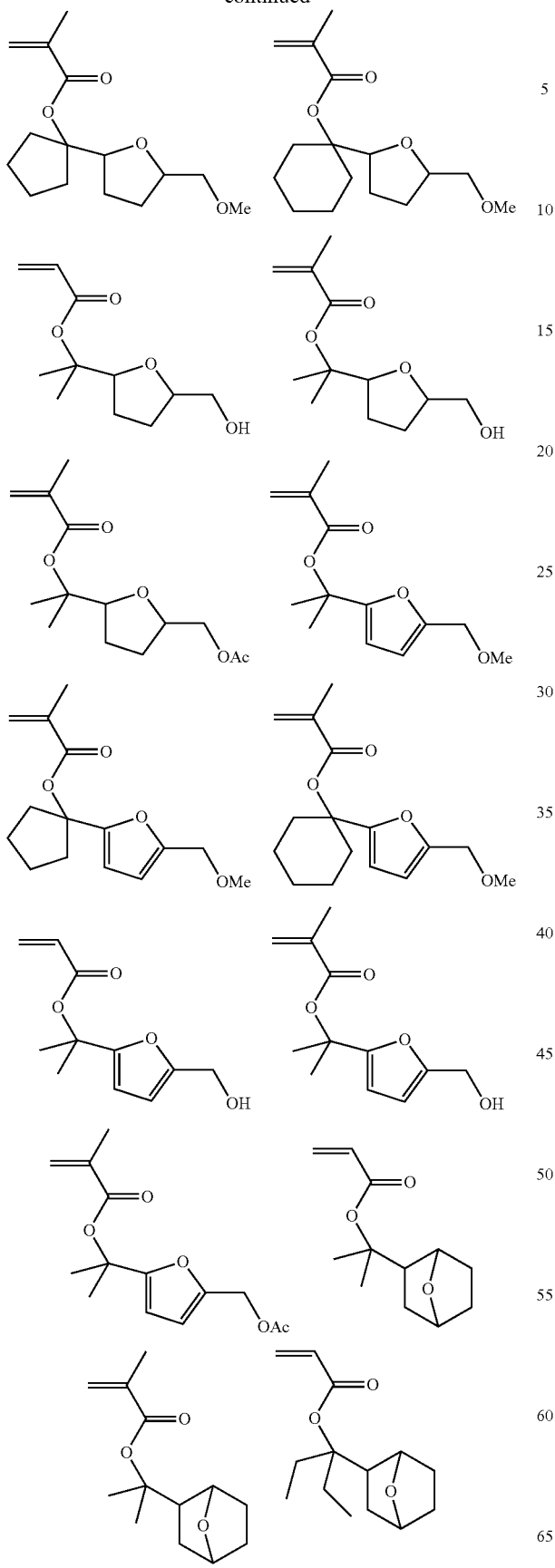
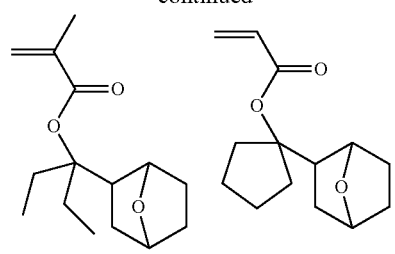
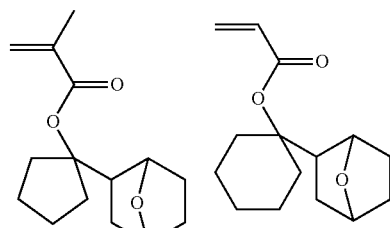
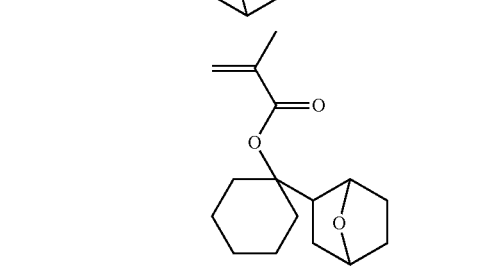
Where the tertiary alkyl group of formula (AL-12) as the acid labile group is a branched alkyl directly bonded to a ring, the polymer has a higher solubility in organic solvent. Such acid labile groups are exemplified below.
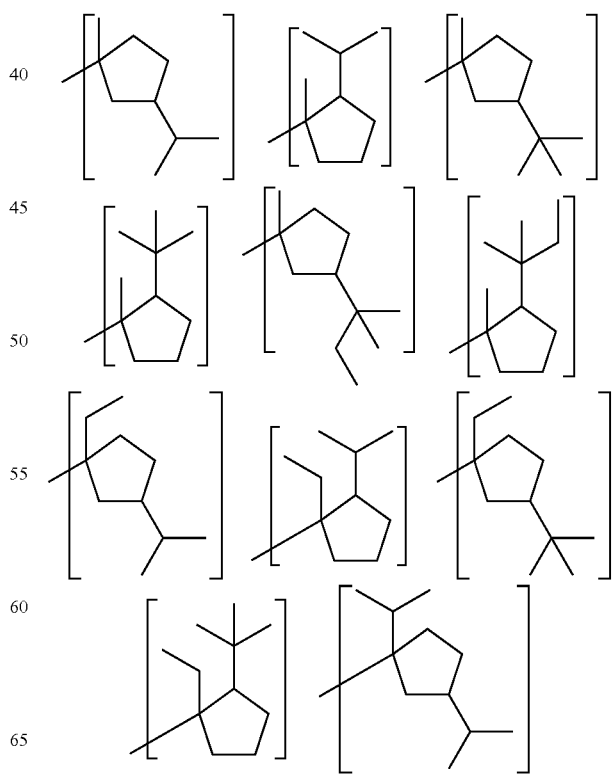

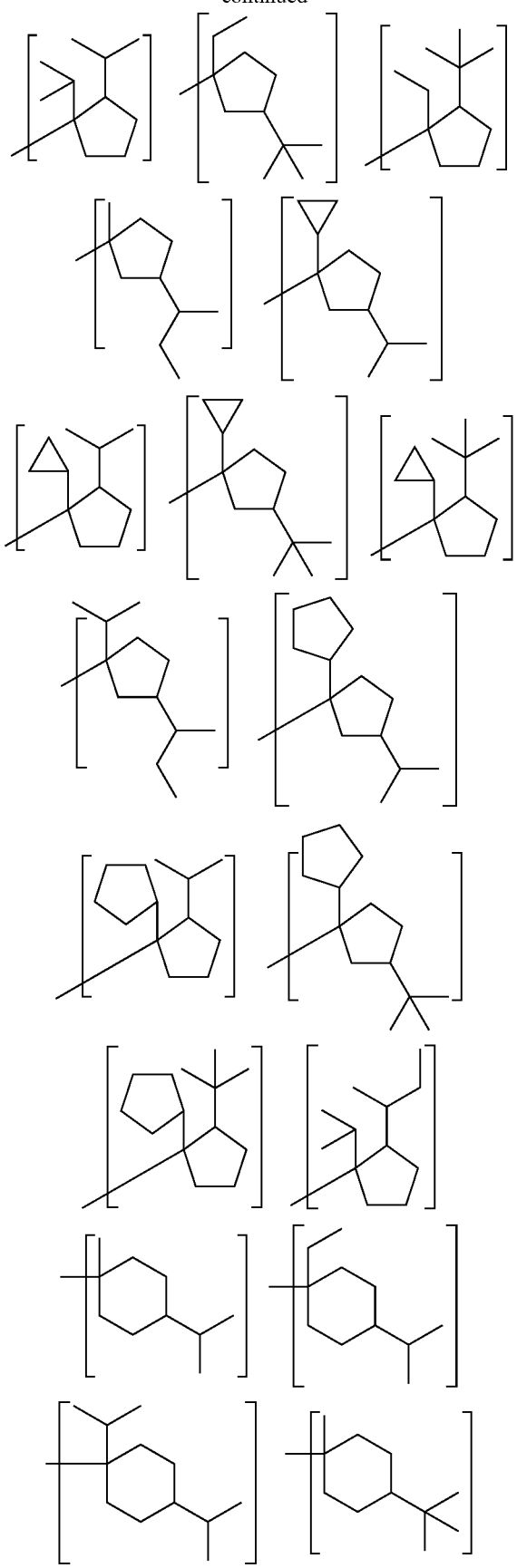
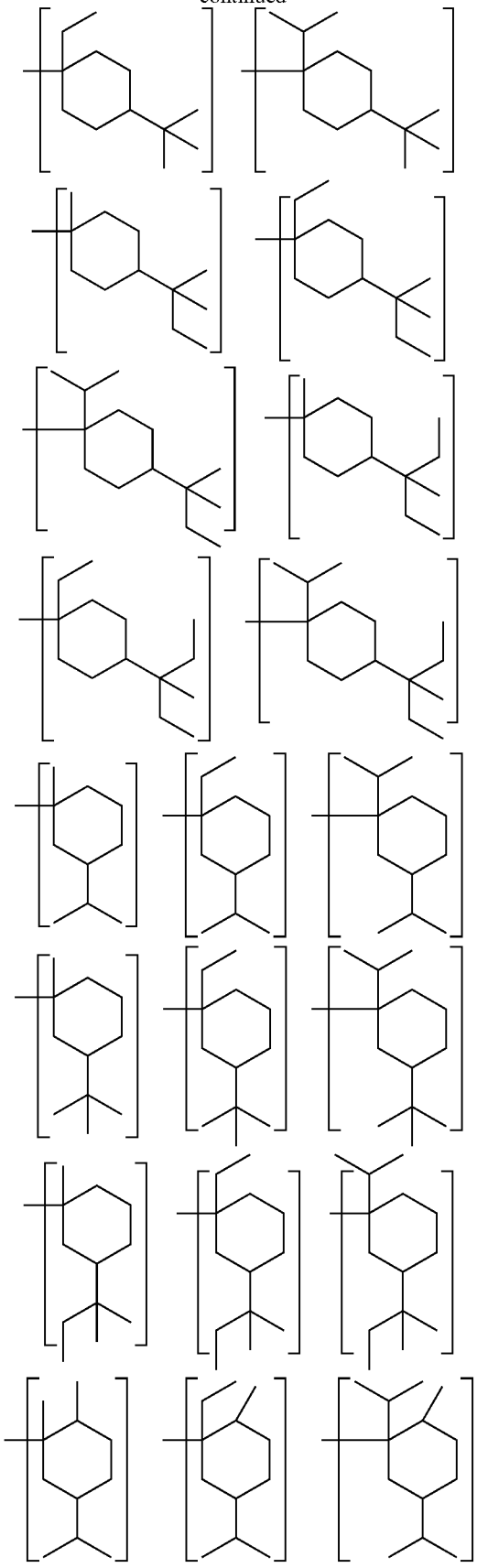

While the polymer in the resist composition includes recurring units (a) of formula (1) and preferably acid labile group-containing recurring units (b) and/or (c) of formula (2), the polymer may have further copolymerized therein recurring units (d) derived from a monomer having an adhesive group such as hydroxy, cyano, carbonyl, ester, ether group, lactone ring, carboxyl, carboxylic anhydride, sulfonic ester, disulfone, or carbonate group. Of these, monomers having lactone ring as the adhesive group are most preferred.

Examples of monomers from which recurring units (d) are derived are given below.

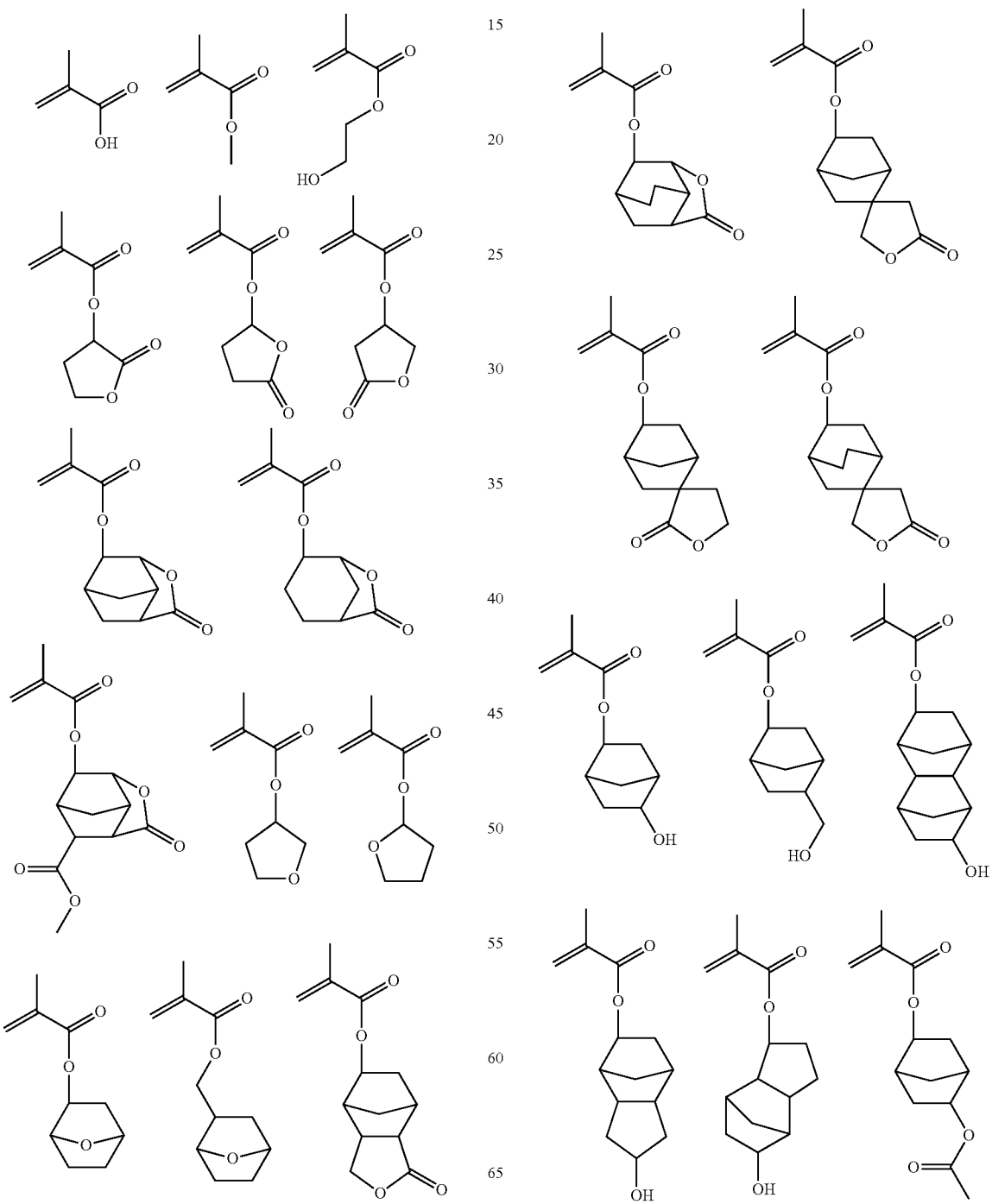

-continued

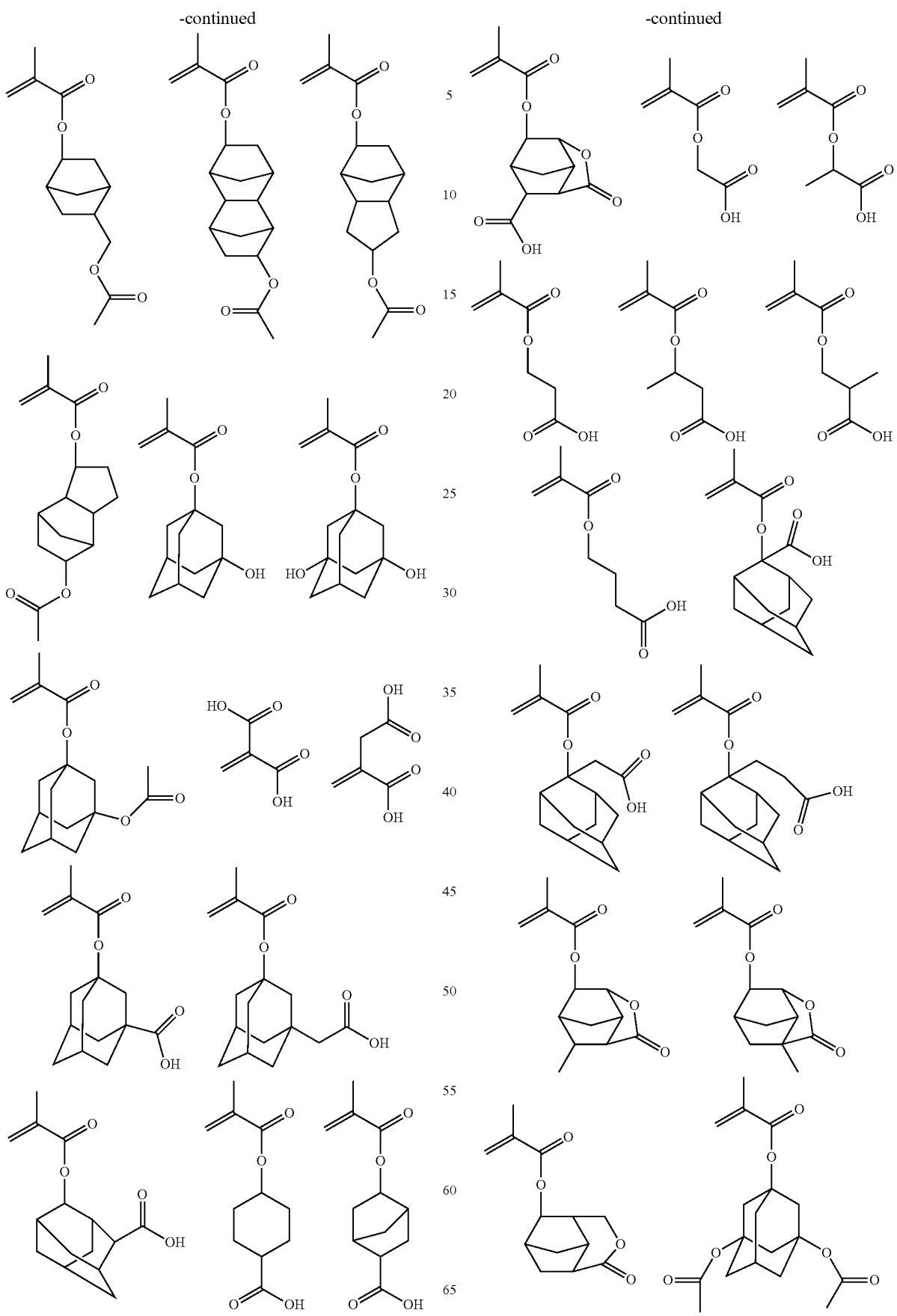

-continued
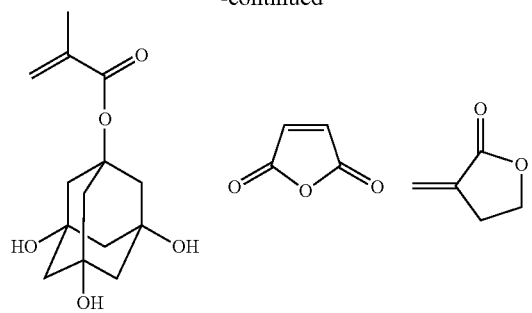
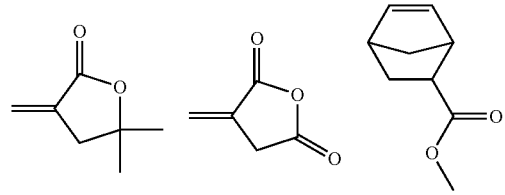
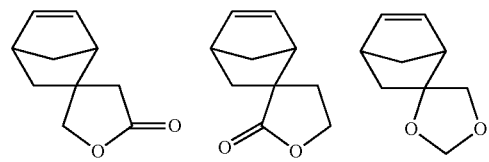
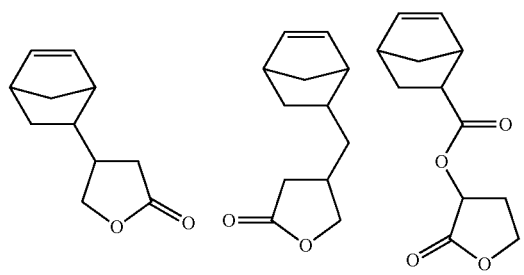
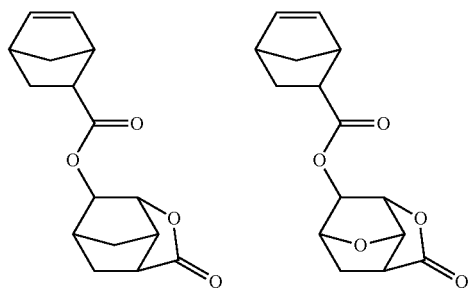
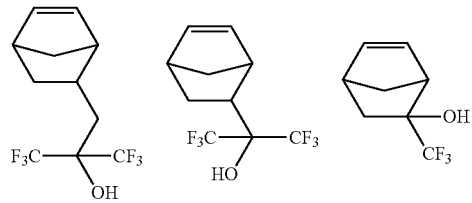
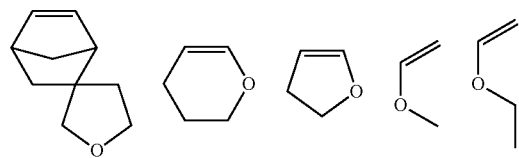
-continued
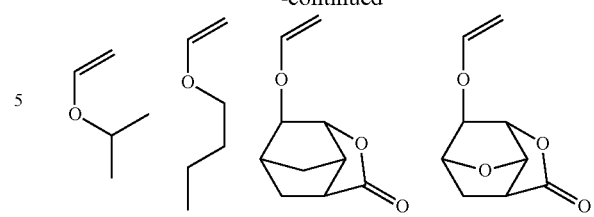
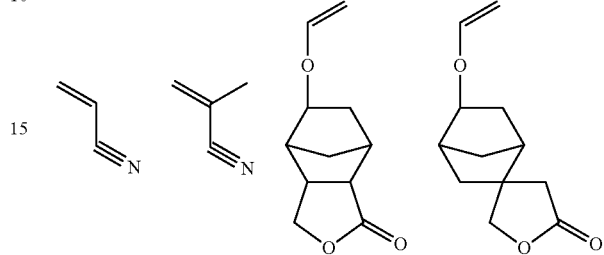
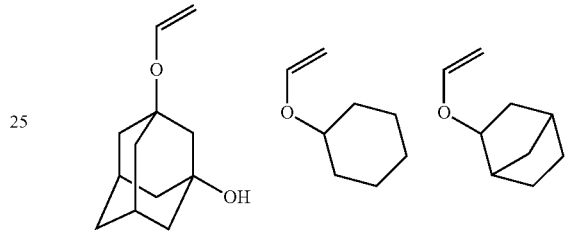
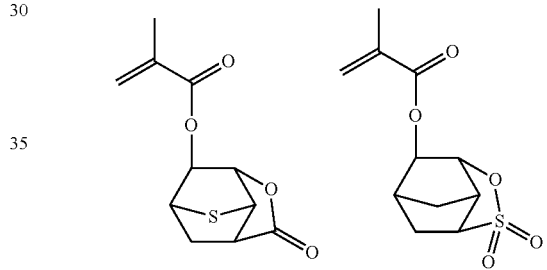
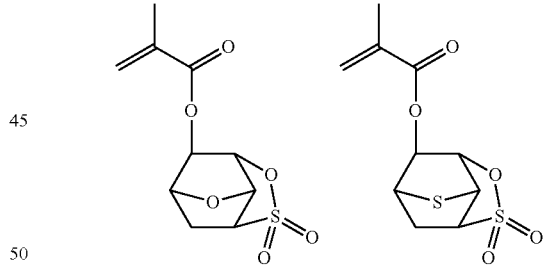
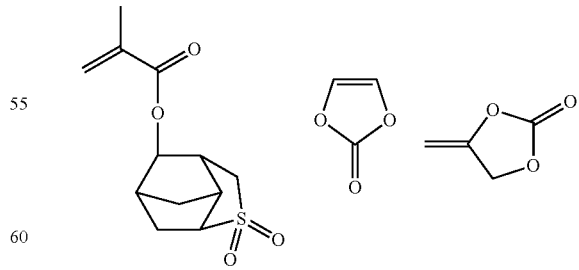
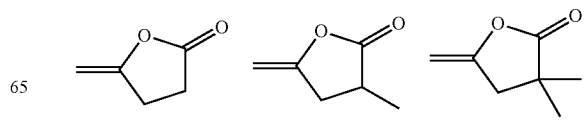

59
-continued
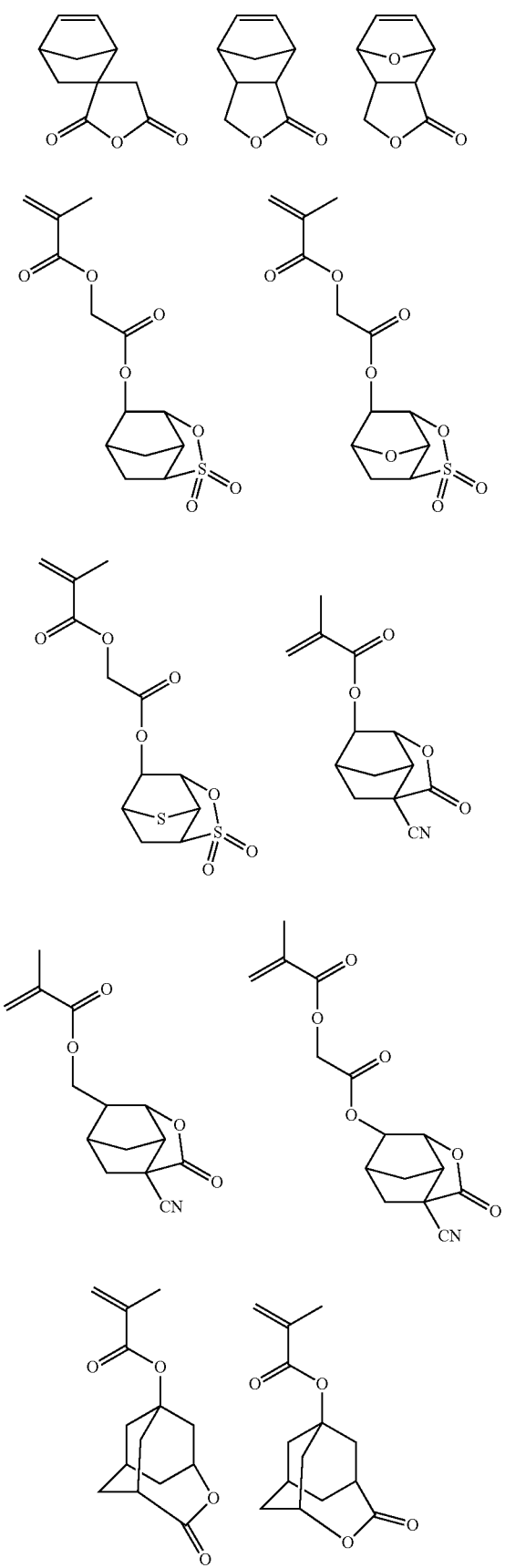
60
-continued
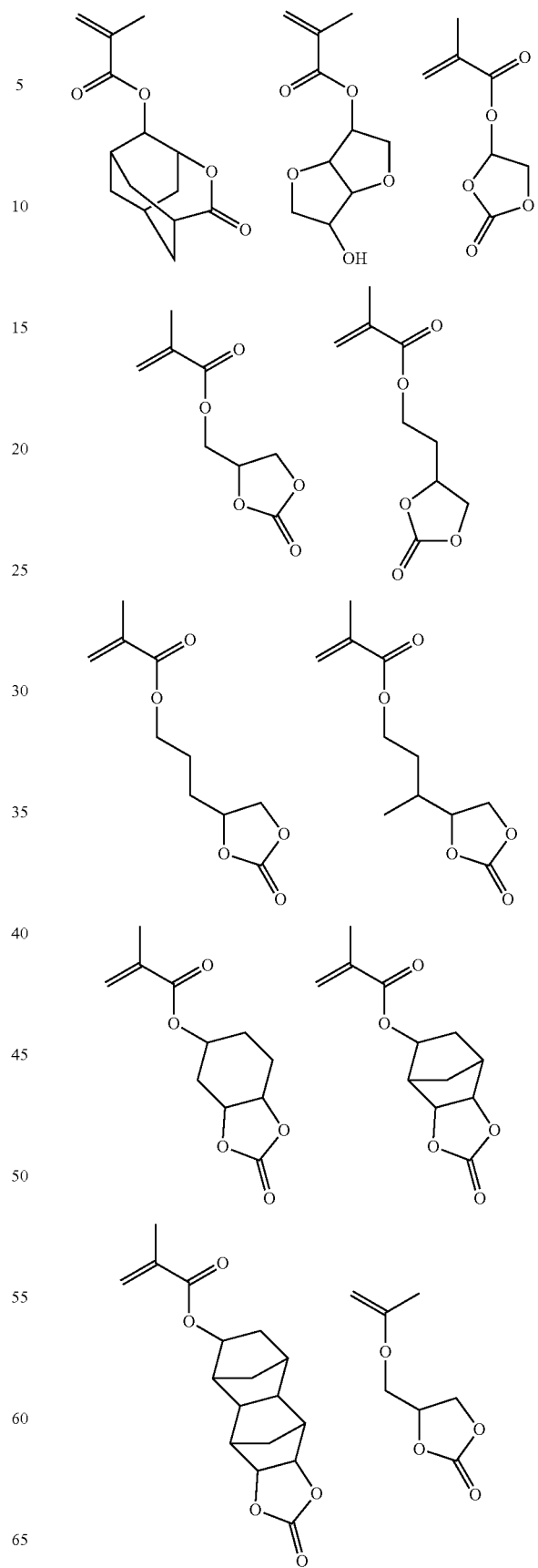

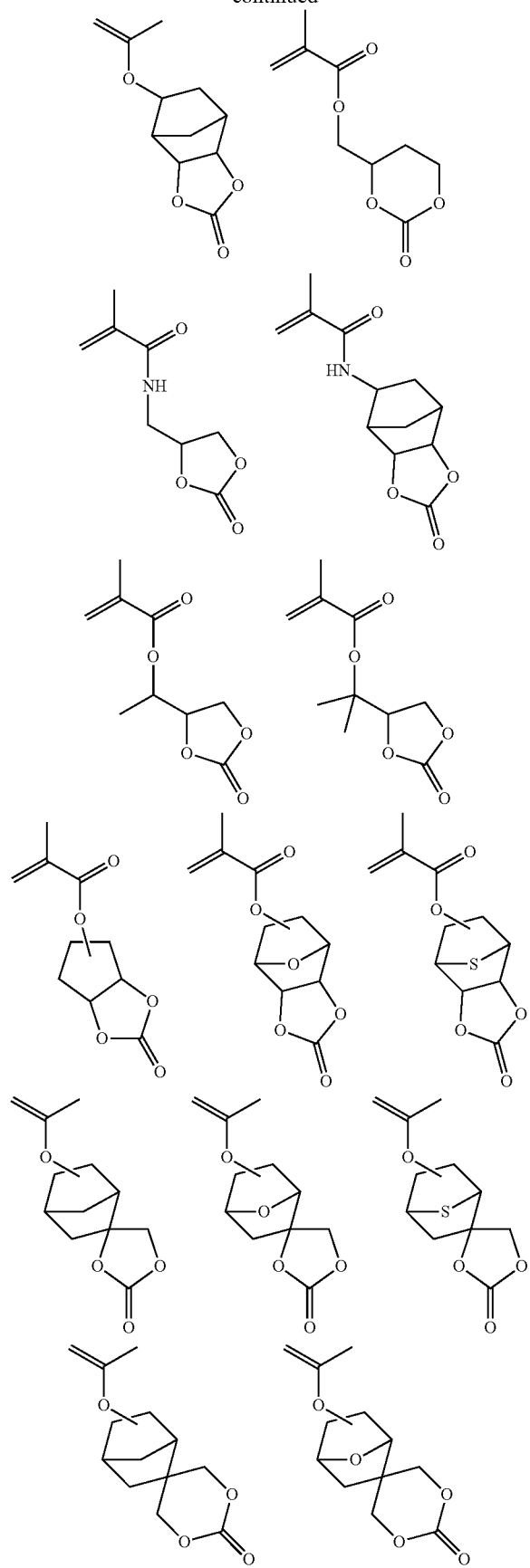

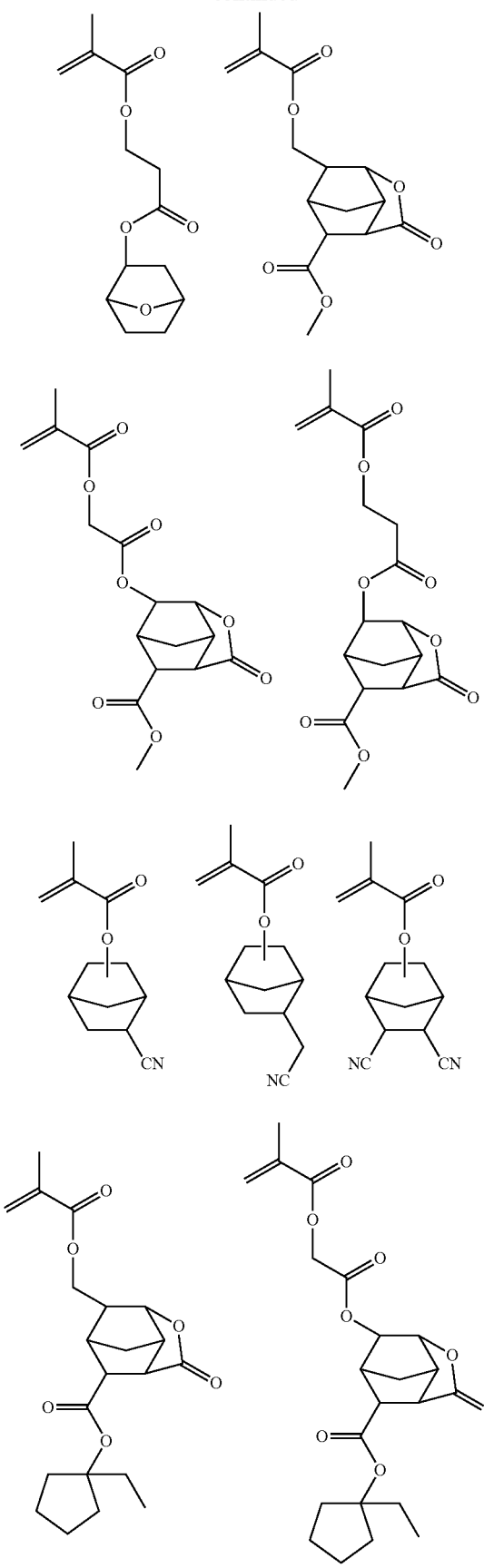
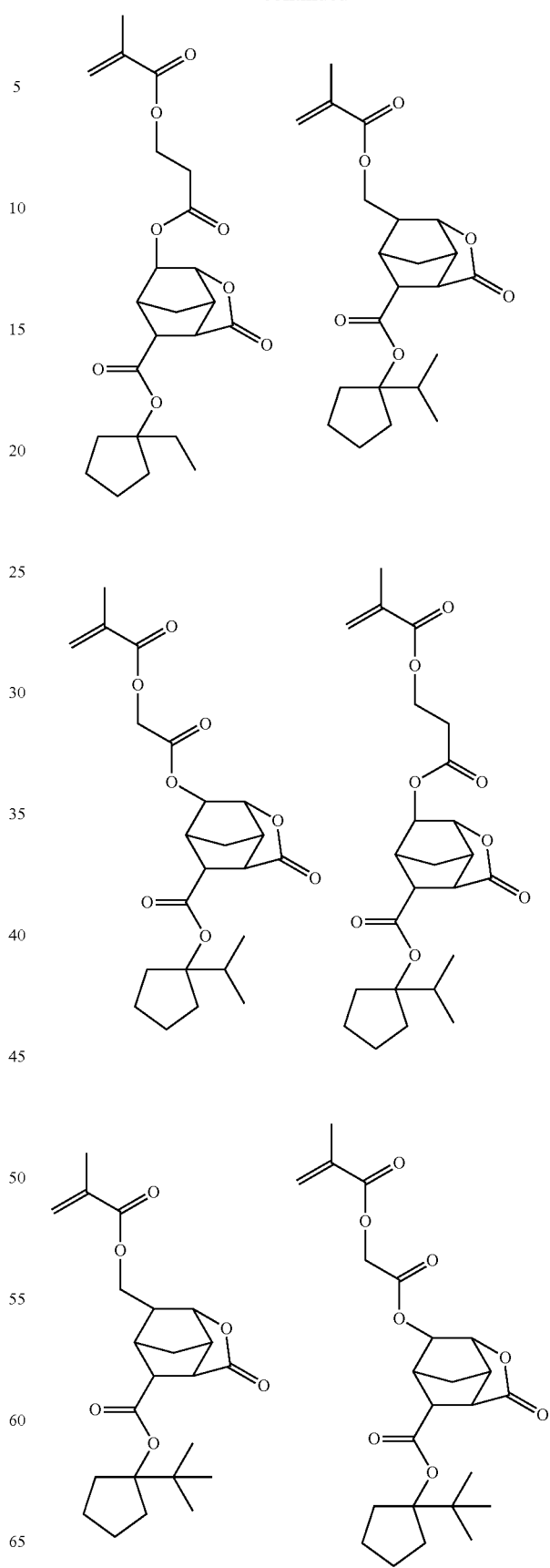

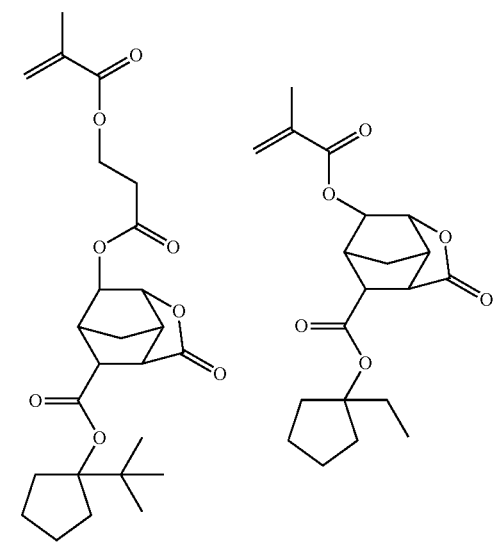
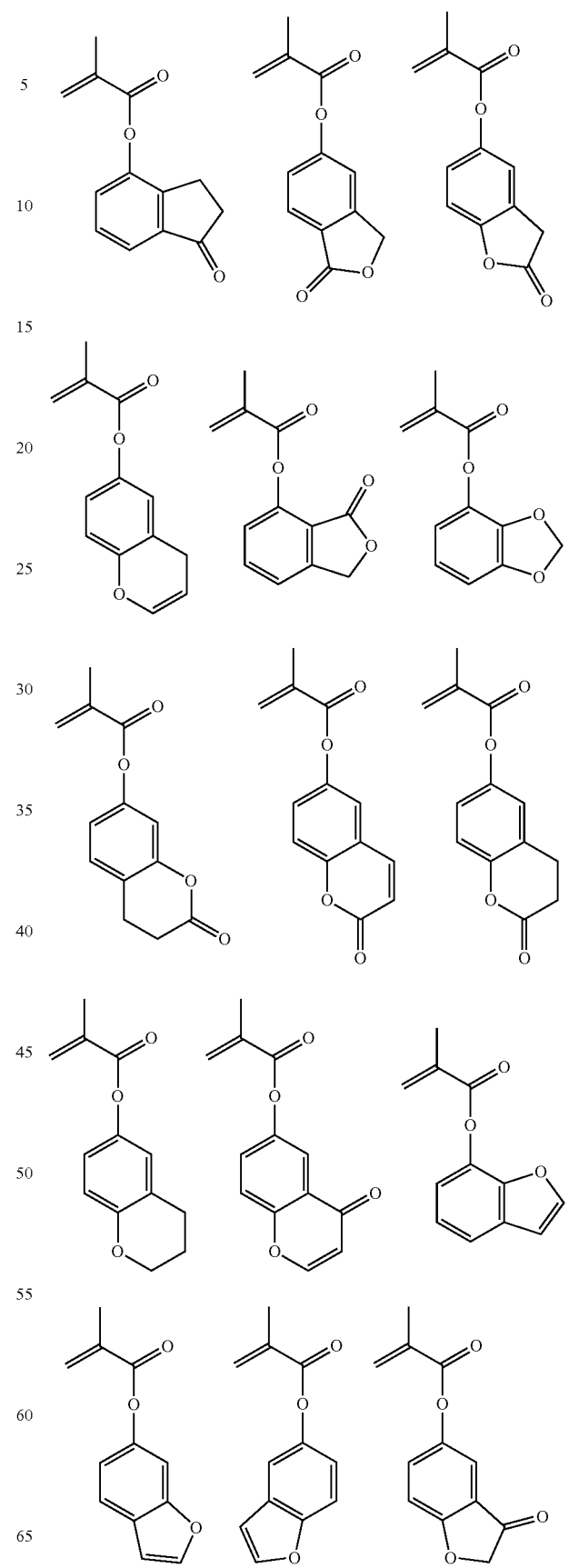

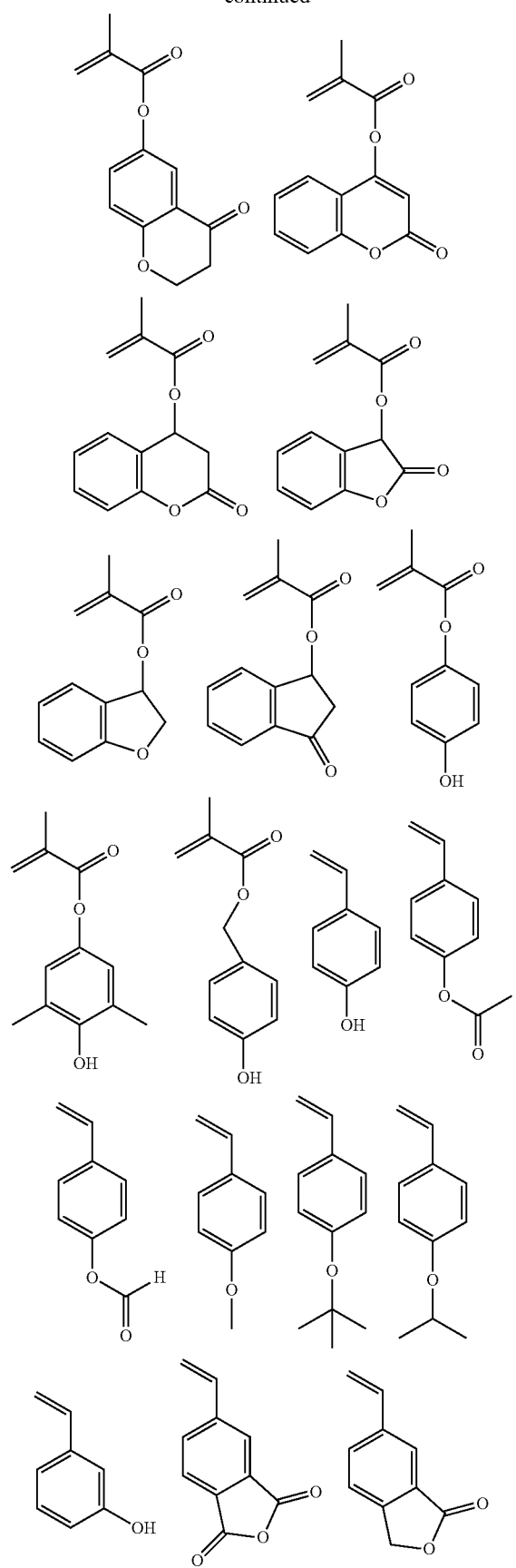
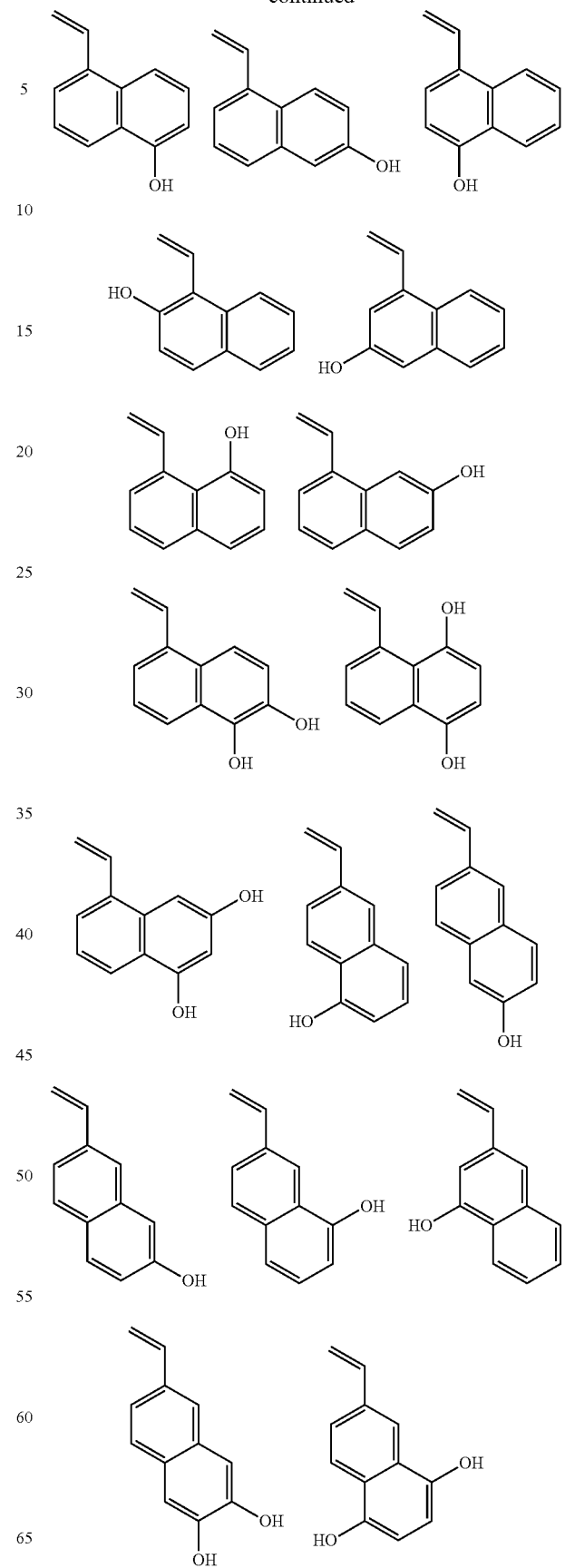

69
-continued
70
-continued
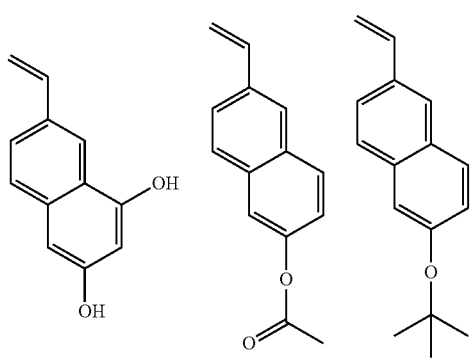
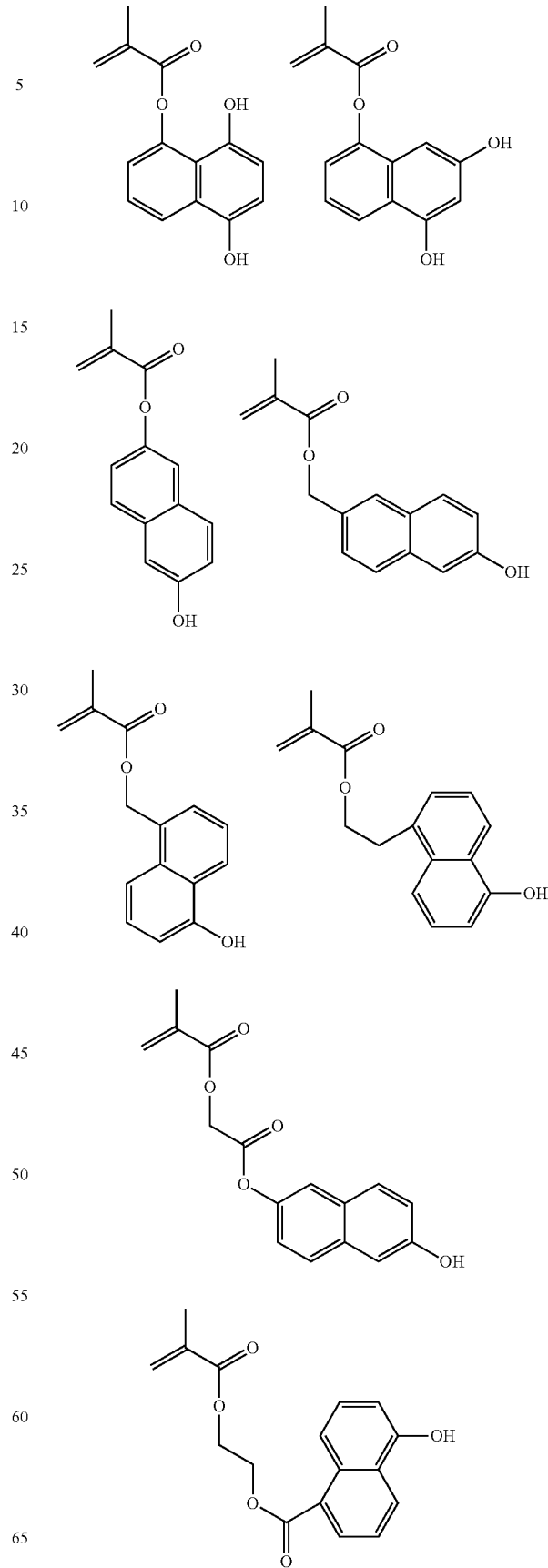

71
-continued
72
-continued
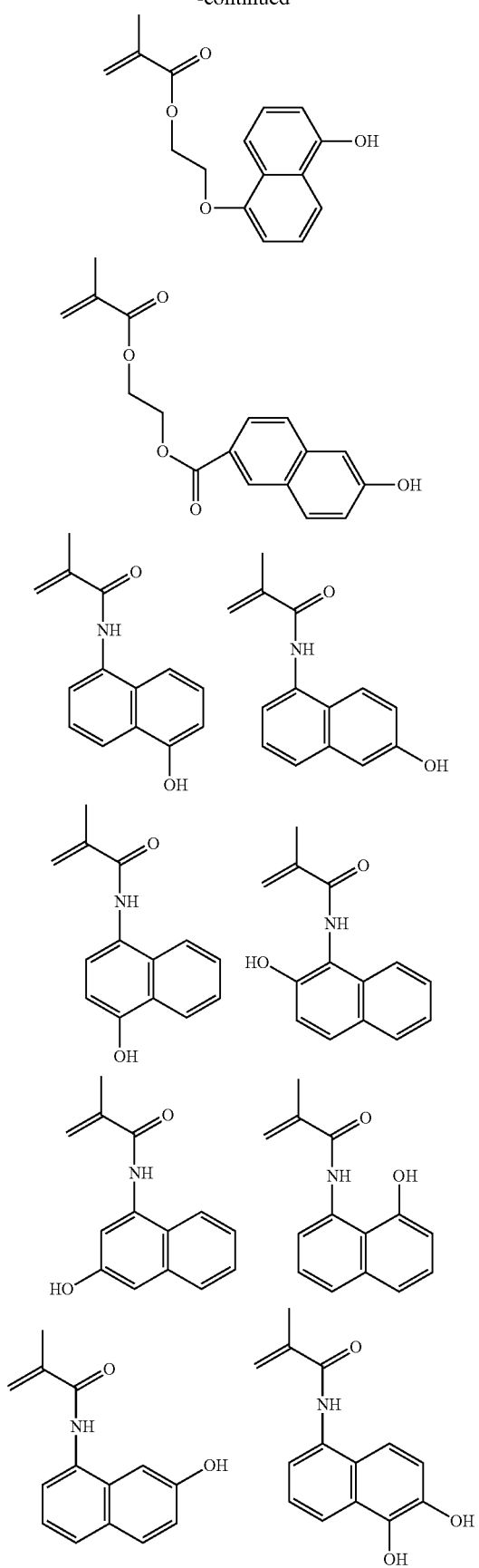

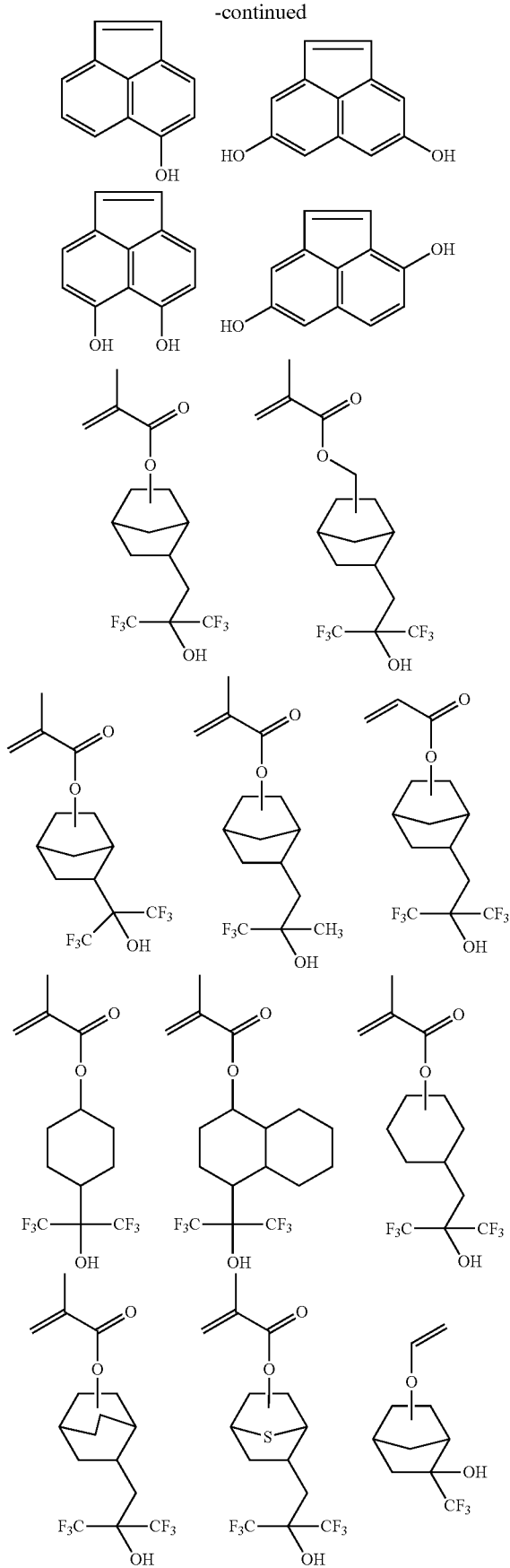
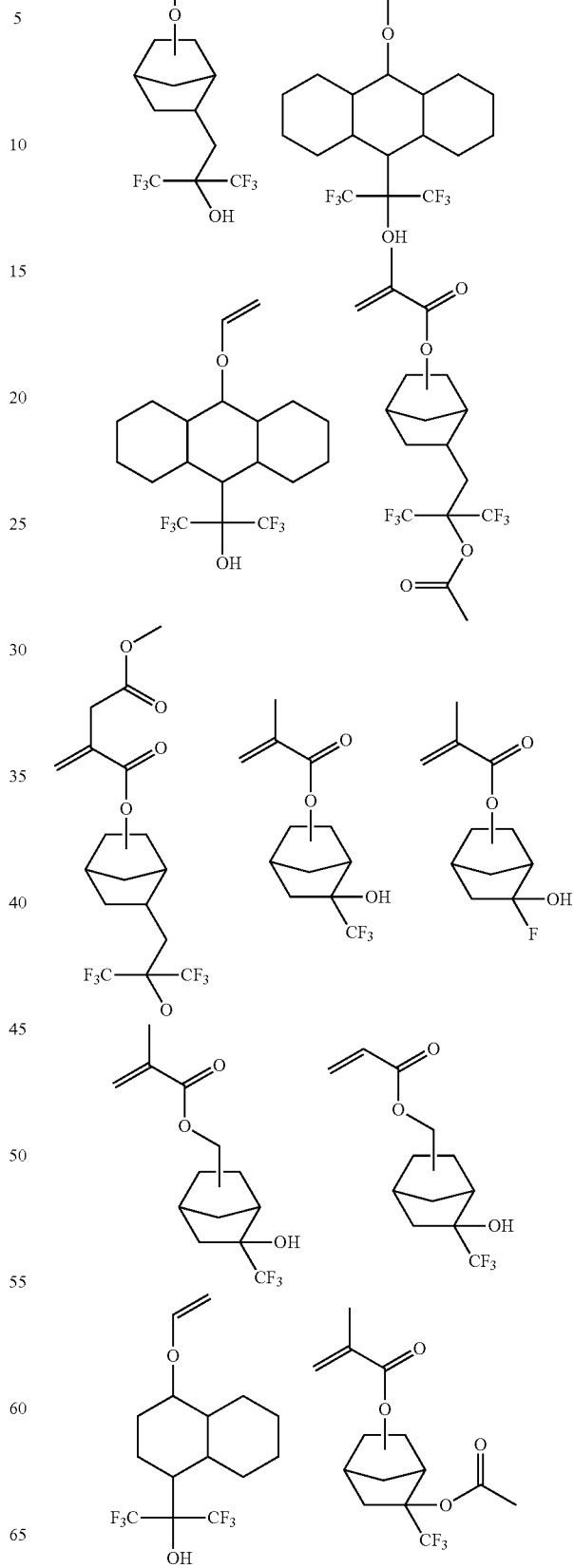

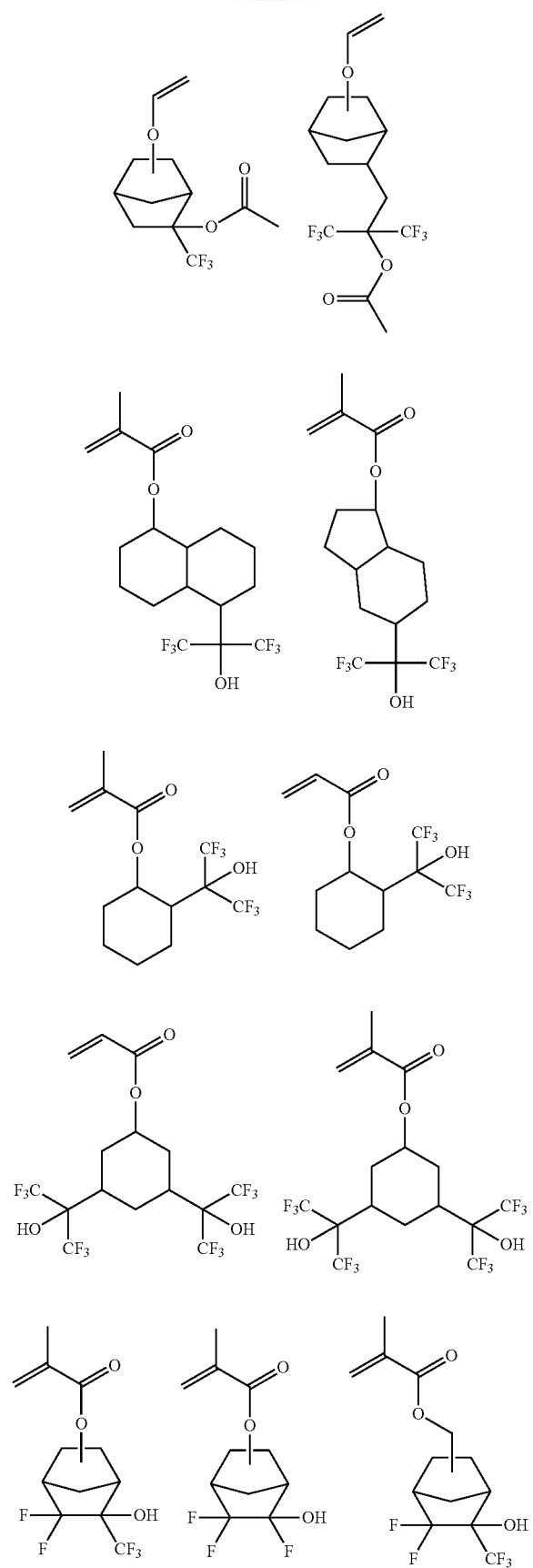
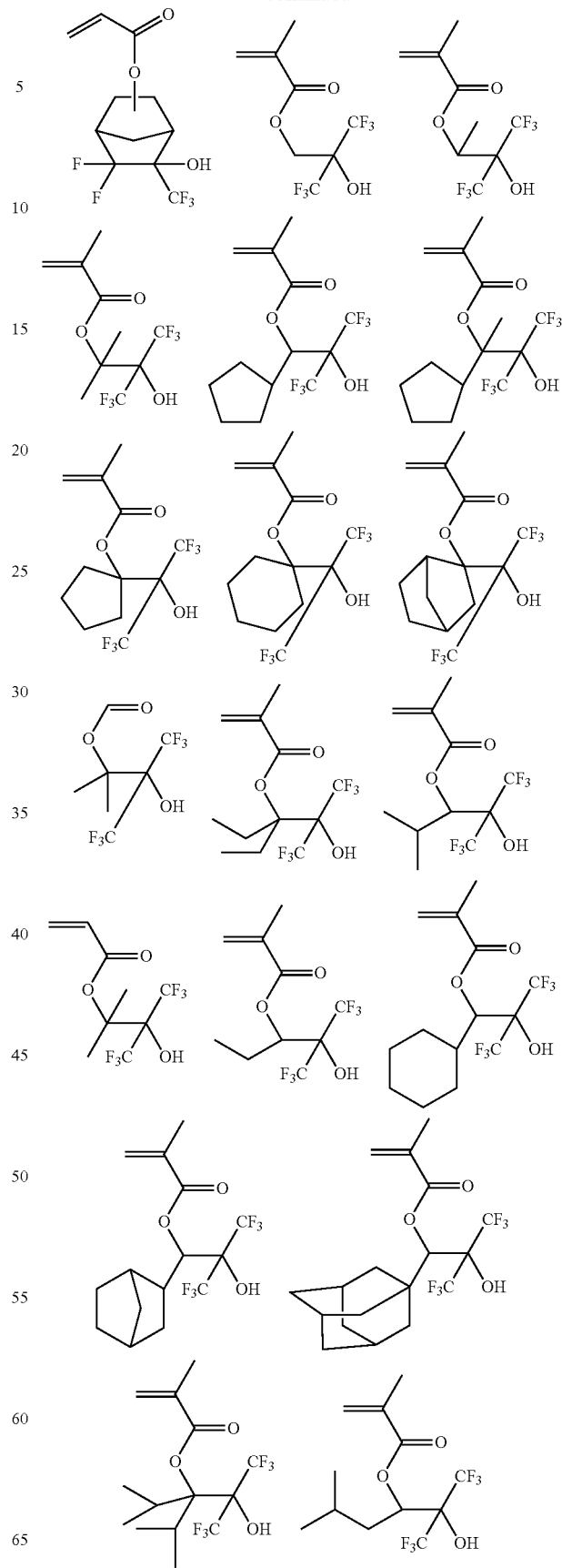

77
-continued
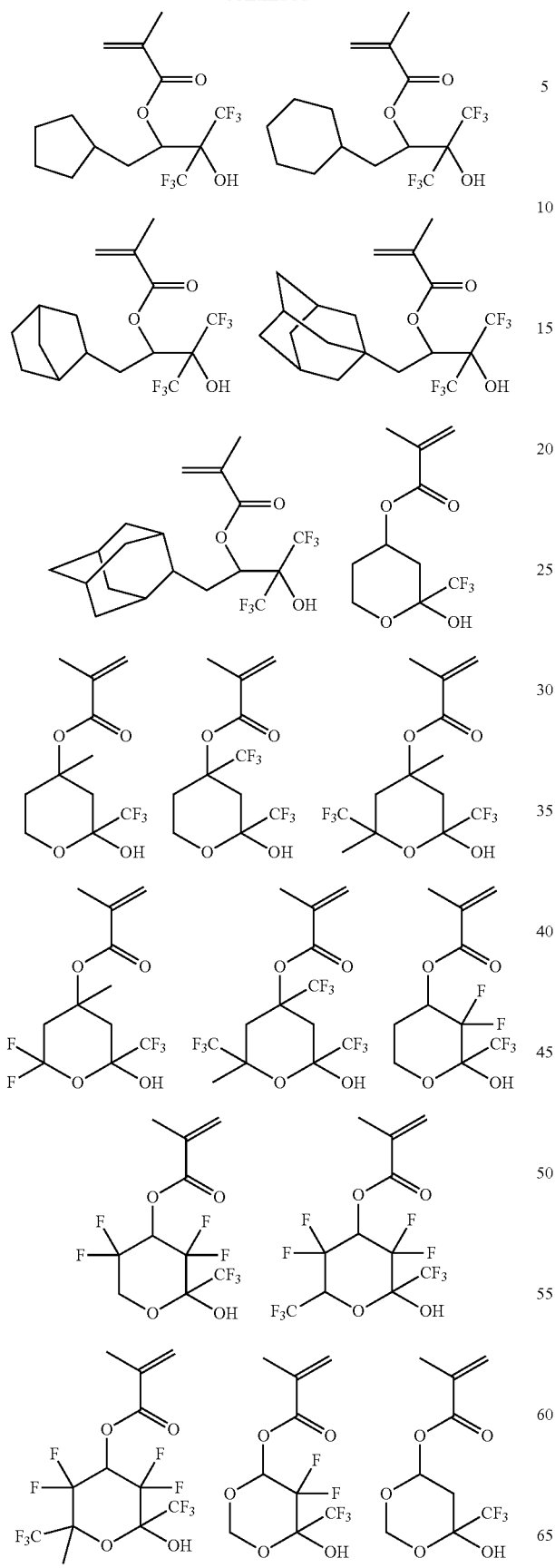
78
-continued
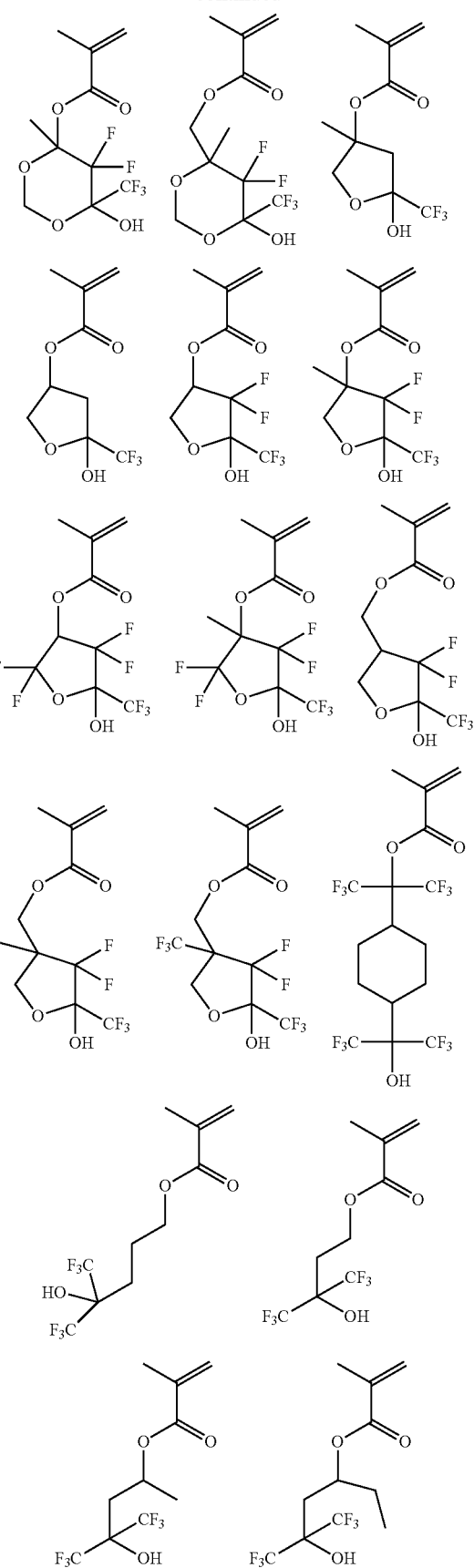

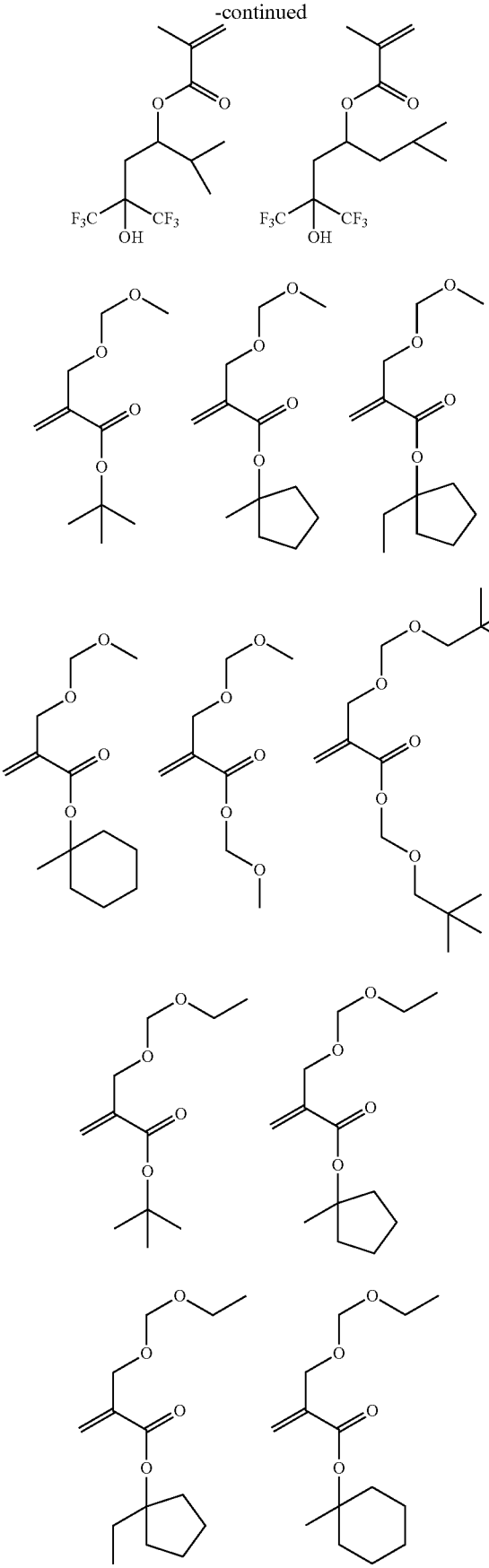
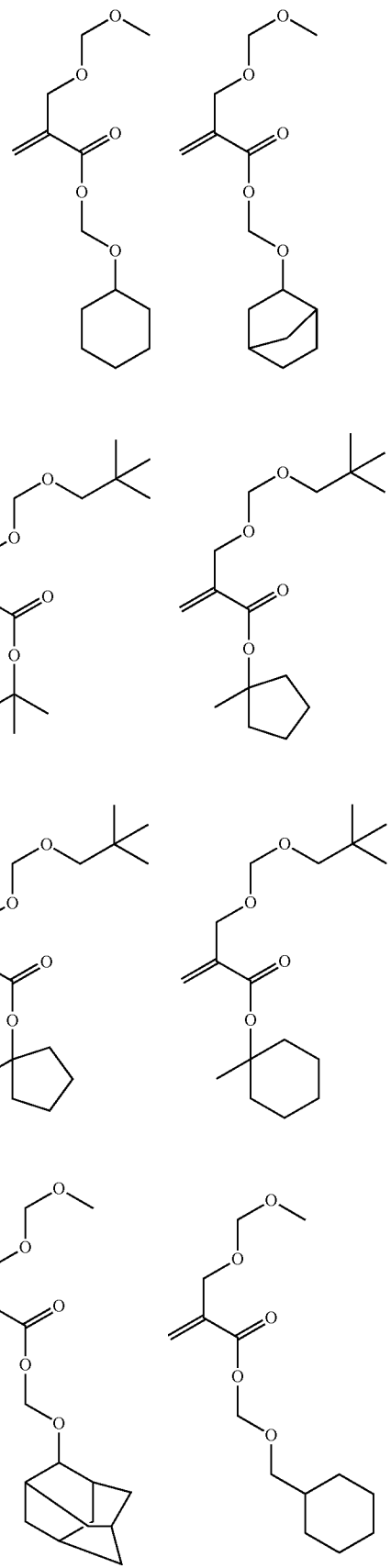

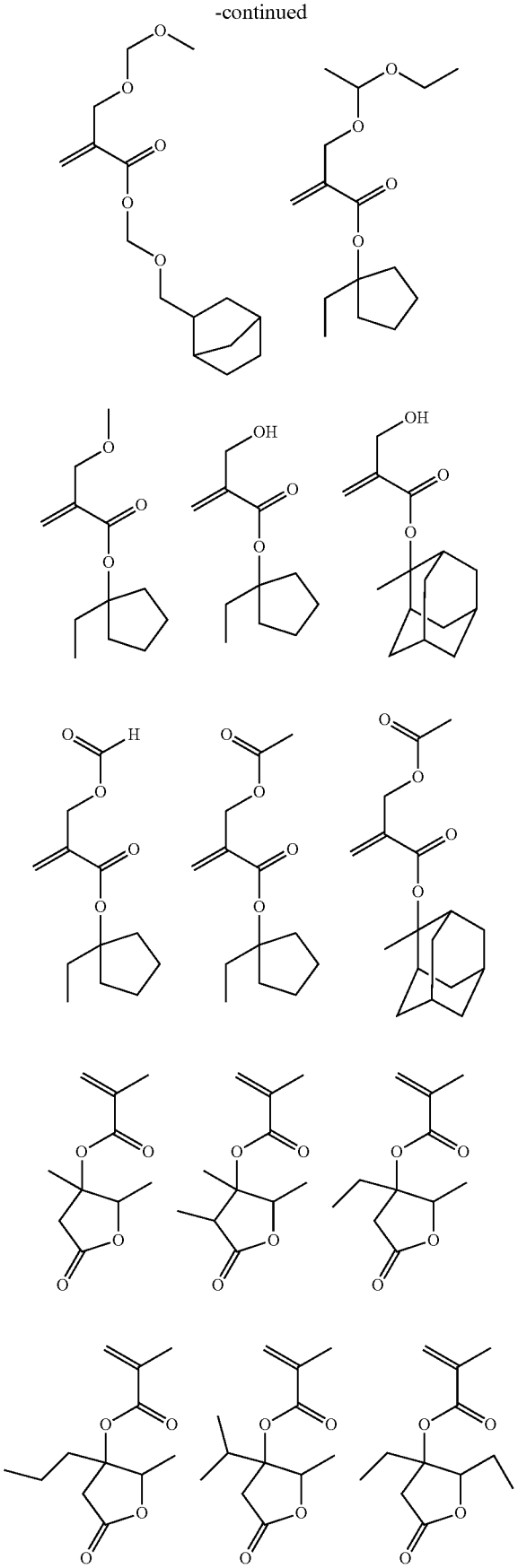
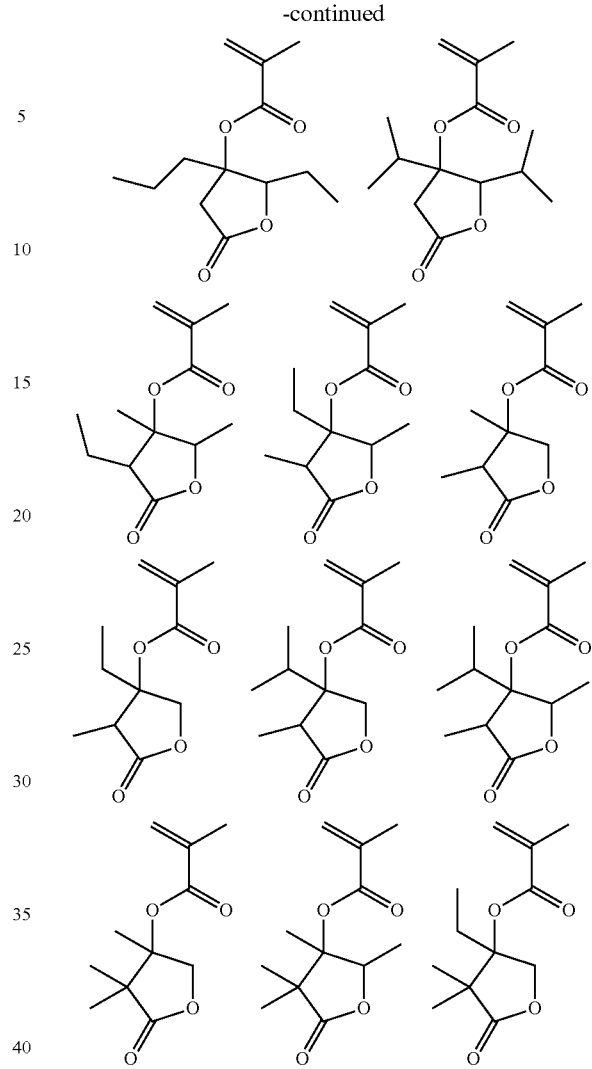
Also preferably, the polymer may have further copolymerized therein recurring units of at least one type selected from sulfonium salt units (e1) to (e3), as represented by the following general formula.
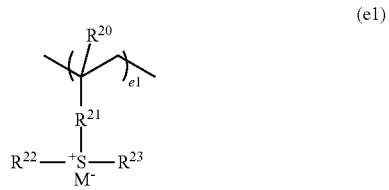
(e1)
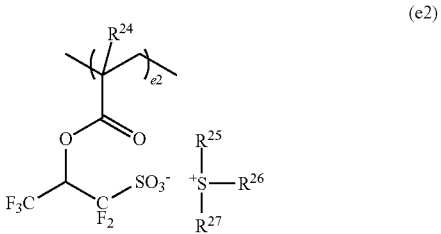
(e2)

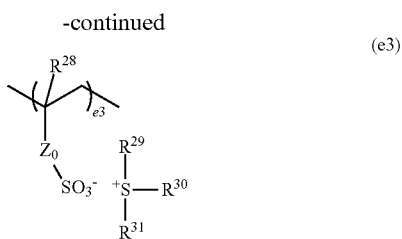

(e3)

Herein $R^{20}$, $R^{24}$, and $R^{28}$ each are hydrogen or methyl. $R^{21}$ is a single bond, phenylene, —O—$R^{33}$—, or —C(=O)—Y—$R^{33}$—, wherein Y is oxygen or NH, and $R^{33}$ is a straight, branched or cyclic $C_1$-$C_6$ alkylene group, alkenylene group or phenylene group, which may contain a carbonyl (—CO—), ester (—COO—), ether (—O—), or hydroxyl moiety. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $Z_0$ is a single bond, methylene, ethylene, phenylene, fluorinated phenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene, alkenylene or phenylene group, which may contain a carbonyl, ester, ether or hydroxyl moiety. $M^-$ is a non-nucleophilic counter ion.

Besides the recurring units described above, the polymer may have further copolymerized therein additional recurring units, for example, recurring units (f) having a non-leaving hydrocarbon group as described in JP-A 2008-281980. Examples of the non-leaving hydrocarbon group other than those described in JP-A 2008-281980 include indene, acenaphthylene, and norbornadiene derivatives. Copolymerization of recurring units (f) having a non-leaving hydrocarbon group is effective for improving the dissolution of the polymer in organic solvent developer.

In the polymer for the resist composition, recurring units (a), (b), (c), (d), (e1), (e2), (e3) and (f) are preferably incorporated in the following molar fraction:
0<a<1.0, 0≤b<1.0, 0≤c<1.0, 0<b+c<1.0, 0≤d≤0.9, 0≤e1≤0.4, 0≤e2≤0.4, 0≤e3≤0.4, 0≤e1+e2+e3≤0.4, 0≤f≤0.6;
more preferably 0.1≤a≤0.9, 0≤b≤0.9, 0≤c≤0.9, 0<b+c≤0.9, 0≤d≤0.9, 0≤e1≤0.3, 0≤e2≤0.3, 0≤e3≤0.3, 0≤e1+e2+e3≤0.3, 0≤f≤0.5,
provided that a+b+c+d+e1+e2+e3+f=1.

The meaning of a+b=1, for example, is that in a polymer comprising recurring units (a) and (b), the sum of recurring units (a) and (b) is 100 mol % based on the total amount of entire recurring units. The meaning of a+b<1 is that the sum of recurring units (a) and (b) is less than 100 mol % based on the total amount of entire recurring units, indicating the inclusion of other recurring units, for example, units (c).

The polymer serving as the base resin in the resist composition should desirably have a weight average molecular weight (Mw) in the range of 1,000 to 500,000, and more desirably 2,000 to 30,000, as measured by GPC versus polystyrene standards. With too low a Mw, the resist composition after development may have a low efficiency of heat crosslinking. A polymer with too high a Mw may have a low solubility in organic solvent developer, giving rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

A blend of two or more polymers which differ in compositional ratio, molecular weight or dispersity is acceptable.

The polymer may be synthesized by any desired methods, for example, by dissolving suitable unsaturated bond-bearing monomers corresponding to recurring units (a) to (f) in an organic solvent, adding a radical initiator thereto, and effecting heat polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and thereafter the polymer be protected or partially protected.

The resist composition used in the pattern forming process may further comprise a first organic solvent, a compound capable of generating an acid in response to high-energy radiation (i.e., acid generator), and optionally a dissolution regulator, basic compound, surfactant and other components. In the embodiment wherein a polymer comprising recurring units (e1) to (e3) of acid generator is used as the base resin, the acid generator need not be separately added.

The first organic solvent used in the resist composition, especially chemically amplified resist composition is not particularly limited as long as the base resin, acid generator and other additives are soluble therein. Exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, ethylene glycol monopropyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture of two or more. Of these, diethylene glycol dimethyl ether, 1-ethoxy-2-propanol, PGMEA and mixtures thereof are preferred because the acid generator is most soluble therein.

The organic solvent is preferably used in an amount of 200 to 3,000 parts, more preferably 400 to 2,000 parts by weight per 100 parts by weight of the base resin.

The resist composition used herein may include an acid generator in order for the composition to function as a chemically amplified resist composition. Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

The PAG is preferably compounded in an amount of 0.1 to 50 parts and more preferably 0.5 to 40 parts by weight per 100 parts by weight of the base resin. Less than 0.1 part of PAG may generate, upon exposure, an insufficient amount of acid to provide sensitivity and resolution. More than 50 parts of PAG may reduce the transmittance of a resist film, detracting from resolution. Where the polymer has acid generator units (e1) to (e3) copolymerized therein, the acid generator is not essential.

To the resist composition, a basic compound, typically amine may be added as quencher. The basic compound serves to improve contrast by trapping the acid generated by the acid generator to control acid diffusion. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146] to [0164], and compounds having a carbamate group, as described in JP 3790649. Onium salts such as sulfonium salts, iodonium salts and ammonium salts of sulfonic acids which are not fluorinated at α-position as described in JP-A 2008-158339 (US 20080153030) and similar onium salts of carboxylic acids as described in JP 3991462 may also be used as the quencher.

Although onium salts of sulfonic acids which are not fluorinated at α-position and onium salts of carboxylic acids lack basicity, they function as a quencher by salt exchange with a super strong acid fluorinated at α-position to neutralize the α-position fluorinated sulfonic acid.

The basic compound or quencher is preferably compounded in an amount of 0.001 to 15 parts and more preferably 0.01 to 10 parts by weight per 100 parts by weight of the base resin. Less than 0.001 part of the basic compound may achieve no addition effect whereas more than 15 parts may result in too low a sensitivity.

Also useful are quenchers of polymer type as described in JP-A 2008-239918. The polymeric quencher segregates at the resist surface after coating and thus enhances the rectangularity of resist pattern. The polymeric quencher is effective for reducing top bulging or bridging in the case of negative resist film.

Also a polymeric additive may be added for improving the water repellency on surface of a resist film as spin coated. This additive may be used in the topcoatless immersion lithography. The additive has a specific structure with a 1,1,1,3,3,3-hexafluoro-2-propanol residue and is described in JP-A 2007-297590 and JP-A 2008-111103. The water repellency improver to be added to the resist should be soluble in the organic solvent developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin. To the resist composition, especially chemically amplified resist composition, a surfactant may be added for the purpose of facilitating coating operation. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. An appropriate amount of the surfactant is up to 2 parts, preferably up to 1 part by weight per 100 parts by weight of the base resin.

In the inventive process, the negative pattern formed using the resist composition defined above is coated with a solution containing at least one element selected from silicon, titanium, zirconium, hafnium, and aluminum in a second organic solvent as the reversal film-forming solution, followed by prebake and dry etching. Among the reversal film-forming solutions, preferred silicon-containing solutions are solutions containing polymers obtained from hydrolytic condensation of silicon-containing monomers as described in JP-A 2007-65161, paragraphs [0052] to [0062] and JP-A 2007-163846, paragraphs [0059] to [0079]. Condensed forms of trifunctional silane compounds include ladder structure silsesquioxane and cage structure POSS (polyhedral oligomeric silsesquioxane). The silsesquioxane has superior solvent solubility and inferior burying properties whereas the POSS has superior burying properties and inferior solvent solubility. Co-condensation of a difunctional silane is effective for improving burying properties. However, linear siloxanes resulting from condensation of solely difunctional silane compounds are oily and suffer from the problem that the pattern can be deformed during dry etching for image reversal. A good balance of burying properties and etch resistance is obtainable by combining di- and trifunctional silane compounds.

Preferred titanium-containing solutions are solutions containing hydrolytic condensates of titanium alkoxides, titanium halides, titanium aminates and the like as described in JP-A 2007-163846, paragraph [0080]. Preferred zirconium, hafnium and aluminum-containing solutions are solutions containing hydrolytic condensates of monomers obtained by substituting zirconium, hafnium and aluminum for titanium of the foregoing titanium-containing monomers. JP-A H11-258813 discloses the condensation of titanium which is also applicable herein.

Also included are complexes of zirconium, hafnium and aluminum-containing polymers with β-diketones as described in JP-A 2006-508377 (WO 2004/001806). Further β-diketones are applicable to titanium condensates as described in JP-A H11-258813.

Other silicon-containing solutions serving as the reversal film-forming solution include those containing copolymers of vinyl silane compounds as described in JP-A 2002-348332 and JP-A 2004-352743, and (meth)acrylates with pendant silicon-containing group as described in JP-A 2005-221714, paragraphs [0066]-[0086].

Specifically, solutions containing reversal polymers comprising recurring units as shown below are preferred. As used herein, the term "reversal polymer" refers to a reversal film-forming polymer.

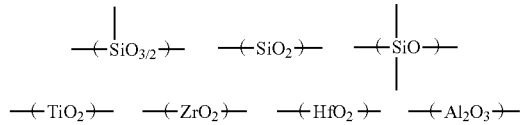

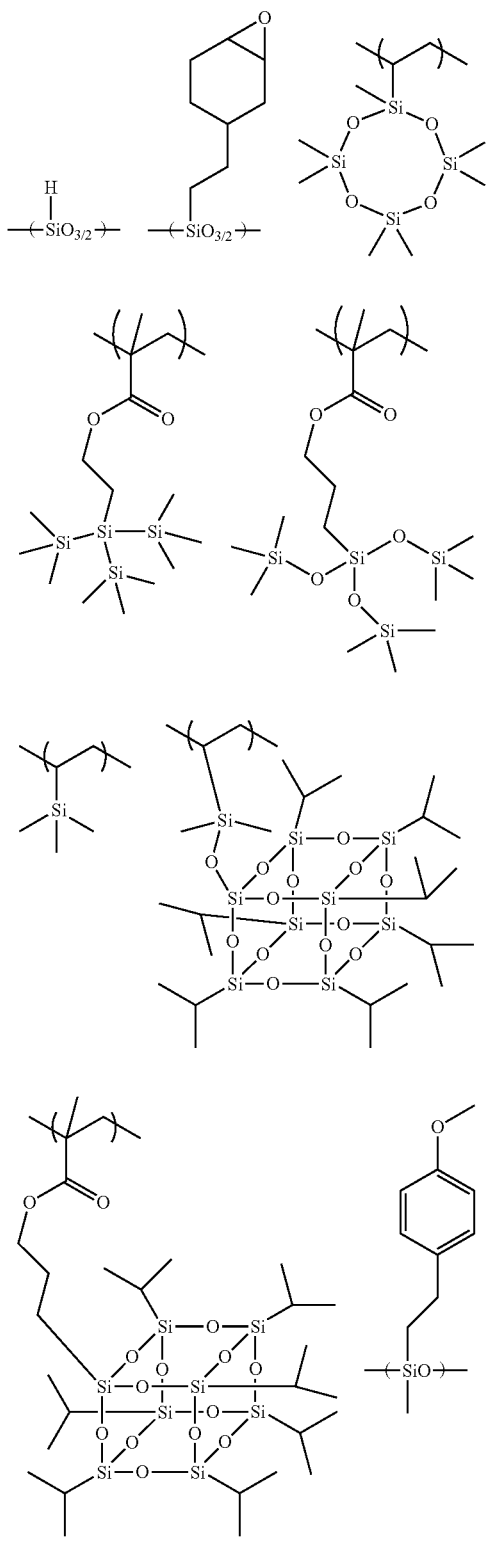
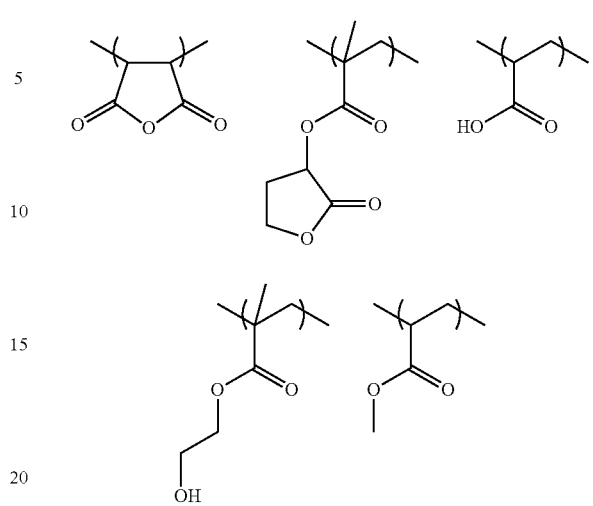

The above-illustrated recurring units should preferably account for 10 to 100 mol %, more preferably 50 to 100 mol % of a polymer. Beside the above-illustrated recurring units, the reversal polymers may further comprise recurring units as shown below.

Also preferably, the reversal polymer has a weight average molecular weight (Mw) of 1,000 to 200,000, more preferably 1,500 to 100,000, as measured by GPC versus polystyrene standards. Its dispersity (Mw/Mn) is preferably in the range of 1.0 to 6.0, more preferably 1.2 to 5.0.

The total content of silicon, titanium, zirconium, hafnium and aluminum in the film for use in image reversal should preferably at least 10%, more preferably at least 15%, and even more preferably at least 20% by weight. A film having a total content of silicon, titanium, zirconium, hafnium and aluminum in the film below the limit may have insufficient dry etch resistance to ensure image reversal.

The second organic solvent in which the silicon, titanium, zirconium, hafnium or aluminum-containing condensate or polymer is dissolved to form the reversal film-forming solution is preferably a solvent which does not dissolve the resist pattern after high-temperature bake (i.e., crosslinked negative resist pattern depicted at 30b in FIG. 1D). Preferred examples of the second organic solvent include propylene glycol monomethyl ether acetate (PGMEA), cyclohexanone, cyclopentanone, ethyl lactate, propylene glycol monomethyl ether, propylene glycol monoethyl ether, propylene glycol monopropyl ether, heptanone, and γ-butyrolactone, which may be used alone or in admixture.

In a preferred embodiment, the negative pattern as post-development heated (or baked) experiences a film thickness loss of up to 10 nm when it is kept in contact with the second organic solvent for 30 seconds. The film thickness loss is more preferably up to 5 nm, and even more preferably up to 2 nm. The step of heating the negative pattern after development will be described later. The restricted thickness loss of the resist film in the second organic solvent is achievable as long as a polymer comprising recurring units having 7-oxanorbornane ring is used as base resin in the resist composition.

It is noted that to the aforementioned second organic solvent, a protonic solvent may be added in a proportion of up to 20% by weight, for example, water, methanol, ethanol, isopropyl alcohol, ethylene glycol, diethylene glycol and propylene glycol.

Additives may be added to the reversal film-forming solution containing silicon, titanium, zirconium, hafnium or aluminum. For example, thermal acid generators as described in JP-A 2007-199653, paragraphs [0060] to [0085], JP-A 2007-304490, JP-A 2008-039811, and JP-A 2008-039815 may be added. Crosslinkers as described in JP-A 2007-199653, paragraphs [0056] to [0060] may be added. On use of a combination of acid generator with crosslinker, crosslinking takes place in the reversal film after its formation so that the film may have enhanced dry etch resistance.

Also, acids as described in JP-A 2008-019423, paragraph [0115], β-diketones and β-keto-esters as described in JP-A H11-258813, paragraph [0021] may be added to the reversal film-forming solution for rendering the solution more stable. Surfactants as commonly used in resist materials may be added for improving coating uniformity, suppressing microbubbles formation, and improving burying (or embedment) capability.

Also low-molecular-weight compounds containing silicon, titanium, zirconium, hafnium or aluminum may be added to the reversal film-forming solution. Such compounds are exemplified below while they may be added in an amount of 0 to 50 parts by weight.

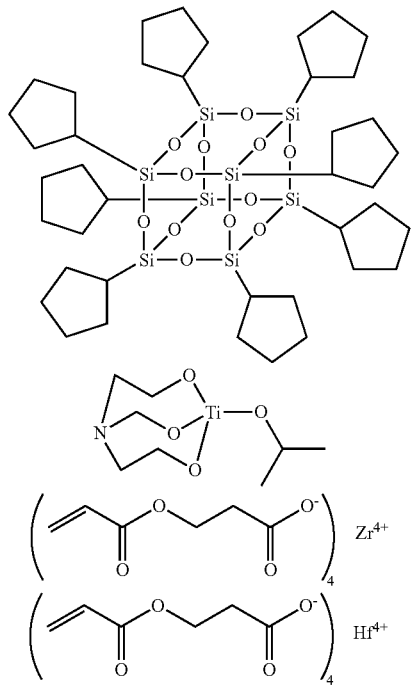

Inclusion of low-molecular-weight compounds containing silicon, titanium, zirconium, hafnium or aluminum is effective for improving burying capability and adds to the content of silicon, titanium, zirconium, hafnium or aluminum for thereby enhancing etch resistance. Suitable low-molecular-weight silicon compounds include cyclic and chain-like siloxane compounds, POSS compounds, and silphenylene compounds. Suitable low-molecular-weight compounds containing titanium, zirconium, hafnium or aluminum include carboxylic acid salt compounds, sulfonic acid salt compounds, amine complexes, β-diketone complexes and alkoxy compounds of these metals.

Process

Now referring to the drawings, the pattern forming process of the invention is illustrated in FIGS. 1 and 2. The resist composition is coated on a substrate to form a resist film thereon. Specifically, a resist film 30 of the resist composition is formed on a processable substrate 20 disposed on a substrate 10 directly or via an intermediate intervening layer as shown in FIG. 1A. The resist film 30 preferably has a thickness of 10 to 1,000 nm and more preferably 20 to 500 nm. Prior to exposure, the resist film 30 is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer (not shown) includes hard masks of $SiO_2$, SiN, SiON or p-Si, an undercoat in the form of carbon film, a silicon-containing intermediate film, and an organic antireflective coating. Preferred is a trilayer film structure consisting of a processable substrate (e.g., $SiO_2$, SiN, SiON, SiOC, p-Si, α-Si, TiN, WSi, BPSG, SOG, Cr, CrO, CrON, MoSi, low dielectric film, and etch stopper film), a carbon film on the substrate, and an antireflective film on the carbon film. The carbon film may be an amorphous carbon film deposited by CVD or a carbon film deposited by spin coating. The amorphous carbon film has higher etch resistance whereas the spin-on carbon film is better in flatness after deposition. The spin-on carbon film has the advantage of low process cost because it can be spin coated without a need for expensive CVD setup.

Next comes exposure depicted by arrows in FIG. 1B. For the exposure, preference is given to high-energy radiation having a wavelength of 140 to 250 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light from a projection lens while pure water or suitable liquid is introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a composition comprising a polymer having 1,1,1,3,3,3-hexafluoro-2-propanol residues and a solvent selected from alcohols of at least 4 carbon atoms, ethers of 8 to 12 carbon atoms, and mixtures thereof.

In the protective film-forming composition, an amine compound may be compounded. The amine compound may be selected from the compounds enumerated as the basic compound to be added to the resist composition. An appropriate amount of the amine compound added is 0.01 to 10 parts, preferably 0.02 to 8 parts by weight per 100 parts by weight of the base resin for the protective film. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. Deposition of an amine-containing protective film is effective for preventing top bulging of negative resist film.

Exposure is preferably performed in an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Thereafter the exposed resist film is developed in an organic solvent developer for 0.1 to 3 minutes, preferably 0.5 to 2 minutes by any conventional techniques such as dip, puddle and spray techniques. In this way, a negative resist pattern 30a is formed on the substrate 20 as shown in FIG. 1C.

Preferably the organic solvent used as developer is at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

At the end of development, the resist film may be rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, tert-butylbenzene, and mesitylene. The solvents may be used alone or in admixture.

After the rinse liquid is applied, the substrate may be spin dried and heat dried. However, rinsing is not essential. As long as the step of spin drying the substrate after the developer is applied thereto is included, the rinsing step may be omitted.

Next, a crosslinked negative pattern 30b is formed, as shown in FIG. 1D, by crosslinking the polymer in the pattern. Heat is necessary for crosslinking. Appropriate bake conditions to ensure crosslinking include a temperature of 130 to 300° C., especially 140 to 250° C. and a time of 3 to 500 seconds, especially 5 to 300 seconds.

Next, as shown in FIG. 2E, the reversal film-forming solution containing silicon, titanium, zirconium, hafnium and/or aluminum and the second organic solvent is coated until it covers or overlies the crosslinked negative pattern 30b, forming a reversal film 40. While the thickness of the reversal film 40 varies over a wide range, a reversal film which is thinner than the resist film is advantageous because the depth of etching back is reduced. After the solution of silicon, titanium, zirconium, hafnium and/or aluminum in the second organic solvent is coated, the substrate is baked for evaporating off the solvent. Appropriate bake conditions for drying include a temperature of 50 to 250° C. and a time of 3 to 300 seconds. While bake temperatures below 150° C. are sufficient simply for evaporating off the solvent, higher bake temperatures are effective for causing crosslinking of the reversal film for thereby consolidating the film to enhance its dry etch resistance.

Thereafter, the surface of the film 40 containing silicon, titanium, zirconium, hafnium and/or aluminum is etched back, i.e., abraded off by etching, as shown in FIG. 2F. The etching back step may be dry etching with fluorocarbon gases, chlorine based gases, or bromine based gases, and continued until the crosslinked negative resist pattern 30b is exposed on the surface. The etching back step may also be chemical mechanical polishing (CMP) instead of dry etching. The negative resist pattern 30b is removed to achieve image reversal of converting the negative pattern to a positive pattern as shown in FIG. 2G.

Finally, the underlying layer or carbon film is etched with oxygen gas, hydrogen gas or ammonia gas. With the remaining carbon film made mask, the processable substrate 20 is dry etched as shown in FIG. 2H, completing image reversal.

Figure 4:
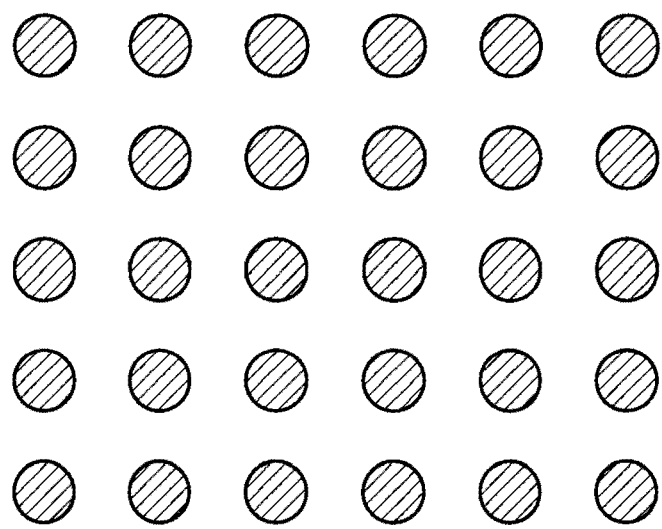
FIG. 4 is a plan view showing one exemplary dot pattern formed via image reversal.

If a hole pattern as shown in FIG. 3 is formed by negative development, then a dot pattern as shown in FIG. 4 can be formed by image reversal according to the invention. If a hole pattern having a small size is formed by over-exposure and then reversed according to the invention, then a dot pattern having a small size and a high aspect ratio can be formed. While another approach for forming a dot pattern having a small size via over-exposure may be by forming a dot pattern via alkaline development of a positive resist, the dot pattern tends to collapse under the stresses of spin drying of the rinse liquid after development. The gist of the invention resides in that pattern collapse is avoidable if a hole pattern which is free of a collapse risk is formed by development and reversed into a dot pattern by dry etching. If a trench pattern is formed by negative development, then a line pattern can be formed by image reversal.

With respect to the illumination in the exposure tool used for hole pattern formation, reference may be made to JP-A 2010-186060.

EXAMPLE

Examples of the invention are given below by way of illustration and not by way of limitation. For all polymers, Mw and Mn are determined by GPC versus polystyrene standards.

Preparation of Resist Material

A resist composition in solution form was prepared by dissolving a polymer (Resist Polymer) and components in a solvent according to the formulation shown in Table 1, and filtering through a filter with a pore size of 0.2 μm. The components used are identified below.

Acid generator: PAG1 of the following structural formula
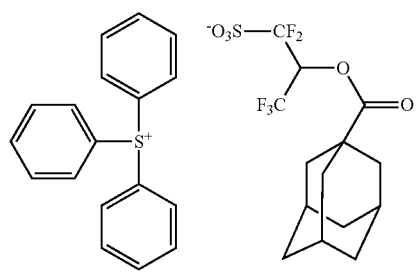
PAG 1
Resist Polymer 1
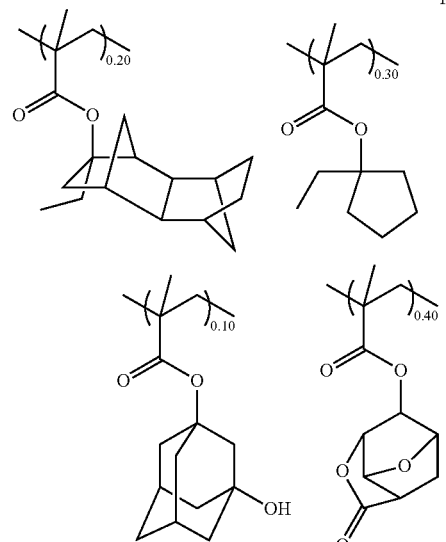
Mw = 8,300
Mw/Mn = 1.76
Resist Polymer 2
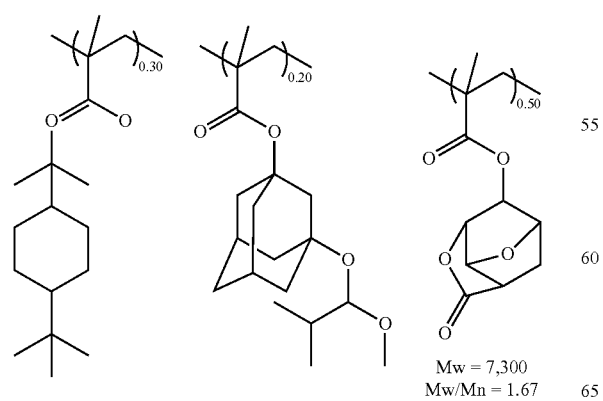
Mw = 7,300
Mw/Mn = 1.67
Resist Polymer 3
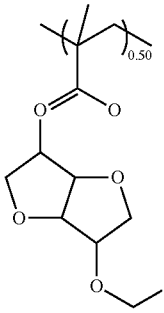 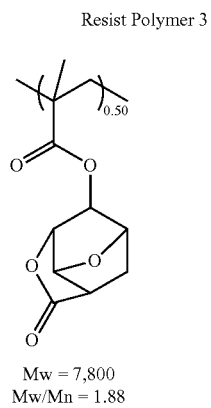
Mw = 7,800
Mw/Mn = 1.88
Resist Polymer 4
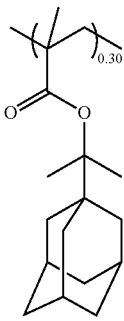 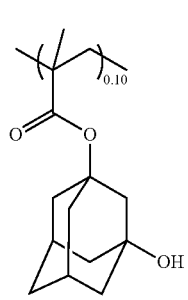 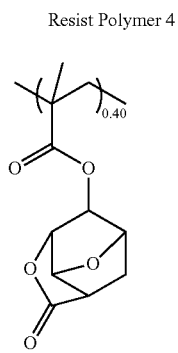
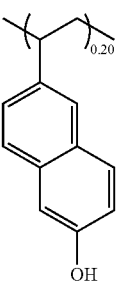
Mw = 7,200
Mw/Mn = 1.82
Resist Polymer 5
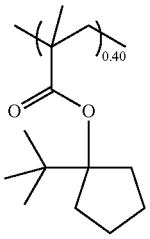 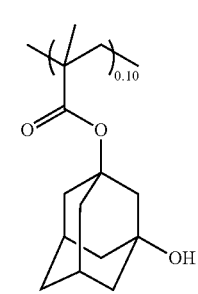 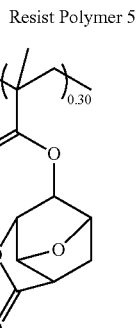

Resist Polymer 8
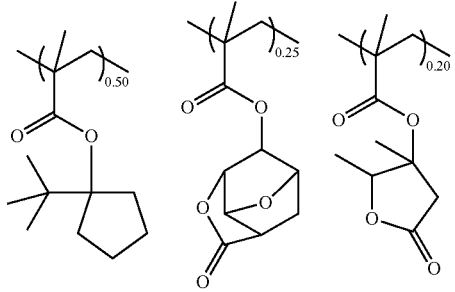
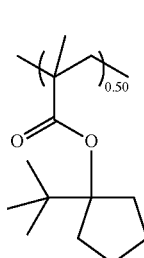
Mw = 8,500
Mw/Mn = 1.69
Comparative Resist Polymer 1
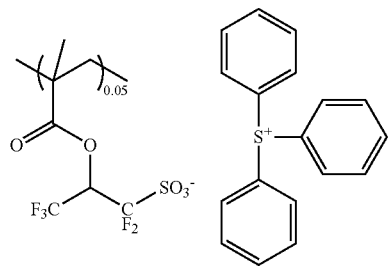
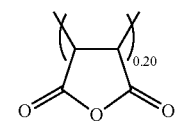
Mw = 8,600
Mw/Mn = 1.76
-continued
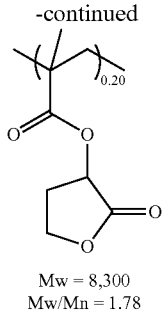
Mw = 8,300
Mw/Mn = 1.78
Resist Polymer 6
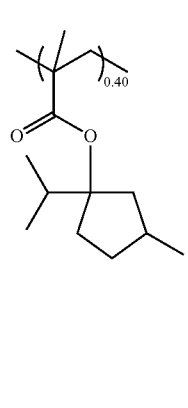
Mw = 8,900
Mw/Mn = 1.88
Resist Polymer 7
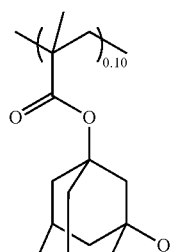 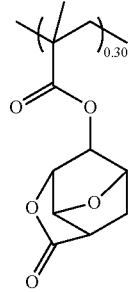 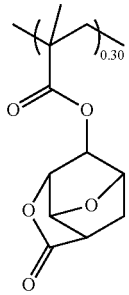
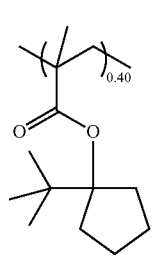 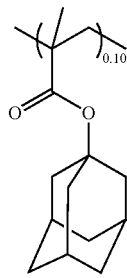 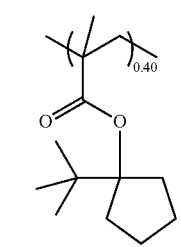 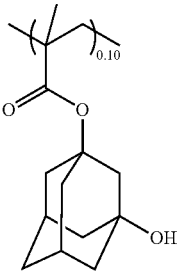
Mw = 9,100
Mw/Mn = 1.83

-continued

Basic compound: Quencher 1, Quencher 2, polymeric Quencher 3 of the following structural formulae Quencher 1

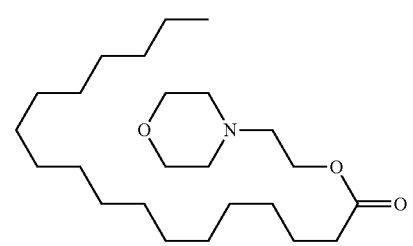

Quencher 2

Quencher 3

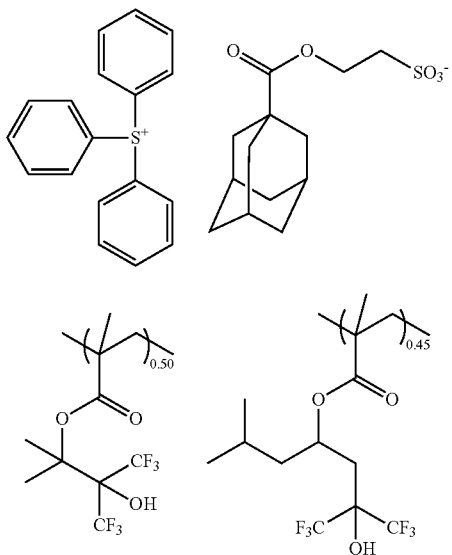

-continued

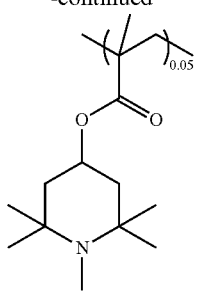

Water-repellent polymer 1 of the following structural formula

Water-repellent polymer 1

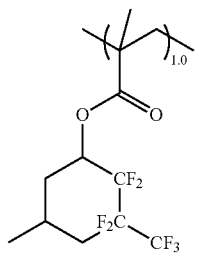

Organic solvent:
PGMEA (propylene glycol monomethyl ether acetate)
CyH (cyclohexanone)
GBL (gamma-butyrolactone)
PGEE (propylene glycol monoethyl ether)
PGPE (propylene glycol monopropyl ether)

TABLE 1

|  | Polymer (pbw) | Acid generator (pbw) | Basic compound (pbw) | Water-repellent polymer (pbw) | Organic solvent (pbw) |
|---|---|---|---|---|---|
| Resist 1 | Resist Polymer 1 (100) | PAG1 (10.0) | Quencher1 (2.20) | Water-repellent polymer 1 (4.0) | PGMEA(2,500) |
| Resist 2 | Resist Polymer 2 (100) | PAG1 (10.0) | Quencher1 (2.20) | Water-repellent polymer 1 (4.0) | PGMEA(2,500) |
| Resist 3 | Resist Polymer 3 (100) | PAG1 (10.0) | Quencher1 (2.20) | Water-repellent polymer 1 (4.0) | PGMEA(2,000) GBL(500) |
| Resist 4 | Resist Polymer 4 (100) | PAG1 (8.0) | Quencher1 (2.00) | Water-repellent polymer 1 (4.0) | PGMEA(2,000) CyH(500) |
| Resist 5 | Resist Polymer 5 (100) | PAG1 (8.0) | Quencher1 (2.00) | Water-repellent polymer 1 (4.0) | PGMEA(2,000) CyH(500) |
| Resist 6 | Resist Polymer 6 (100) | PAG1 (8.0) | Quencher1 (2.00) | Water-repellent polymer 1 (4.0) | PGMEA(2,000) CyH(500) |
| Resist 7 | Resist Polymer 7 (100) | PAG1 (8.0) | Quencher1 (2.00) | Water-repellent polymer 1 (4.0) | PGMEA(2,000) CyH(500) |
| Resist 8 | Resist Polymer 8 (100) | — | Quencher2 (5.00) | Water-repellent polymer 1 (4.0) | PGMEA(2,000) GBL(500) |
| Resist 9 | Resist Polymer 1 (100) | PAG1 (5.0) | Quencher2 (6.00) Quencher3 (3.0) | Water-repellent polymer 1 (4.0) | PGMEA(2,500) |

TABLE 1-continued

| | Polymer (pbw) | Acid generator (pbw) | Basic compound (pbw) | Water-repellent polymer (pbw) | Organic solvent (pbw) |
|---|---|---|---|---|---|
| Comparative Resist 1 | Comparative Resist Polymer 1 (100) | PAG1 (10.0) | Quencher1 (2.20) | Water-repellent polymer 1 (4.0) | PGMEA(2,500) |

Preparation of Reversal Film-Forming Solution

A reversal film-forming solution was prepared by dissolving a reversal polymer and optional components in a solvent according to the formulation shown in Table 2, and filtering through a filter with a pore size of 0.2 μm. The components used are identified below.

Reversal polymer 1

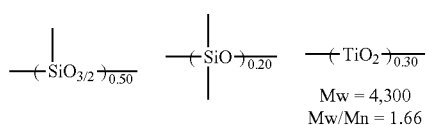

$Mw = 3,300$
$Mw/Mn = 1.59$

Reversal polymer 2

$Mw = 4,300$
$Mw/Mn = 1.66$

Reversal polymer 3

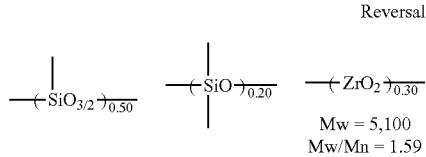

$Mw = 4,900$
$Mw/Mn = 1.81$

Reversal polymer 4

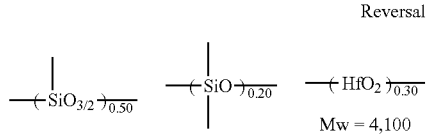

$Mw = 5,100$
$Mw/Mn = 1.59$

Reversal polymer 5

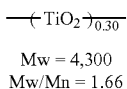

$Mw = 4,100$
$Mw/Mn = 1.59$

Reversal polymer 6

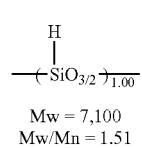

$Mw = 7,100$
$Mw/Mn = 1.51$

Reversal polymer 7

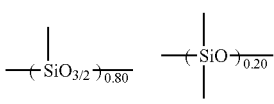

$Mw = 6,800$
$Mw/Mn = 1.91$

Reversal polymer 8

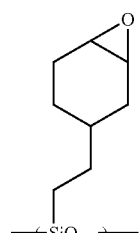

$Mw = 6,800$
$Mw/Mn = 1.54$

Reversal polymer 9

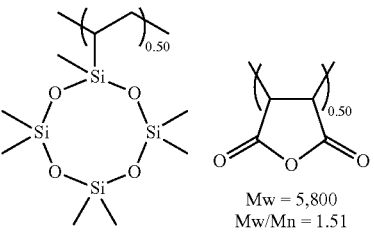

$Mw = 5,800$
$Mw/Mn = 1.51$

Reversal polymer 10

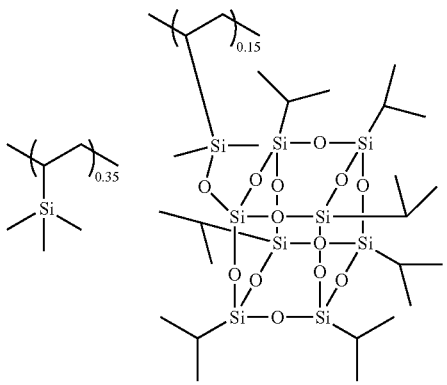

-continued
Reversal polymer 11
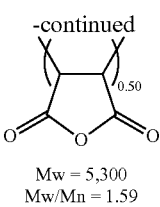
Mw = 5,300
Mw/Mn = 1.59
Reversal polymer 11
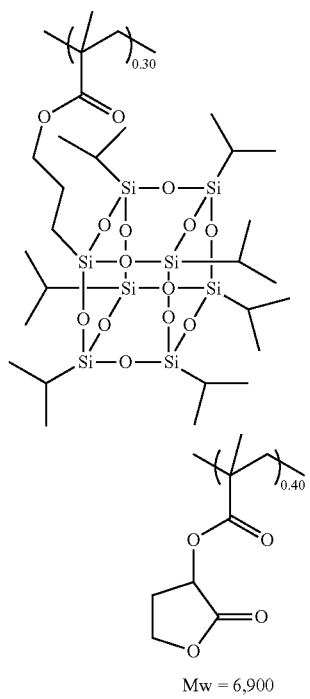
Mw = 6,900
Mw/Mn = 1.83
Reversal polymer 12
Reversal polymer 12
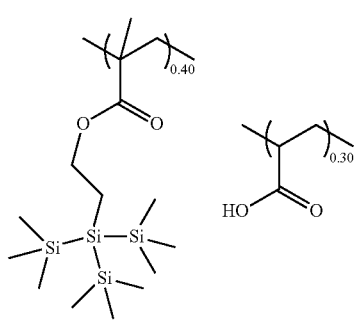
Mw = 6,500
Mw/Mn = 1.88
Reversal polymer 13
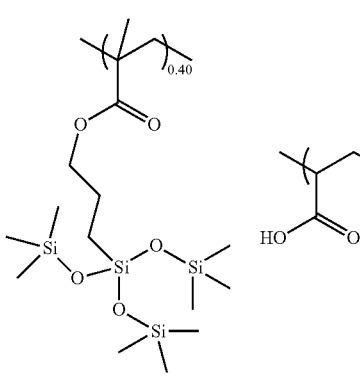
Mw = 7,500
Mw/Mn = 1.92
Reversal polymer 14
Reversal polymer 14
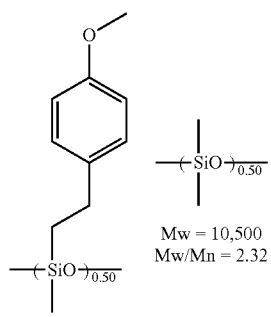
Mw = 10,500
Mw/Mn = 2.32
POSS 1
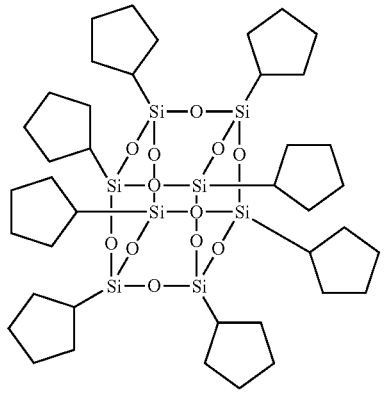
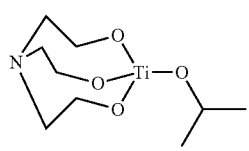
Titanium monomer 1
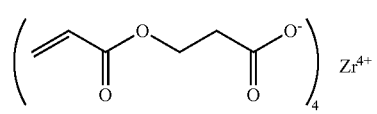
Zirconium monomer 1
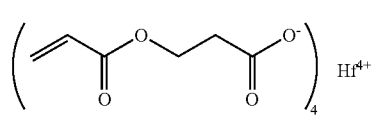
Hafnium monomer 1
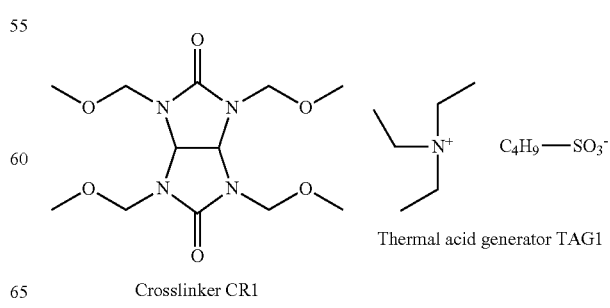
Crosslinker CR1
Thermal acid generator TAG1

TABLE 2

|  |  | Polymer (pbw) | Additive (pbw) | Organic solvent (pbw) |
|---|---|---|---|---|
| Reversal film | 1 | Reversal polymer 1 (100) | maleic acid(5) | PGEE(3,800) water(200) |
|  | 2 | Reversal polymer 2 (100) | acetylacetone(5) | PGMEA(4,000) |
|  | 3 | Reversal polymer 3 (100) | acetylacetone(5) | PGMEA(3,500) GBL(500) |
|  | 4 | Reversal polymer 4 (100) | acetylacetone(5) | PGMEA(3,000) CyH(500) |
|  | 5 | Reversal polymer 5 (100) | acetylacetone(5) | PGMEA(4,000) |
|  | 6 | Reversal polymer 6 (100) | — | PGMEA(2,000) PGEE(2,000) |
|  | 7 | Reversal polymer 7 (100) | — | PGMEA(2,000) PGPE(2,000) |
|  | 8 | Reversal polymer 8 (100) | — | PGMEA(3,000) |
|  | 9 | Reversal polymer 9 (100) | — | PGMEA(3,000) |
|  | 10 | Reversal polymer 10 (100) | POSS1(5) | PGMEA(3,000) |
|  | 11 | Reversal polymer 11 (100) | — | PGMEA(3,000) |
|  | 12 | Reversal polymer 12 (100) | — | PGMEA(3,000) |
|  | 13 | Reversal polymer 13 (100) | — | PGMEA(3,000) |
|  | 14 | Reversal polymer 10 (100) | Titanium monomer 1(5) | PGMEA(2,500) PGPE(500) |
|  | 15 | Reversal polymer 10 (100) | Zirconium monomer 1(5) | PGMEA(2,500) PGPE(500) |
|  | 16 | Reversal polymer 10 (100) | Hafnium monomer 1(5) | PGMEA(2,500) PGPE(500) |
|  | 17 | Reversal polymer 1 (100) | — | 2-heptanone(4,000) |
|  | 18 | Reversal polymer 14 (100) | TAG1(2.0) CR1(10) | PGMEA(3,000) |

Examples and Comparative Examples

Measurement of Solvent Solubility of Resist Film after High-Temperature Bake

The resist composition of the formulation shown in Table 1 was spin coated on an antireflective coating (ARC-29A, Nissan Chemical Industries, Ltd., 90 nm) on a silicon wafer and baked on a hot plate at 100° C. for 60 seconds to form a resist film of 100 nm thick. Using an ArF excimer laser scanner NSR-305B (Nikon Corp., NA 0.68, σ 0.85, ordinary illumination), the wafer was subjected to flood exposure in a dose of 30 mJ/cm$^2$. The wafer was baked at 100° C. for 60 seconds for deprotection reaction. The wafer (excluding Comparative Example 1-2) was further baked at the temperature shown in Table 3 for 60 seconds for insolubilizing the resist film in organic solvent. An organic solvent as shown in Table 3 was dispensed on the resist film and kept in contact for 30 seconds. The wafer was spin dried and baked at 100° C. for 60 seconds for evaporating off the organic solvent. A film thickness was measured by a film thickness gauge before and after the solvent contact, from which a loss in film thickness by the solvent contact was determined. The results are shown in Table 3.

ArF Lithography Patterning Test

A spin-on carbon film ODL-101 (Shin-Etsu Chemical Co., Ltd.) having a carbon content of 80 wt % was deposited on a silicon wafer to a thickness of 100 nm and an antireflective coating (ARC-29A, Nissan Chemical Industries, Ltd.) was deposited thereon to a thickness of 40 nm. On this substrate, the resist composition shown in Table 1 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole 35 deg., azimuthally polarized illumination), double exposures were performed at the overlapping position, using 6% half-tone phase shift masks bearing Y- and X-direction line-and-space patterns, respectively. The wafer was baked (PEB) at the temperature shown in Table 4 for 60 seconds, developed in the developer (organic solvent or alkaline solution) shown in Table 4 for 30 seconds, and rinsed with diisoamyl ether in the case of organic solvent development or with water in the case of alkaline development, forming a negative or hole pattern with a pitch of 90 nm in the case of organic solvent development or a positive or dot pattern with a pitch of 90 nm in the case of alkaline development. Table 4 reports the size of minimum holes which were kept open as the exposure dose was varied, for Examples 2-1 to 2-27 and Comparative Examples 2-2 and 2-3, and the size of minimum dots for Comparative Example 2-1.

Image Reversal by Dry Etching

In Examples 2-1 to 2-27 and Comparative Examples 2-2 and 2-3, once a hole pattern was formed by organic solvent development, it was baked at 185° C. for 60 seconds for insolubilizing in organic solvent. The reversal film-forming solution shown in Table 2 was coated thereon. In Example 2-27, the wafer was baked at 180° C. for 60 seconds for evaporating off the organic solvent and promoting crosslinking. In other Examples, the wafer was baked at 100° C. for 60 seconds for evaporating off the organic solvent. The coating weight of the reversal film was such that it might have a thickness on a flat substrate of 40 nm for flat films 1 to 7 and 17 and 60 nm for flat films 8 to 16 and 18. A cross section of the wafer was observed under SEM to find that the hole pattern left after organic solvent development had a film thickness of 70 nm and that the holes were almost fully filled with the reversal film after coating. The substrate having a flattening film buried therein was dry etched using an etching system Telius (Tokyo Electron Ltd.), that is, etching back of the reversal film and etching of the underlying carbon film with the reversal film serving as mask. The results are shown in Table 4.

The etching conditions are shown below.

Etching Back Conditions

| | |
|---|---|
| Chamber pressure | 10.0 Pa |
| RF power | 1,500 W |
| CF$_4$ gas flow rate | 15 ml/min |
| O$_2$ gas flow rate | 75 ml/min |
| Time | 5 sec |

Transfer from Reversal Film to Underlying Film

| | |
|---|---|
| Chamber pressure | 2.0 Pa |
| RF power | 500 W |
| Ar gas flow rate | 75 ml/min |
| O$_2$ gas flow rate | 45 ml/min |
| Time | 60 sec |

TABLE 3

| | | Resist | Bake temp. (° C.) | Solvent | Film thickness loss by solvent (nm) |
|---|---|---|---|---|---|
| Example | 1-1 | Resist 1 | 180 | PGMEA | 0.5 |
| | 1-2 | Resist 2 | 185 | PGMEA | 1.5 |
| | 1-3 | Resist 3 | 180 | PGMEA | 0.6 |
| | 1-4 | Resist 3 | 180 | PGEE | 1.0 |
| | 1-5 | Resist 3 | 180 | PGEE/water (90/10) | 0.7 |
| | 1-6 | Resist 3 | 180 | PGMEA/GBL (90/10) | 1.1 |
| | 1-7 | Resist 3 | 180 | PGMEA/CyH (85/15) | 0.4 |
| | 1-8 | Resist 3 | 180 | 2-heptanone | 0.8 |
| | 1-9 | Resist 4 | 180 | PGMEA | 1.1 |
| | 1-10 | Resist 5 | 185 | PGMEA | 0.3 |
| | 1-11 | Resist 6 | 190 | PGMEA | 0.3 |
| | 1-12 | Resist 7 | 180 | PGMEA | 0.6 |
| | 1-13 | Resist 8 | 180 | PGMEA | 0.3 |
| | 1-14 | Resist 9 | 180 | PGMEA | 0.8 |
| | 1-15 | Resist 1 | 170 | PGMEA | 0.9 |
| | 1-16 | Resist 1 | 190 | PGMEA | 0.3 |
| | 1-17 | Resist 1 | 200 | PGMEA | 0.1 |
| Comparative Example | 1-1 | Comparative Resist 1 | 180 | PGMEA | film dissolved away |
| | 1-2 | Resist 1 | none | PGMEA | film dissolved away |

TABLE 4

| | | Resist | PEB temp. (° C.) | Developer | Minimum hole size (nm) | Reversal film material | Minimum dot size (nm) |
|---|---|---|---|---|---|---|---|
| Example | 2-1 | Resist 1 | 90 | n-butyl acetate | 35 | Reversal film 1 | 32 |
| | 2-2 | Resist 2 | 90 | n-butyl acetate | 37 | Reversal film 1 | 35 |
| | 2-3 | Resist 3 | 90 | n-butyl acetate | 34 | Reversal film 1 | 33 |
| | 2-4 | Resist 4 | 90 | n-butyl acetate | 35 | Reversal film 1 | 35 |
| | 2-5 | Resist 5 | 90 | n-butyl acetate | 35 | Reversal film 1 | 33 |
| | 2-6 | Resist 6 | 90 | n-butyl acetate | 38 | Reversal film 1 | 35 |
| | 2-7 | Resist 7 | 90 | n-butyl acetate | 35 | Reversal film 1 | 34 |
| | 2-8 | Resist 8 | 95 | 2-heptanone | 33 | Reversal film 1 | 31 |
| | 2-9 | Resist 9 | 90 | n-butyl acetate | 35 | Reversal film 1 | 30 |
| | 2-10 | Resist 1 | 90 | methyl benzoate | 34 | Reversal film 1 | 31 |
| | 2-11 | Resist 1 | 90 | n-butyl acetate | 36 | Reversal film 2 | 33 |
| | 2-12 | Resist 1 | 90 | n-butyl acetate | 36 | Reversal film 3 | 34 |
| | 2-13 | Resist 1 | 90 | n-butyl acetate | 35 | Reversal film 4 | 32 |
| | 2-14 | Resist 1 | 90 | n-butyl acetate | 35 | Reversal film 5 | 31 |
| | 2-15 | Resist 1 | 90 | n-butyl acetate | 37 | Reversal film 6 | 34 |
| | 2-16 | Resist 1 | 90 | n-butyl acetate | 38 | Reversal film 7 | 33 |
| | 2-17 | Resist 1 | 90 | n-butyl acetate | 38 | Reversal film 8 | 39 |
| | 2-18 | Resist 1 | 90 | n-butyl acetate | 38 | Reversal film 9 | 37 |
| | 2-19 | Resist 1 | 90 | n-butyl acetate | 38 | Reversal film 10 | 38 |
| | 2-20 | Resist 1 | 90 | n-butyl acetate | 35 | Reversal film 11 | 36 |
| | 2-21 | Resist 1 | 90 | n-butyl acetate | 36 | Reversal film 12 | 39 |
| | 2-22 | Resist 1 | 90 | n-butyl acetate | 36 | Reversal film 13 | 39 |
| | 2-23 | Resist 1 | 90 | n-butyl acetate | 38 | Reversal film 14 | 32 |
| | 2-24 | Resist 1 | 90 | n-butyl acetate | 36 | Reversal film 15 | 34 |
| | 2-25 | Resist 1 | 90 | n-butyl acetate | 36 | Reversal film 16 | 35 |
| | 2-26 | Resist 1 | 90 | n-butyl acetate | 38 | Reversal film 17 | 39 |
| | 2-27 | Resist 1 | 90 | n-butyl acetate | 38 | Reversal film 18 | 31 |
| Comparative Example | 2-1 | Resist 1 | 90 | 2.38 wt % TMAH aqueous solution | — | — | 43 |
| | 2-2 | Comparative Resist 1 | 90 | n-butyl acetate | 38 | Reversal film 1 | no pattern |
| | 2-3 | Resist 1 | 90 | n-butyl acetate | 35 | Reversal film 1 | no pattern |

As seen from the results in Table 3, the resist composition comprising a polymer having recurring units (a) forms a resist film which turns insoluble in organic solvent by high-temperature bake following deprotection reaction. As seen from the results in Table 4, in Examples 2-1 to 2-27 and Comparative Examples 2-2 and 2-3 entailing double patterning of X- and Y-direction lines, a fine hole pattern with a size of less than 40 nm was formed. Comparative Example 2-1, which was intended to form a dot pattern via alkaline development, failed to form a dot pattern with a size of less than 40 nm due to pattern collapse. In Examples 2-1 to 2-27, upon image reversal by dry etching, the fine hole pattern with a size of less than 40 nm was reversed into a dot pattern. In Comparative Examples 2-2 and 2-3, since the patterns following organic solvent development were soluble in the organic solvent, the hole patterns were dissolved away when the reversal film-forming solution was coated thereon, indicating that no patterns were formed after dry etching.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2013-028627 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
coating a chemically amplified resist composition onto a processable substrate, said resist composition comprising a resin comprising recurring units having an acid labile group which is eliminatable with acid so that it may turn insoluble in organic solvent as a result of the acid labile group being eliminated, a photoacid generator capable of generating an acid upon exposure to high-energy radiation, and a first organic solvent, prebaking the coating to remove the unnecessary solvent and to form a resist film, exposing patternwise the resist film to high-energy radiation, post-exposure baking, and developing in an organic solvent developer to form a negative pattern,
heating the negative pattern to render it resistant to a second organic solvent,
coating a solution comprising at least one element selected from the group consisting of silicon, titanium, zirconium, hafnium, and aluminum and the second organic solvent onto the negative pattern-bearing substrate, prebaking, and dry etching to effect image reversal for converting the negative pattern into a positive pattern.

2. The process of claim 1 wherein the second organic solvent is selected from the group consisting of propylene glycol monomethyl ether acetate, cyclohexanone, cyclopentanone, ethyl lactate, propylene glycol monomethyl ether, propylene glycol monoethyl ether, propylene glycol monopropyl ether, heptanone, γ-butyrolactone and mixtures thereof, and the negative pattern after heating experiences a film thickness loss of up to 10 nm when it is kept in contact with the second organic solvent for 30 seconds.

3. The process of claim 1 wherein the resin in the resist composition comprises recurring units having 7-oxanorbornane ring and recurring units having an acid labile group which is eliminatable with acid, and
the heating step after development causes crosslinking of the resin in the negative pattern.

4. The process of claim 3 wherein the recurring units having 7-oxanorbornane ring are recurring units (a) having the general formula (1):

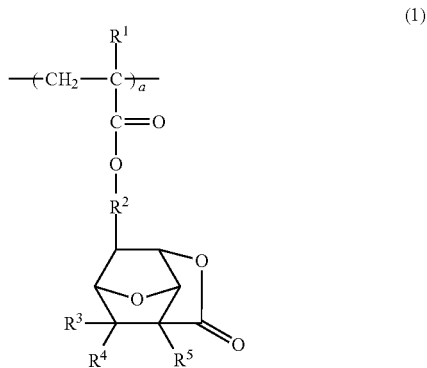

wherein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, $R^3$, $R^4$, and $R^5$ are each independently hydrogen, a straight, branched or cyclic $C_1$-$C_6$ alkyl group or cyano group, and a is a number in the range: 0<a<1.0.

5. The process of claim 3 wherein the recurring units having an acid labile group are recurring units (b) having a carboxyl group substituted with an acid labile group and/or recurring units (c) having a hydroxyl group substituted with an acid labile group, represented by the general formula (2):

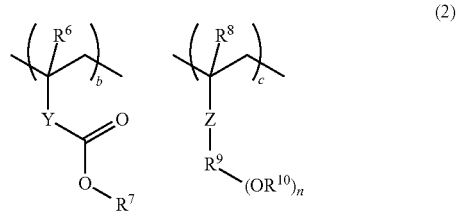

wherein $R^6$ and $R^8$ each are hydrogen or methyl, $R^7$ and $R^{10}$ each are an acid labile group, Y is a single bond or —C(=O)—O—$R^{11}$—, $R^{11}$ is a straight, branched or cyclic $C_1$-$C_{10}$ alkylene group Which may have an ether or ester moiety, or a naphthylene group, Z is a single bond or —C(=O)—O—, $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group, n is 1 or 2, b and c are numbers in the range: $0 \leq b < 1.0$, $0 \leq c < 1.0$, and $0 < b+c < 1.0$.

6. The process of claim 1 wherein the organic solvent developer used in the developing step to form the negative pattern is selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

7. The process of claim 1 wherein the negative pattern is a hole pattern, and a dot pattern is formed by reversal of the hole pattern.

8. The process of claim 1 wherein the negative pattern is a trench pattern, and a line pattern is formed by reversal of the trench pattern.

9. The process of claim 1 wherein the solution comprising at least one element selected from the group consisting of silicon, titanium, zirconium, hafnium, and aluminum is a solution comprising a polymer comprising recurring units selected from the group consisting of the following formulae:

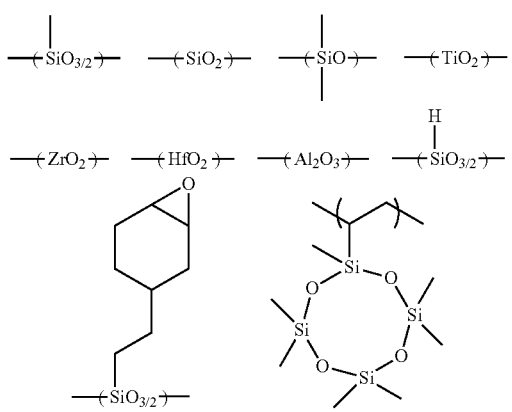

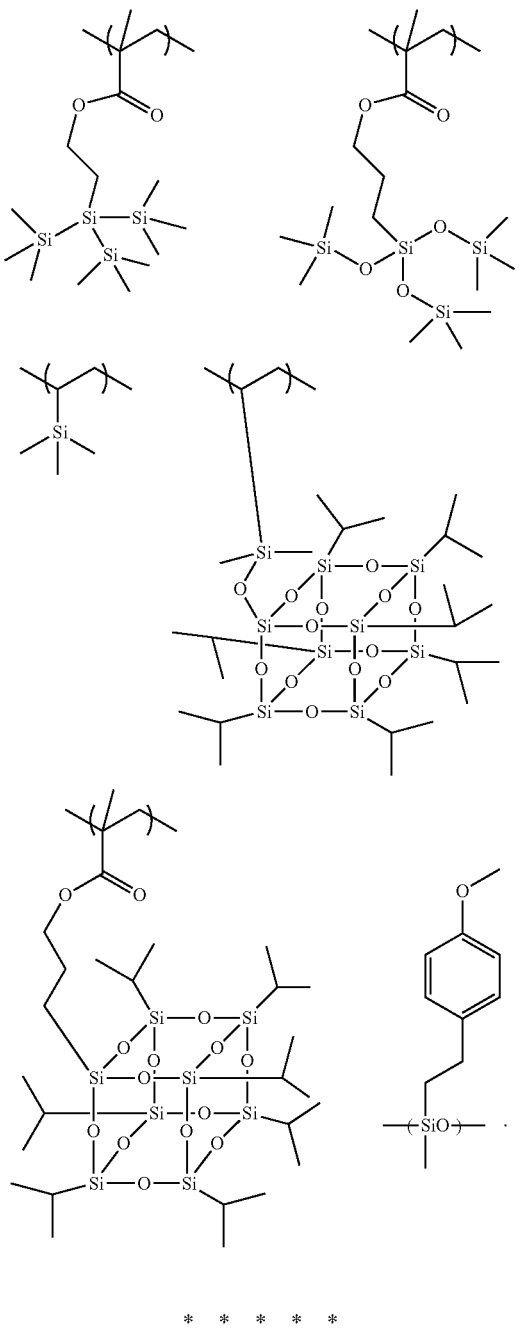

* * * * *